(12) United States Patent
Mikami et al.

(10) Patent No.: US 11,115,059 B2
(45) Date of Patent: Sep. 7, 2021

(54) ENCODING CIRCUIT, DECODING CIRCUIT, ENCODING METHOD, DECODING METHOD, AND TRANSMITTING DEVICE

(71) Applicant: FUJITSU LIMITED, Kawasaki (JP)

(72) Inventors: Kazumasa Mikami, Yokohama (JP); Junichi Sugiyama, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/996,967

(22) Filed: Aug. 19, 2020

(65) Prior Publication Data

US 2021/0075444 A1 Mar. 11, 2021

(30) Foreign Application Priority Data

Sep. 10, 2019 (JP) ............................. JP2019-164914

(51) Int. Cl.
| | | |
|---|---|---|
| *H03M 13/25* | (2006.01) | |
| *H03M 13/11* | (2006.01) | |
| *H03M 13/31* | (2006.01) | |
| *H03M 13/33* | (2006.01) | |

(52) U.S. Cl.
CPC ....... *H03M 13/253* (2013.01); *H03M 13/118* (2013.01); *H03M 13/1108* (2013.01);
(Continued)

(58) Field of Classification Search
CPC ............................ H03M 13/253; H03M 13/25
See application file for complete search history.

(56) References Cited

U.S. PATENT DOCUMENTS 5,095,497 A * 3/1992 Aman ............... H04L 25/03343
375/254
5,185,763 A * 2/1993 Krishnan .......... H04L 25/03343
375/262
(Continued)

FOREIGN PATENT DOCUMENTS

| JP | 2008-187706 A | 8/2008 |
|---|---|---|
| JP | 2010-258937 A | 11/2010 |

(Continued)

OTHER PUBLICATIONS

Udo Wachsmann et al., "Multilevel Codes: Theoretical Concepts and Practical Design Rules", IEEE Transactions on Information Theory, vol. 45, No. 5, pp. 1361-1391, Jul. 1999 (Total 31 pages).
(Continued)

*Primary Examiner* — Joseph D Torres
(74) *Attorney, Agent, or Firm* — Fujitsu Patent Center

(57) ABSTRACT

An encoding circuit includes an allocator configured to allocate symbols among a plurality of symbols within a constellation of multilevel modulation and correspond to values of a plurality of bit strings, a converter configured to convert values of each of bit strings excluding a first bit string so that, as a region within the constellation is closer to the center of the constellation, the number of symbols allocated in the region is larger, a switch configured to switch between a first time period in which a first error correction code is inserted and a second time period in which the first error correction code is not inserted, and an insertor configured to generate the first error correction code from a second bit string in the second time period and inserts the first error correction code in two or more bit strings in the first time period according to the switching.

8 Claims, 42 Drawing Sheets

(52) U.S. Cl.
CPC ........ *H03M 13/1111* (2013.01); *H03M 13/25* (2013.01); *H03M 13/31* (2013.01); *H03M 13/333* (2013.01)

(56) References Cited

U.S. PATENT DOCUMENTS

| | | |
|---|---|---|
| 2008/0163025 A1 | 7/2008 | Djordjevic et al. |
| 2010/0275104 A1 | 10/2010 | Kubo et al. |
| 2012/0307706 A1* | 12/2012 | Nakano ............. H04L 25/03343 370/312 |

FOREIGN PATENT DOCUMENTS

| | | |
|---|---|---|
| JP | 2016-519857 A | 7/2016 |
| WO | 2014/203947 A1 | 12/2014 |

OTHER PUBLICATIONS

Andreas Bisplinghoff et al., "Low-Power, Phase-Slip Tolerant, Multilevel Coding for M-QAM", Journal of Lightwave Technology, vol. 35, No. 4, pp. 1006-1014, Feb. 15, 2017 (Total 9 pages).

Yohei Koganei et al., "Multilevel Coding with Spatially-Coupled Codes for Beyond 400Gbps Optical Transmission", OFC 2018, Tu3C.2, Mar. 2018, Optical Society of America (Total 3 pages).

Fred Buchali et al., "Rate Adaptation and Reach Increase by Probabilistically Shaped 64-QAM: An Experimental Demonstration", Journal of Lightwave Technology, vol. 34, No. 7, pp. 1599-1609, Apr. 1, 2016 (Total 11 pages).

* cited by examiner

FIG. 6

| Q VALUE | | |
|---|---|---|
| LEVEL-2 | LEVEL-1 | LEVEL-0 |
| 0 | 0 | 0 |
| 0 | 0 | 1 |
| 0 | 1 | 1 |
| 0 | 1 | 0 |
| 1 | 1 | 0 |
| 1 | 1 | 1 |
| 1 | 0 | 1 |
| 1 | 0 | 0 |

SECOND QUADRANT | FIRST QUADRANT

THIRD QUADRANT | FOURTH QUADRANT

| I VALUE | | | | | | | | | |
|---|---|---|---|---|---|---|---|---|
| LEVEL-2 | 1 | 1 | 1 | 1 | 0 | 0 | 0 | 0 |
| LEVEL-1 | 0 | 0 | 1 | 1 | 1 | 1 | 0 | 0 |
| LEVEL-0 | 0 | 1 | 1 | 0 | 0 | 1 | 1 | 0 |

FIG. 10

| Q VALUE | | |
|---|---|---|
| LEVEL-2 | LEVEL-1 | LEVEL-0 |
| 0 | 0 | 0 |
| 0 | 0 | 1 |
| 0 | 1 | 0 |
| 0 | 1 | 1 |
| 1 | 1 | 0 |
| 1 | 1 | 1 |
| 1 | 0 | 0 |
| 1 | 0 | 1 |

SECOND QUADRANT | FIRST QUADRANT

THIRD QUADRANT | FOURTH QUADRANT

| I VALUE | | | | | | | | | |
|---|---|---|---|---|---|---|---|---|
| LEVEL-2 | 1 | 1 | 1 | 1 | 0 | 0 | 0 | 0 |
| LEVEL-1 | 0 | 0 | 1 | 1 | 1 | 1 | 0 | 0 |
| LEVEL-0 | 1 | 0 | 1 | 0 | 1 | 0 | 1 | 0 |

FIG. 42

|  | LEVEL-3 | LEVEL-2 | LEVEL-1 | LEVEL-0 |
|---|---|---|---|---|
| COMPARATIVE EXAMPLE | N | 0 | 0 | 0 |
| FOURTH EMBODIMENT | N/2 | N/2 | 0 | 0 |
| FIFTH EMBODIMENT | N/2 | 0 | N/2 | 0 |
| SIXTH EMBODIMENT | N/3 | N/3 | N/3 | 0 |
| SEVENTH EMBODIMENT | N/2 | 0 | 0 | N/2 |
| EIGHTH EMBODIMENT | N/3 | 0 | N/3 | N/3 |
| NINTH EMBODIMENT | N/4 | N/4 | N/4 | N/4 |
| TENTH EMBODIMENT | N/3 | N/3 | 0 | N/3 |

ENCODING CIRCUIT, DECODING CIRCUIT, ENCODING METHOD, DECODING METHOD, AND TRANSMITTING DEVICE

CROSS-REFERENCE TO RELATED APPLICATION

This application is based upon and claims the benefit of priority of the prior Japanese Patent Application No. 2019-164914, filed on Sep. 10, 2019, the entire contents of which are incorporated herein by reference.

FIELD

The embodiments discussed herein are related to an encoding circuit, a decoding circuit, an encoding method, a decoding method, and a transmitting device.

BACKGROUND

With Increases in transmission capacities of optical transmitting devices, multilevel modulation, such as quadrature phase-shift keying (QPSK), 16 quadrature amplitude modulation (QAM), and 64 QAM, is used, for example. In the multilevel modulation, a symbol that is among symbols arranged in a constellation and corresponds to values of each bit string within a frame signal to be modulated is allocated to the bit string, and thus an optical signal with a phase and an intensity that are based on the symbol is generated.

A probabilistic shaping technique (hereinafter referred to as "PS") generates a probability distribution for symbol allocation by converting values of bit strings so that, as a region within a constellation is closer to the center of the constellation, the number of symbols allocated in the region is larger. This improves noise tolerance of signal light generated from a frame.

In the PS, a distribution matching (DM) process of increasing a mark rate of a bit string to a rate (of, for example, 80%) of greater than 50% is used, for example. Therefore, the probability of allocating a symbol is higher toward the center of the constellation only in a specific quadrant among first to fourth quadrants of the constellation. After that, a quadrant in which a symbol to be allocated is located is determined from the first to fourth quadrants.

To determine the quadrant, a parity bit of an error correction code, such as forward error correction (FEC), may be used (refer to, for example, F. Buchali, et al., "Rate Adaptation and Reach Increase by Probabilistically Shaped 64-QAM: An Experimental Demonstration,", JOURNAL OF LIGHTWAVE TECHNOLOGY, VOL, 34, NO. 7, Apr. 1, 2016). Since a mark rate of the error correction code is maintained at approximately 50%, the first to fourth quadrants are selected with almost the same probability, and a probability distribution in which symbols are biased toward the center of a constellation in all quadrants is generated.

Examples of a method of encoding the error correction code are bit-interleaved coded modulation (BICM) and multilevel coding (MLC) (refer to, for example, Japanese Laid-open Patent Publication No. 2008-187706, U. Wachsmann, et al., "Multilevel Codes: Theoretical Concepts and Practical Design Rules", IEEE TRANSACTIONS ON INFORMATION THEORY, VOL. 45, NO. 5, July 1999, A. Bisplinghoff, et al., "Low-Power, Phase-Slip Tolerant, Multilevel Coding for M-QAM", JOURNAL OF LIGHTWAVE TECHNOLOGY, VOL., 35, NO. 4, Feb. 15, 2017, and Y. Koganei, et al., "Multilevel Coding with Spatially-Coupled Codes for beyond 400 Gbps Optical Transmission", OFC, 2018, Tu3C.2). BICM is a method of collectively encoding bit strings in a way in which the bit strings are not distinguished based on levels (the most significant bit (MSB) and the least significant bit (LSB)). MLC is an encoding method of individually generating error correction codes in a way in which bit strings are classified based on levels.

SUMMARY

According to an aspect of the embodiments, an encoding circuit includes: an allocator configured to allocate, to a plurality of bit strings, symbols that are among a plurality of symbols within a constellation of multilevel modulation and correspond to values of the plurality of bit strings within a frame; a converter configured to convert values of each of bit strings among the plurality of bit strings excluding a first bit string so that, as a region within the constellation is closer to the center of the constellation, the number of symbols allocated in the region among the plurality of symbols is larger; a switch configured to switch, in a cycle of the frame, between a first time period in which a first error correction code to correct an error of the plurality of bit strings is inserted in the plurality of bit strings and a second time period in which the first error correction code is not inserted in the plurality of bit strings; and a first insertor configured to generate the first error correction code from a second bit string among the plurality of bit strings in the second time period and inserts the first error correction code in two or more bit strings including the first bit string in the first time period in accordance with the switching by the switch. an apparatus includes The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a diagram illustrating an example of symbol mapping;

FIG. 10 is a diagram illustrating another example of the symbol mapping;

FIG. 42 is a diagram illustrating a data amount of an SD-FEC parity and an HD-FEC parity in each of bit strings according to a comparative example and the fourth to tenth embodiments.

DESCRIPTION OF EMBODIMENTS

In the related art, for example, when 64 QAM is used, a parity bit of an error correction code generated from three bit strings is inserted only in a bit string of the highest level in a frame for which BICM has been used. The other two bit strings are to be subjected to the DM process. Symbols that are among symbols included in a quadrant of a constellation that is determined based on values of the bit string of the highest level and correspond to values of the two bit strings subjected to the DM process are allocated.

In this case, all the bit strings are encoded using, as an error correction code, a soft decision code (soft decision (SD)-FEC), such as a turbo code or a low-density parity-check code (LDPC), for example. The soft decision code has a higher correction ability than that of a hard decision code (hard decision (HD)-FEC), such as a BCH code or a Reed-Solomon code, but power consumed for encoding and decoding using the soft decision code is larger than power consumed for encoding and decoding using the hard decision code.

On the other hand, when only a bit string of the lowest level is to be encoded using MLC based on the soft decision code, consumption power is reduced, compared to a frame for which BICM has been used.

However, in a normal MLC method, a parity bit of an error correction code that is not able to be subjected to the DM process is inserted in the bit string of the lowest level. Therefore, an effect of reducing noise tolerance by the PS may be reduced, compared to the frame for which BICM has been used.

The present disclosure aims to provide an encoding circuit, a decoding circuit, an encoding method, a decoding method, a transmitting device, and an optical transmission system that may reduce consumption power without a reduction in noise tolerance.

Figure 1:
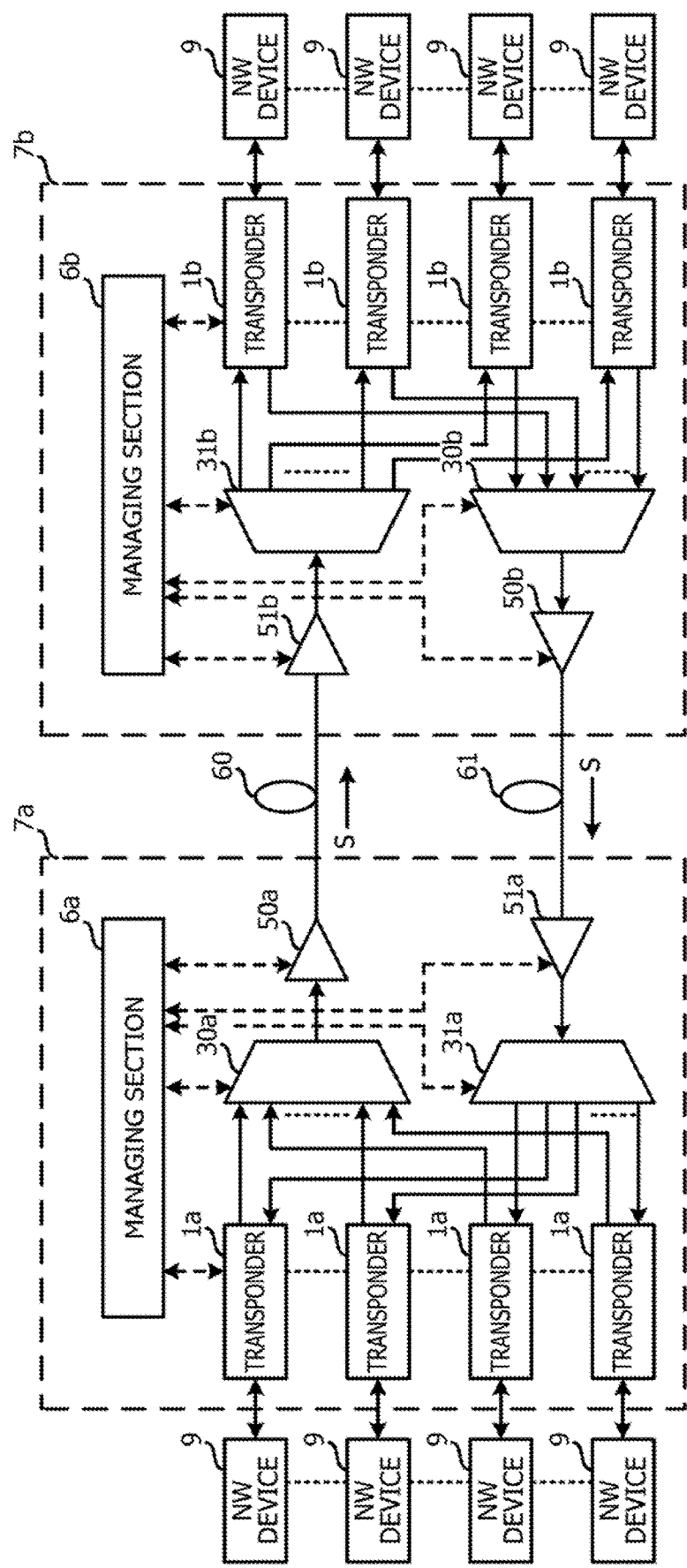
FIG. 1 is a configuration diagram illustrating an example of an optical transmission system.

FIG. 1 is a configuration diagram illustrating an example of an optical transmission system. The optical transmission system includes a pair of wavelength-multiplexed light transmitting devices 7a and 7b coupled to each other via transmission paths 60 and 61 that are optical fibers or the like. Each of the wavelength-multiplexed light transmitting devices 7a and 7b transmits and receives, to and from the other wavelength-multiplexed light transmitting device, a wavelength-multiplexed optical signal S obtained by wavelength-multiplexing a plurality of optical signals with different wavelengths.

The wavelength-multiplexed light transmitting device 7a includes a plurality of transponders 1a, an optical multiplexer 30a, an optical demultiplexer 31a, optical amplifiers 50a and 51a, and a managing section 6a. The wavelength-multiplexed light transmitting device 7b includes a plurality of transponders 1b, an optical multiplexer 30b, an optical demutiplexer 31b, optical amplifiers 50b and 51b, and a managing section 6b.

The transponders 1a and 1b are examples of first and second transmitting devices, respectively, and transmit and receive an optical signal. The optical signal is in the OTUCn frame format defined by ITU-T Recommendation G.709 as an example.

The transponders 1a and 1b are coupled to network (NW) devices 9 that are routers installed on a client network side or the like. The transponders 1a and 1b transmit and receive a plurality of client signals to and from the network devices 9. The transponders 1a and 1b cause a plurality of client signals from the network devices 9 to be stored in common frames. Then, the transponders 1a and 1b output the frames to the optical multiplexers 30a and 30b. The transponders 1a and 1b extract a plurality of client signals from frames received from the optical demultiplexers 31a and 31b and transmit the client signals to the network devices 9.

The optical multiplexers 30a and 30b are, for example, optical selection switches or optical filters. The optical multiplexers 30a and 30b wavelength-multiplex optical signals input from the transponders 1a and 1b to generate wavelength-multiplexed signals and output the wavelength-multiplexed signals to the optical amplifiers 50a and 50b. The optical amplifiers 50a and 50b amplify the wavelength-multiplexed signals and output the wavelength-multiplexed signals to the transmission paths 60 and 61.

The wavelength-multiplexed signals are input from the transmission paths 61 and 60 to the optical amplifiers 51a and 51b. The optical amplifiers 51a and 51b amplify the wavelength-multiplexed signals and output the wavelength-multiplexed signals to the optical demultiplexers 31a and 31b.

The optical demultiplexers 31a and 31b are, for example, optical selection switches or optical filters and demultiplex the wavelength-multiplexed signals into optical signals with different wavelengths. The optical signals are input from the optical demultiplexers 31a and 31b to the transponders 1a and 1b.

The managing sections 6a and 6b are, for example, circuits with processors, such as central processing units (CPUs), and control the wavelength-multiplexed light transmitting devices 7a and 7b. The managing sections 6a and 6b set gains in the optical amplifiers 50a and 50b and set frames to be wavelength-multiplexed in the optical multiplexers 30a and 30b, for example. The managing sections 6a and 6b set the optical signals to be demultiplexed in the optical demultiplexers 31a and 31b and configure, in the transponders 1a and 1b, settings related to the storage of the client signals within the frames, for example.

Figure 2:
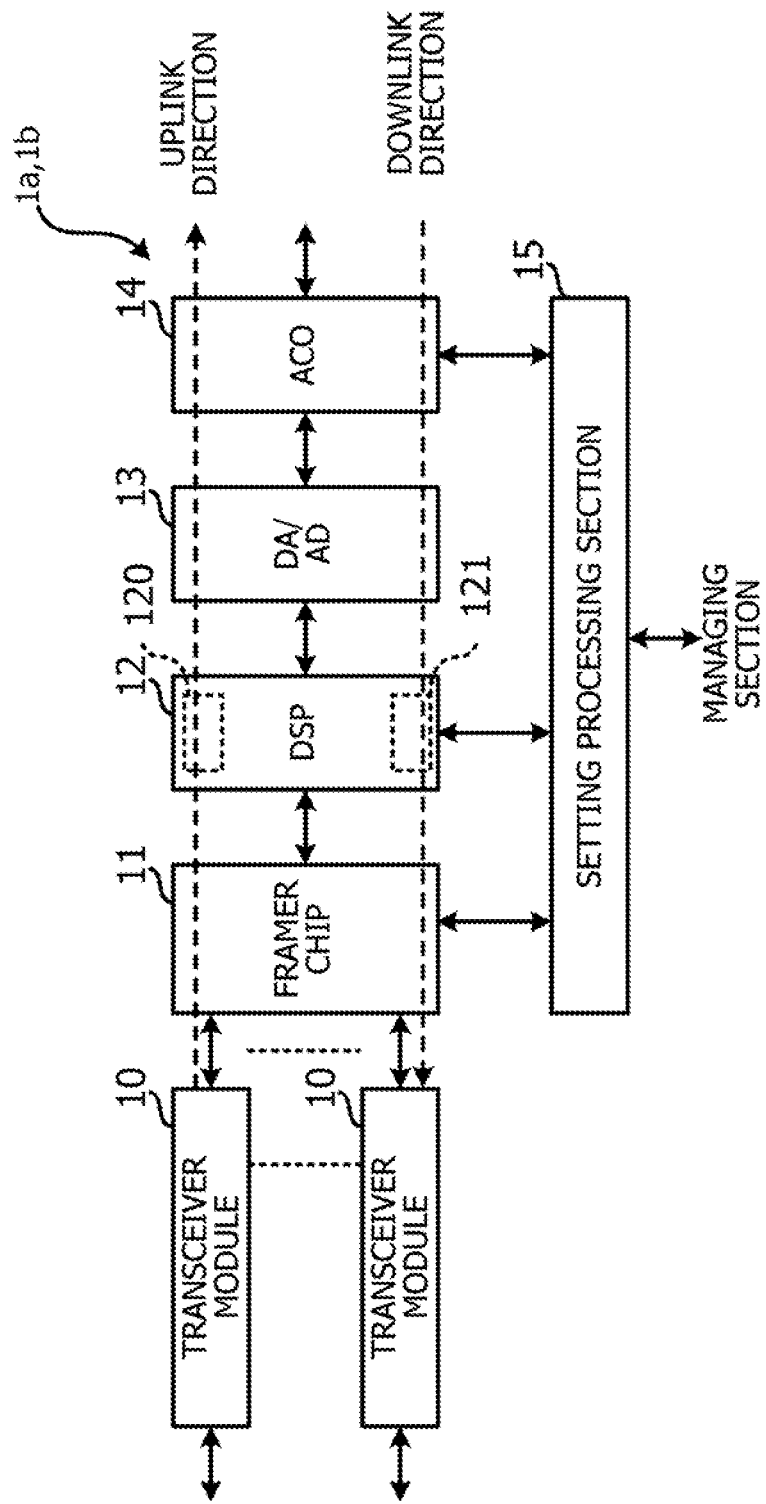
FIG. 2 is a configuration diagram illustrating an example of transponders.

FIG. 2 is a configuration diagram illustrating an example of the transponders 1a and 1b. Each of the transponders 1a and 1b includes a plurality of transceiver modules 10, a framer chip 11, a digital signal processor (DSP) 12, an analog-digital converter (DA/AD) 13, analog coherent optics (ACO) 14, and a setting processing section 15.

The transceiver modules 10 are optical modules attachable and detachable via, for example, electric couplers to and from a circuit board having the framer chip 11 mounted thereon. The transceiver modules 10 transmit and receive client signals to and from a network device 9. Examples of a frame format of each of the client signals are a Synchronous Optical Network (SONET) frame and a GigabitEthernet ((registered trademark) (GbE)) frame. The frame format, however, is not limited to this.

First, a process to be executed in an uplink direction from the transceiver modules 10 to the ACO 14 is described.

The transceiver modules 10 convert client signals received from the network device 9 from optical signals to electric signals and output the converted client signals to the framer chip 11. The framer chip 11 causes the client signals input from the transceiver modules 10 to be stored in a frame. In this example, an example of the frame is an OTUCn frame. The frame, however, is not limited to this. Another frame may be used.

The framer chip 11 outputs the frame to the DSP 12. The DSP 12 generates an error correction code for the frame, modulates the frame via multilevel modulation, and outputs the modulated frame to the analog-digital converter 13. The analog-digital converter 13 converts the frame from a digital signal to an analog signal and outputs the frame to the ACO 14. The ACO 14 converts the frame from the electric signal to an optical signal and outputs the frame to the optical multiplexers 30a and 30b.

Next, a process to be executed in a downlink direction from the ACO 14 to the transceiver modules 10 is described.

The ACO 14 receives an optical signal, converts the optical signal into an electric signal, and outputs the electric signal to the analog-digital converter 13. The electric signal has the foregoing frame structure. The analog-digital converter 13 converts the electric signal from an analog signal to a digital signal and outputs the electric signal to the DSP 12. The DSP 12 demodulates the electric signal to reproduce a frame, corrects an error, and outputs the frame to the framer chip 11. The ACO 14 is an example of first and second converting circuits.

The framer chip 11 extracts client signals from the frame and outputs the client signals to the transceiver modules 10. The transceiver modules 10 convert the client signals from electric signals to optical signals and output the client signals to the network device 9.

The setting processing section 15 configures various settings in the framer chip 11, the DSP 12, and the ACO 14 in accordance with instructions of the managing sections 6a and 6b.

The DSP 12 includes an encoding circuit 120 and a decoding circuit 121. The encoding circuit 120 encodes a plurality of bit strings within an upstream frame. The decoding circuit 121 decodes a plurality of bit strings within a downstream frame. Each of the bit strings is an example of bit values obtained by executing parallel conversion on serial data of a frame.

(Encoding and Decoding by BICM)

Figure 3:
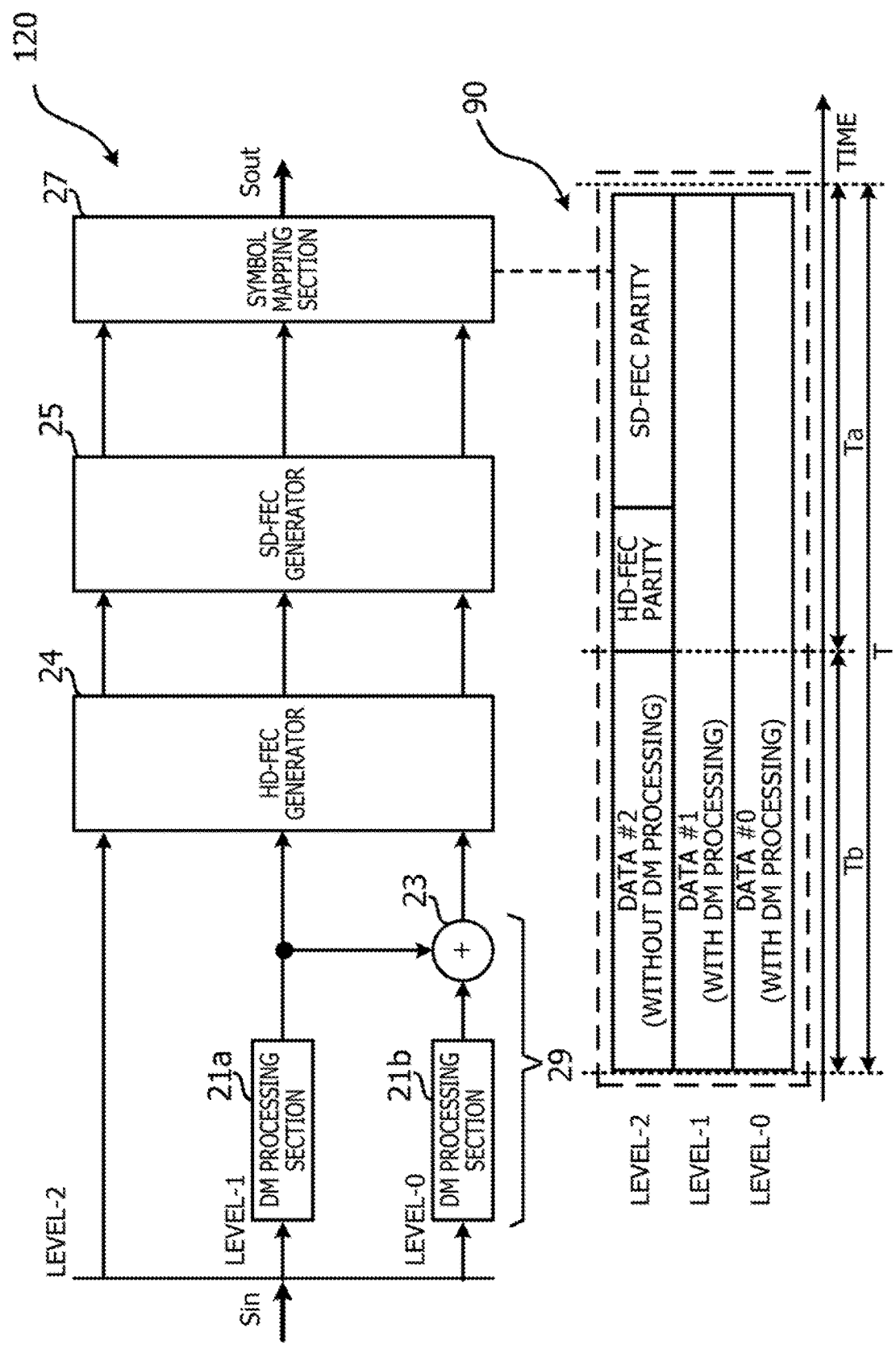
FIG. 3 is a configuration diagram illustrating an example of an encoding circuit that uses BICM.

FIG. 3 is a configuration diagram illustrating an example of the encoding circuit 120 that uses BICM. The encoding circuit 120 includes a PS converter 29, an HD-FEC generator 24, an SD-FEC generator 25, and a symbol mapping section 27. The PS converter 29 includes DM processing sections 21a and 21b and an exclusive OR (XOR) operator 23. In this example, 64 QAM is used as the multilevel modulation, but the multilevel modulation is not limited to this.

A frame signal Sin inputted from the framer chip 11 is divided into three bit strings of levels 0 to 2 by serial-parallel conversion. The bit string of the level 2 includes the MSB, while the bit string of the level 0 includes the LSB. The bit strings of the levels 0 to 2 are transmitted via individual lanes.

The PS converter 29 executes PS to generate a probability distribution for symbol allocation to each of the bit strings of the levels 0 to 2. The DM processing section 21a executes a DM process on the bit string of the level 1, while the DM processing section 21b executes the DM process on the bit string of the level 0. Therefore, mark rates of the bit strings of the levels 0 and 1 increase to rates (of, for example, 80%) of greater than 50%, and the number of values "1" of each of the bit strings of the levels 0 and 1 is larger than the number of values "0" of each of the bit strings of the levels 0 and 1.

The XOR operator 23 executes an XOR operation on values of the bit string of the level 0 and values of the bit string of the level 1. Thus, the values of the bit string of the level 0 are values obtained by executing the XOR operation on the original values of the bit string of the level 0 and the values of the bit string of the level 1. Each of the bit strings is output from the PS converter 29 to the HD-FEC generator 24.

The HD-FEC generator 24 generates an HD-FEC parity from each of the bit strings of the levels 0 to 2. The HD-FEC parity is a hard decision code. The HD-FEC generator 24 inserts the HD-FEC parity in the bit string of the level 2. Each of the bit strings is output from the HD-FEC generator 24 to the SD-FEC generator 25. The HD-FEC parity is an example of a second error correction code.

The SD-FEC generator 25 generates an SD-FEC parity from each of the bit strings of the levels 0 to 2. The SD-FEC parity is a soft decision code. The SD-FEC generator 25 inserts the SD-FEC parity in the bit string of the level 2. Each of the bit strings is output from the SD-FEC generator 25 to the symbol mapping section 27.

The symbol mapping section 27 allocates, to the bit strings, symbols that are among a plurality of symbols within a 64-QAM constellation and correspond to values of the bit strings of the levels 0 to 2. The symbol mapping section 27 outputs an output signal Sout corresponding to the allocated symbols to the analog-digital converter 13.

A reference symbol 90 indicates details of the bit strings within the frame to be input to the symbol mapping section 27. Data #0 with DM processing is included in the bit string of the level 0, and data #1 with DM processing is included in the bit string of the level 1.

Data #2 without DM processing, the HD-FEC parity, and the SD-FEC parity are included in the bit string of the level 2. The HD-FEC parity and the SD-FEC parity are inserted in a time period Ta within a cycle T of the frame. The data #2 is inserted in a time period Tb within the cycle T of the frame. For example, the time periods Ta and Tb are set so that the HD-FEC parity and the SD-FEC parity are approximately 20% of the data amount of the entire frame.

Figure 4:
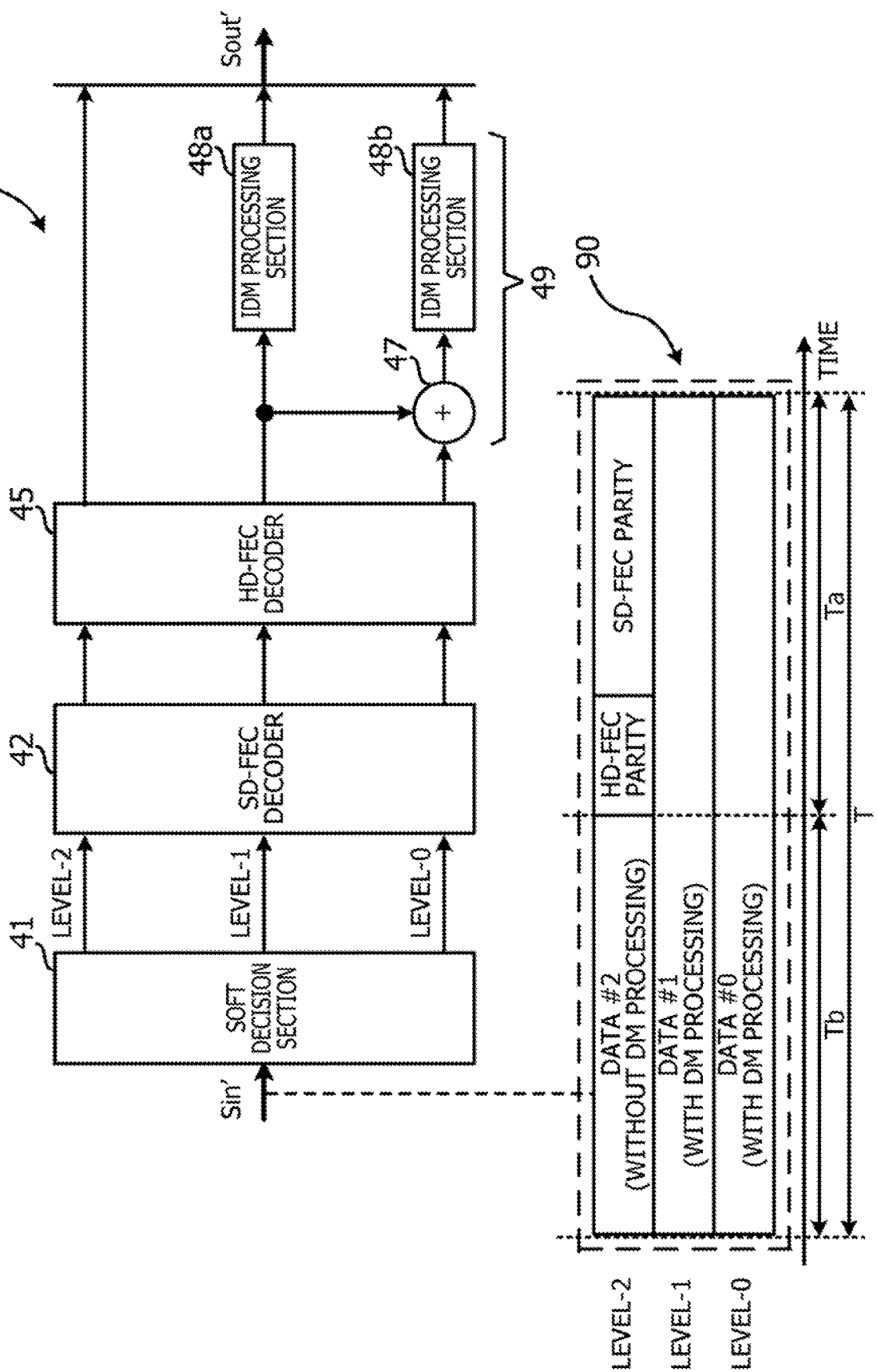
FIG. 4 is a configuration diagram illustrating an example of a decoding circuit that uses BICM.

FIG. 4 is a configuration diagram illustrating an example of the decoding circuit 121 that uses BICM. The decoding circuit 121 includes a soft decision section 41, an SD-FEC decoder 42, an HD-FEC decoder 45, and a PS inverse converter 49. The PS inverse converter 49 includes an XOR operator 47 and inverse-DM (IDM) processors 48*a* and 48*b*.

The soft decision section 41 restores the values of the bit strings of the levels 0 to 2 from an input signal Sin' inputted from the analog-digital converter 13 by executing soft decision on the values of the bit strings of the levels 0 to 2. The soft decision section 41 determines the certainty of values "0" and "1" of the bit strings based on symbols indicated in the input signal Sin'. The bit strings of the levels 0 to 2 are transmitted via individual lanes. The soft decision section 41 outputs the values of each of the bit strings of the levels 0 to 2 to the SD-FEC decoder 42.

The SD-FEC decoder 42 corrects the values of the bit strings of the levels 0 to 2 based on the SD-FEC parity. For example, the SD-FEC decoder 42 uses the SD-FEC parity to execute decoding. The SD-FEC decoder 42 outputs each of the bit strings of the levels 0 to 2 to the HD-FEC decoder 45.

The HD-FEC decoder 45 corrects the values of each of the bit strings of the levels 0 to 2 based on the HD-FEC parity. For example, the HD-FEC decoder 45 uses the HD-FEC parity to execute decoding. The HD-FEC decoder 45 outputs each of the bit strings of the levels 0 to 2 to the PS inverse converter 49.

The PS inverse converter 49 executes conversion opposite to that of the PS converter 29 on each of the bit strings of the levels 0 to 2. The XOR operator 47 executes an XOR operation on the values of the bit string of the level 0 and the values of the bit string of the level 1. Thus, the values of the bit string of the level 0 are the original values of the bit string of the level 0 before the XOR operation by the XOR operator 23 of the decoding circuit 121.

The bit string of the level 1 is inputted to the IDM processing section 48*a*. The bit string of the level 0 is input to the IDM processing section 48*b* from the XOR operator 47.

The IDM processing sections 48*a* and 48*b* execute an inverse-DM process opposite to the DM process of the DM processing sections 21*a* and 21*b* on the bit strings of the levels 0 and 1, respectively. Due to the inverse-DM process, the values of the bit strings of the levels 0 and 1 are the values before the conversion by the DM processing sections 21*a* and 21*b* of the PS converter 29 included in the encoding circuit 120. The bit strings of the levels 0 to 2 are output as an output signal Sout' to the framer chip 11.

The PS converter 29 of the encoding circuit 120 converts the values of each of the bit strings of the levels 0 and 1 so that, as a region within the 64-QAM constellation is closer to the center of the constellation, the number of symbols allocated in the region is larger. Therefore, a probability distribution in which, as a symbol is closer to the center of the constellation, the probability of allocating the symbol is higher is generated.

Figure 5:
FIG. 5 is a diagram illustrating an example of a PS process.

FIG. 5 is a diagram illustrating an example of a PS process. In this example, a 16-QAM constellation is exemplified for convenience of explanation. In the constellation, symbols P11 to P14, P21 to P24, P31 to P34, and P41 to P44 that are signal points are evenly arranged in first to fourth quadrants.

The sizes of circles indicating the symbols P11 to P14, P21 to P24, P31 to P34, and P41 to P44 indicate values of probabilities of allocating the symbols. Probabilities of allocating the symbols P11 to P14, P21 to P24, P31 to P34, and P41 to P44 before the PS are equal to each other.

As the symbols P11 to P14, P21 to P24, P31 to P34, and P41 to P44 are closer to a central point O of the constellation, the probabilities of allocating the symbols after the PS are higher. For example, the probabilities of allocating the symbols P22, P23, P32, and P33 of which distances from the central point O are the shortest are the highest, while the probabilities of allocating the symbols P11, P14, P41, and P44 of which distances from the central point O are the longest are the lowest.

In the generation of the probability distribution for the symbol allocation, the values of each of the bit strings of the levels 0 and 1 are converted so that the probabilities of allocating the symbols P22, P23, P32, and P33 arranged close to the central point O are high, and the quadrants of the symbols P11 to P14, P21 to P24, P31 to P34, and P41 to P44 are determined based on the values of the bit string of the level 2.

FIG. 6 is a diagram illustrating an example of symbol mapping. The symbol mapping section 27 maps the bit strings of the levels 0 to 2 to symbols by executing gray code mapping.

The symbol mapping section 27 allocates the values of each of the bit strings of the levels 0 to 2 to an I value and a Q value. For example, the symbol mapping section 27 may allocate the same value of each of the bit strings of the levels 0 to 2 to both the I value and the Q value. For example, when the values of the bit string of the level 0 are "1", the I value and the Q value are "1".

The symbol mapping section 27 may alternately allocate the values of each of the bit strings of the levels 0 to 2 to the I value and the Q value. For example, when values of consecutive two bits of the bit string of the level 0 are "1" and "0", the I value is "1" and the Q value is "1".

The I and Q values of the bit string of the level 2 are used to determine a quadrant of symbols to be allocated. When the I value is "0" and the Q value is "0", the symbols within the first quadrant are allocated. When the I value is "1" and the Q value is "0", the symbols within the second quadrant are allocated. When the I value is "1" and the Q value is "1", the symbols within the third quadrant are allocated. When the I value is "0" and the Q value is "1", the symbols within the fourth quadrant are allocated.

The XOR operator 23 of the PS converter 29 executes an XOR operation on the values of the bit string of the level 0 and the values of the bit string of the level 1 so that, as a symbol is closer to the central point O, the probability of allocating the symbol is higher.

Figure 7:
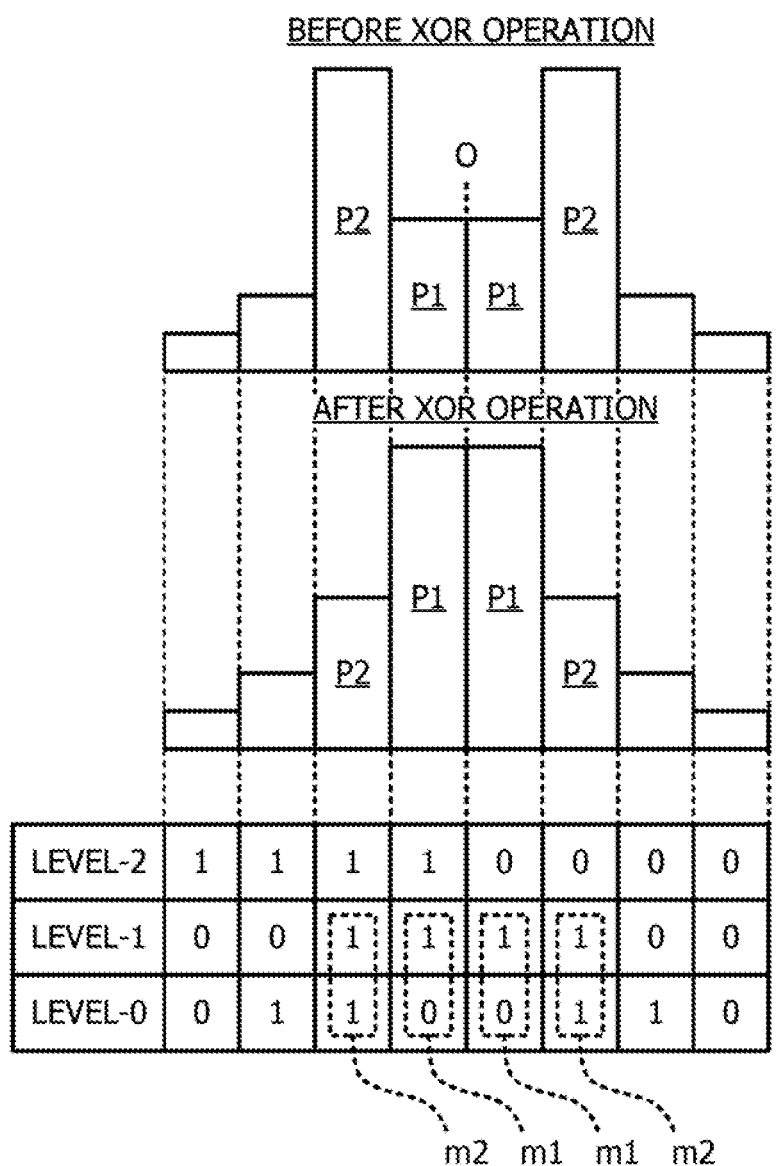
FIG. 7 is a diagram illustrating an example of probability distributions for symbol allocation before and after an XOR operation.

FIG. 7 is a diagram illustrating an example of probability distributions for symbol allocation before and after an XOR operation. In FIG. 7, each of the values of the bit strings of the levels 0 to 2 may be any of the I value and the Q value.

The DM processing sections 21a and 21b convert the values of the bit strings of the levels 0 and 1 so that the number of "s" of each of the bit strings of the levels 0 and 1 is larger than the number of "s" of each of the bit strings of the levels 0 and 1. This increases the probability that both values of each of the bit strings of the levels 0 and 1 are "1" (refer to a reference symbol m2). In a probability distribution for symbol allocation before the XOR operation, the probability of allocating symbols P1 closest to the central point O is lower than the probability of allocating symbols P2 arranged on the outer side of the symbols P1.

However, by executing an XOR operation on the values of the bit string of the level 0 and the values of the bit string of the level 1 in a gray code array, the probability that the values of the bit string of the level 0 may be "0" is increased. This increases the probability that the values of each of the bit strings of the levels 0 and 1 are "o" and "1" (refer to a reference symbol m1). In a probability distribution for symbol allocation after the XOR operation, the probability of allocating the symbols P1 arranged closest to the central point O is higher than the probability of allocating the symbols P2 arranged on the outer side of the symbols P1.

The values of the bit string of the level 2 are the HD-FEC parity generated by the HD-FEC generator 24 and the SD-FEC parity generated by the SD-FEC generator 25. Since mark rates of the HD-FEC parity and the SD-FEC parity are maintained at approximately 50%, the first to fourth quadrants are selected with almost the same probability, and a probability distribution in which symbols are biased toward the central point O of the constellation in all the quadrants is generated. This improves noise tolerance of the output signal.

However, as illustrated in FIG. 3, the SD-FEC generator 25 treats the entire bit strings of the levels 0 to 2 (refer to a dotted frame) as regions (arithmetic regions for the SD-FEC parity) to be encoded. For example, the SD-FEC generator 25 generates the SD-FEC parity from each of the bit strings of the levels 0 to 2. The soft decision code has a higher correction ability than that of the hard decision code, but power consumed for encoding and decoding using the soft decision code is larger than power consumed for encoding and decoding using the hard decision code.

(Encoding and Decoding by MLC)

Figure 8:
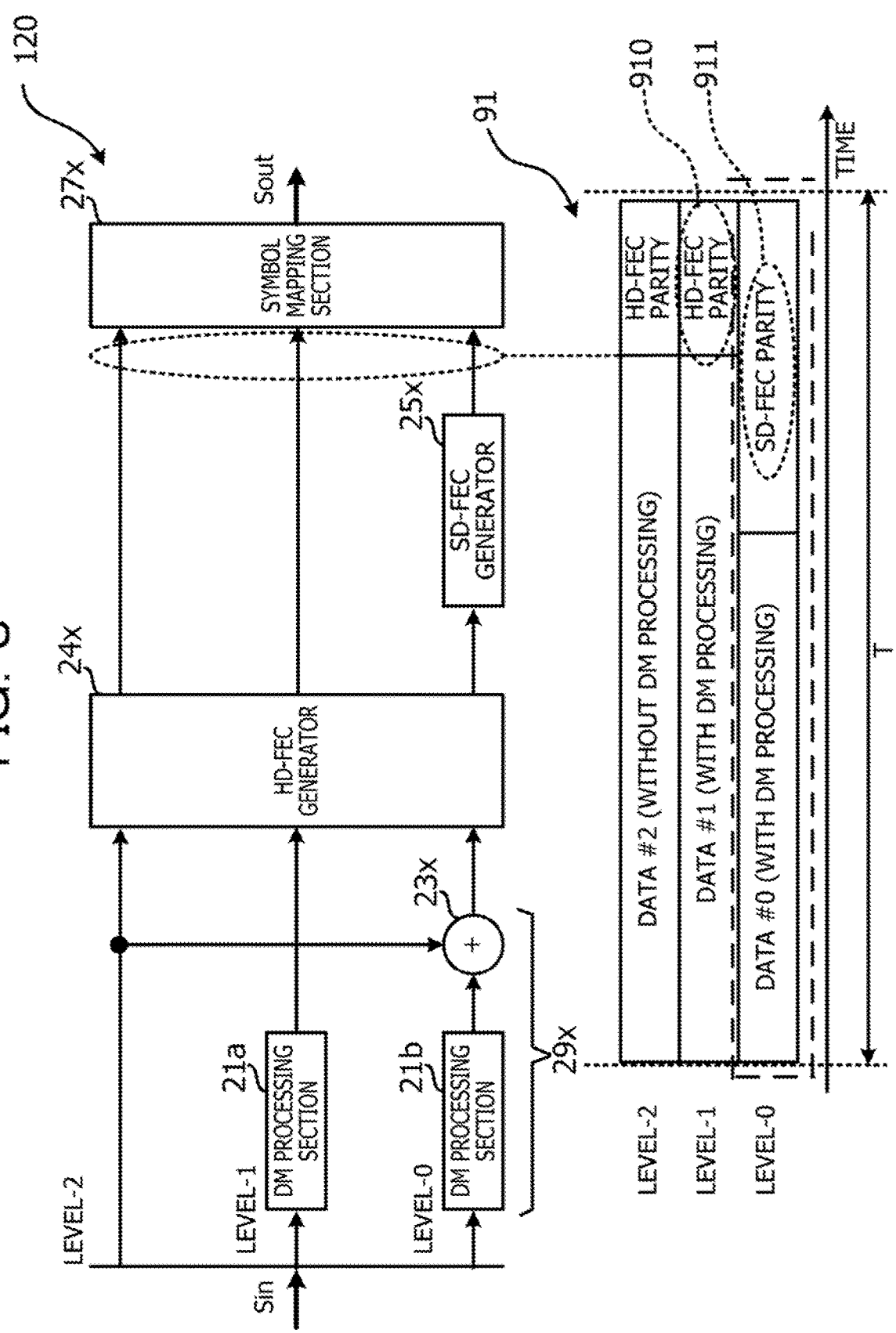
FIG. 8 is a configuration diagram illustrating an example of an encoding circuit that uses MLC.

FIG. 8 is a configuration diagram illustrating an example of an encoding circuit 120 that uses MIC. Configurations illustrated in FIG. 8 and common to those illustrated in FIG. 3 are indicated by the same reference symbols as those illustrated in FIG. 3 and will not be described.

The encoding circuit 120 includes a PS converter 29x, an HD-FEC generator 24x, an SD-FEC generator 25x, and a symbol mapping section 27x. The PS converter 29x includes DM processing sections 21a and 21b and an XOR operator 23x. In this example, 64 QAM is used as multilevel modulation, but the multilevel modulation is not limited to this.

The PS converter 29x converts the values of each of the bit strings of the levels 0 and 1 so that, as a region within the 64-QAM constellation is closer to the center of the 64-QAM constellation, the number of symbols allocated in the region is larger. The XOR operator 23x executes an XOR operation on the values of the bit string of the level 0 and the values of the bit string of the level 2. Thus, the values of the bit string of the level 0 are values obtained by executing the XOR operation on the original values of the bit string of the level 0 and the values of the bit string of the level 2. Each of the bit strings is output from the PS converter 29x to the HD-FEC generator 24x.

The HD-FEC generator 24x generates HD-FEC parities individually from the bit strings of the levels 0 to 2. The HD-FEC parities are hard decision codes. The HD-FEC generator 24x inserts the HD-FEC parity of the bit string of the level 1 in the bit string of the level 1 and inserts the HD-FEC parity of the bit string of the level 2 in the bit string of the level 2. Each of the bit strings of the levels 1 and 2 is output from the HD-FEC generator 24x to the symbol mapping section 27x.

The HD-FEC generator 24x inserts the HD-FEC parity of the bit string of the level 0 in the bit string of the level 0. The bit string of the level 0 is output from the HD-FEC generator 24x to the SD-FEC generator 25x.

The SD-FEC generator 25x generates an SD-FEC parity from the bit string of the level 0. The SD-FEC parity is a soft decision code. The SD-FEC generator 25x deletes the HD-FEC parity from the bit string of the level 0 and inserts the SD-FEC parity in the bit string of the level 0. The bit string of the level 0 is output from the SD-FEC generator 25x to the symbol mapping section 27x.

The symbol mapping section 27x allocates, to the bit strings, symbols that are among a plurality of symbols within the 64-QAM constellation and correspond to the values of the bit strings of the levels 0 to 2. The symbol mapping section 27x outputs an output signal Sout corresponding to the allocated symbols to the analog-digital converter 13.

A reference symbol 91 indicates details of the bit strings within a frame to be input to the symbol mapping section 27x. Data #0 with DM processing and the SD-FEC parity are included in the bit string of the level 0. Data #1 with DM processing and the HD-FEC parity are included in the bit string of the level 1. Data #2 without DM processing and the HD-FEC parity are included in the bit string of the level 2.

Figure 9:
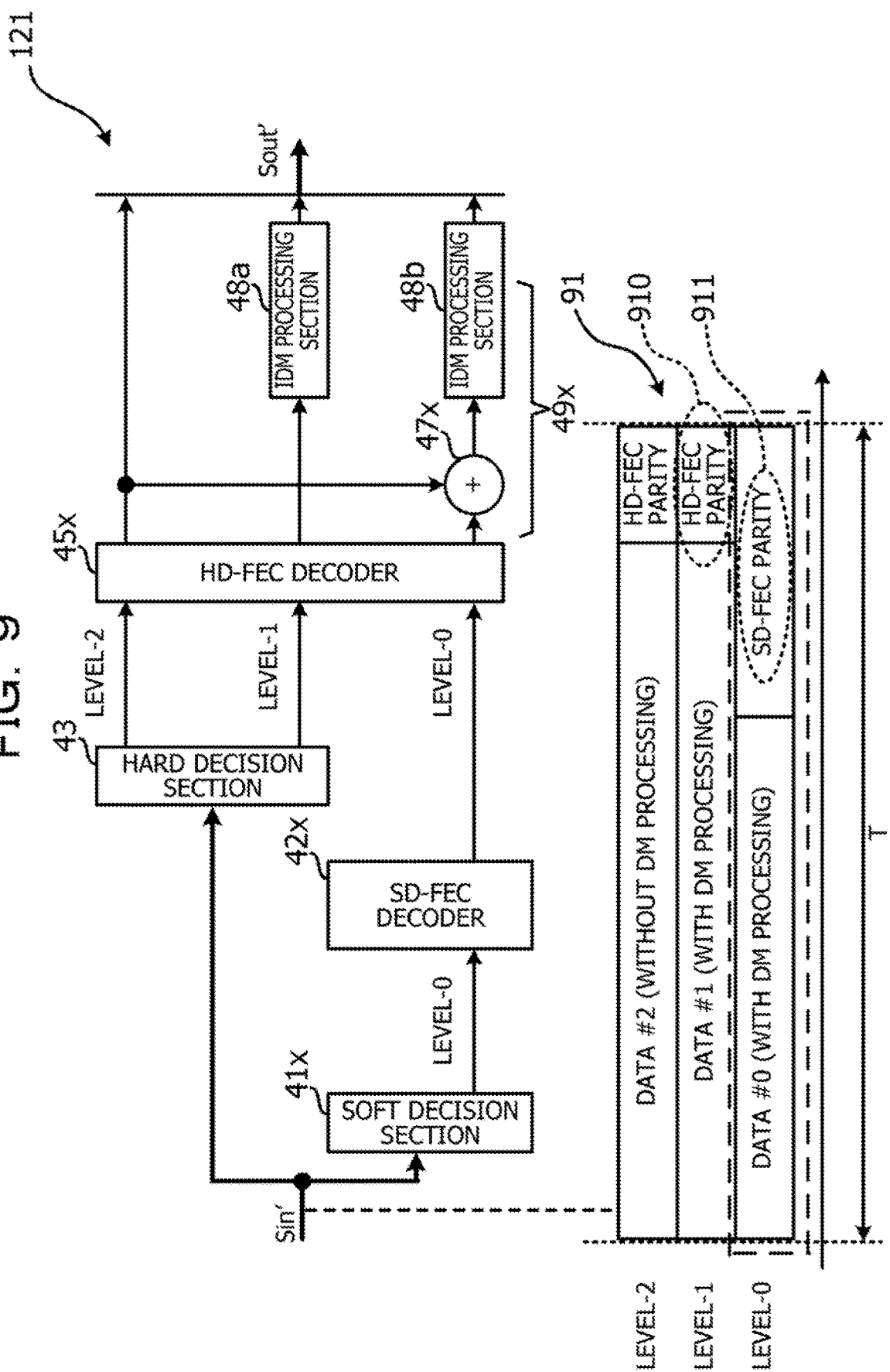
FIG. 9 is a configuration diagram illustrating an example of a decoding circuit that uses MLC.

FIG. 9 is a configuration diagram illustrating an example of a decoding circuit 121 that uses MLC. Configurations illustrated in FIG. 9 and common to those illustrated in FIG. 4 are indicated by the same reference symbols as those illustrated in FIG. 4 and will not be described.

The decoding circuit 121 includes a soft decision section 41x, an SD-FEC decoder 42x, a hard decision section 43, an HD-FEC decoder 45x, and a PS inverse converter 49x. The PS inverse converter 49x includes an XOR operator 47x and IDM processing section 48a and 48b. An input signal Sin' is input to the soft decision section 41x and the hard decision section 43.

The soft decision section 41x restores the values of the bit string of the level 0 from the input signal Sin' by executing soft decision on the values of the bit string of the level 0. The soft decision section 41x determines the certainty of the values "0" and "1" of the bit strings based on symbols indicated in the input signal Sin'. The soft decision section 41x outputs the values of the bit string of the level 0 to the SD-FEC decoder 42x.

The SD-FEC decoder 42x corrects the values of the bit string of the level 0 based on the SD-FEC parity. For example, the SD-FEC decoder 42x uses the SD-FEC parity to execute decoding. The SD-FEC decoder 42x outputs the bit string of the level 0 to the HD-FEC decoder 45x.

The hard decision section 43 restores the values of each of the bit strings of the levels 1 and 2 from the input signal Sin' by executing hard decision on the values of each of the bit strings of the levels 1 and 2. The hard decision section 43 determines the values "0" and "1" of the bit strings based on the symbols indicated in the input signal Sin'. The hard decision section 43 outputs the values of each of the bit strings of the levels 1 and 2 to the HD-FEC decoder 45x.

The HD-FEC decoder 45x corrects the values of each of the bit strings of the levels 0 to 2 based on the HD-FEC parities. For example, the HD-FEC decoder 45x uses the HD-FEC parities to execute decoding. The HD-FEC decoder 45x outputs each of the bit strings of the levels 0 to 2 to the PS inverse converter 49x.

The PS inverse converter 49x executes conversion opposite to that of the PS converter 29x on each of the bit strings of the levels 0 to 2. The XOR operator 47x executes an XOR operation on the values of the bit string of the level 0 and the values of the bit string of the level 2. Thus, the values of the bit string of the level 0 are the original values of the bit string of the level 0 before the XOR operation by the XOR operator 23x of the decoding circuit 121.

The bit string of the level 1 is input to the IDM processing section 48a. The bit string of the level 0 is input from the XOR operator 47x to the IDM processing section 48b. The bit strings of the levels 0 to 2 are output as an output signal Sout' to the framer chip 11.

The PS converter 29x of the encoding circuit 120 converts the values of each of the bit strings of the levels 0 and 1 so that, as a region within the 64-QAM constellation is closer to the center of the 64-QAM constellation, the number of symbols allocated in the region is larger. Therefore, a probability distribution in which, as a symbol is closer to the center of the constellation, the probability of allocating the symbol is higher is generated.

The symbol mapping section 27x executes symbol mapping different from that of the symbol mapping section 27 that uses BICM.

FIG. 10 is a diagram illustrating another example of the symbol mapping. Details illustrated in FIG. 10 and common to those illustrated in FIG. 6 will not be described.

The symbol mapping section 27x maps the bit strings of the levels 0 to 2 to the symbols by executing set partitioning. An array of the values of each of the bit strings of the levels 0 and 1 in the set partitioning is different from a gray code.

According to this array, the HD-FEC decoder 45x of the decoding circuit 121 may execute multi-stage decoding (MSD) so that Euclidean distances between the symbols within the constellation are longer than those obtained when the gray code is used. For example, when the bit string of the level 0 that includes the LSB is correctly decoded so that the I value is 1 and the Q value is 0, only symbols that are included in the constellation and indicated by solid circles are used in a limited manner as symbols to be decoded.

Therefore, regardless of the fact that the SD-FEC parity is used only in the bit string of the level 0, it may be possible to reduce errors of the bit strings of the higher levels 1 and 2 and suppress reductions in error correction abilities.

The XOR operator 23x of the PS converter 29x executes an XOR operation on the values of the bit string of the level 0 and the values of the bit string of the level 2 so that, as a symbol is closer to the central point O, the probability of allocating the symbol is higher.

Figure 11:
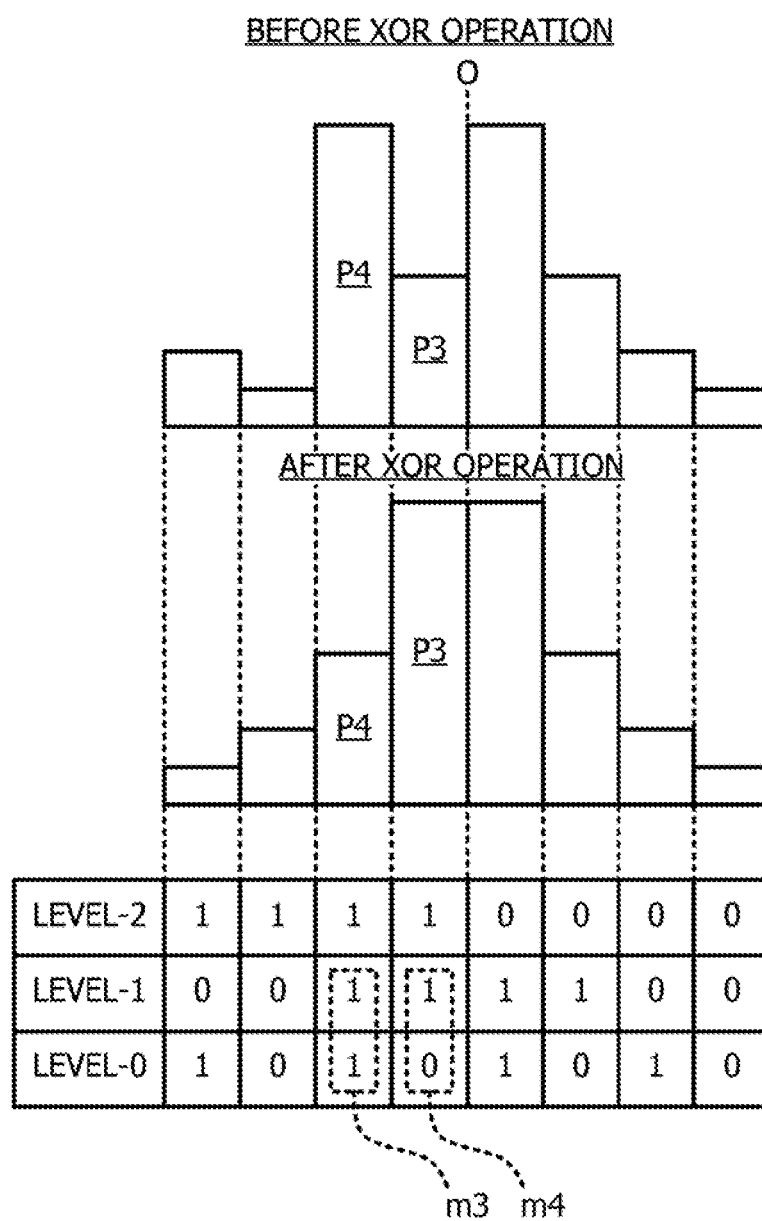
FIG. 11 is a diagram illustrating an example of probability distributions for symbol allocation before and after an XOR operation.

FIG. 11 is a diagram illustrating an example of a probability distribution for symbol allocation before and after an XOR operation. Details illustrated in FIG. 11 and common to those illustrated in FIG. 7 will not be described.

The DM processing sections 21a and 21b convert the values of the bit strings of the levels 0 and 1 so that the number of 1s of each of the bit strings of the levels 0 and 1 is larger than the number of 0s of each of the bit strings of the levels 0 and 1. Therefore, the probability that both values of each of the bit strings of the levels 0 and 1 are "1" is high (refer to a reference symbol m3). In the set partitioning, an array of the I and Q values of the bit string of the level 0 is asymmetric with respect to the central point O. In a probability distribution for symbol allocation before the XOR operation, on one of sides across the central point O, the probability of allocating a symbol P3 closest to the central point O before the XOR operation is lower than the probability of allocating a symbol P4 arranged on the outer side of the symbol P3 before the XOR operation.

In an array of the set partitioning, an XOR operation of the values of the bit string of the level 0 and the values of the bit string of the level 2 that are symmetric with respect to the central point O is executed to increase the probability that the values of the bit string of the level 0 are "0". This increases the probability that the values of each of the bit strings of the levels 0 and 1 are "0" and "1" (refer to a reference symbol m4). In a probability distribution for symbol allocation after the XOR operation, the probability of allocating the symbol P3 closest to the central point O is higher than the probability of allocating the symbol P4 arranged on the outer side of the symbol P3.

The values of the bit string of the level 2 are the HD-FEC parities generated by the HD-FEC generator 24x. Since mark rates of the HD-FEC parities are maintained at approximately 50%, the first to fourth quadrants are selected with almost the same probability.

As illustrated in FIGS. 8 and 9, since the SD-FEC parity is generated only from the bit string of the level 0 in the frame for which MLC has been used, consumption power is reduced, compared to the case where BICM is used.

However, when MLC is used, the SD-FEC parity (refer to a reference symbol 911) without DM processing is inserted only in the bit string of the level 0. Therefore, an effect of improving noise tolerance by the PS may be reduced, compared to the case where BICM is used. Since the HD-FEC parity (refer to a reference symbol 910) without DM processing is inserted in the bit string of the level 1, the effect of improving noise tolerance by the PS may be reduced.

First Embodiment

Figure 12:
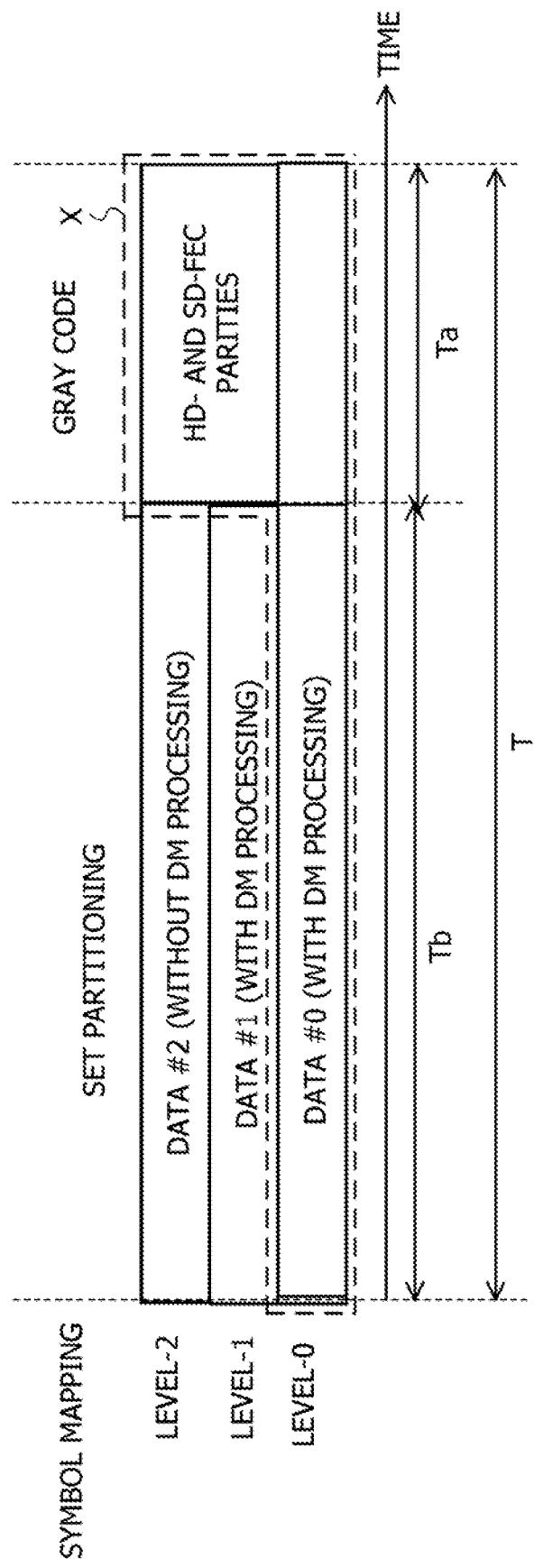
FIG. 12 is a diagram illustrating a frame format of an output signal that is output by an encoding circuit according to a first embodiment.

FIG. 12 is a diagram illustrating a frame format of an output signal Sout that is outputted by an encoding circuit 120 according to a first embodiment. The encoding circuit 120 divides a cycle T of a frame into two time periods Ta and Tb, uses MLC to generate an SD-FEC parity only from a bit string of a level 0 in the time period Tb, and inserts the SD-FEC parity in each of bit strings of levels 2 and 1 in the other time period Ta.

In the time period Tb, data #0 to #2 is included in the bit strings of the levels 0 to 2, respectively. Since the data #2 of the highest level 2 is used to determine a quadrant of a constellation in symbol mapping, the data #2 is not subjected to the DM process (refer to "without DM processing"). The data #1 and #0 of the levels 1 and 0 is already subjected to the DM process for symbol mapping by the PS (refer to "with DM processing").

In the time period Tb, the encoding circuit 120 generates the SD-FEC parity only from the data #0 within the bit string of the lowest level 0 and executes symbol mapping based on the set partitioning.

In the time period Ta, the data #0 subjected to the DM process is included in the bit string of the level 0, and the SD-FEC parity and an HD-FEC parity are inserted in each of the bit strings of the levels 1 and 2. In the time period Tb, the HD-FEC parity is generated from the data #0 to #2 within the bit strings of the levels 0 to 2. In the time period Ta, the HD-FEC parity is generated from the data #0 within the bit string of the level 0. The arrangement form of the SD-FEC parity and the HD-FEC parity is not limited.

In the time period Ta, the encoding circuit 120 generates the SD-FEC parity from the data #0 within the bit string of the lowest level 0 and the HD-FEC parity within the bit strings of the other levels 1 and 2 and executes symbol mapping based on a gray code. The bit string of the level 2 is an example of a first bit string. The bit string of the level 0 is an example of a second bit string.

According to the foregoing frame format, as indicated by a reference symbol X, each of the bit strings of the levels 0 to 2 is an arithmetic region for the SD-FEC parity in the time period Ta, and only the bit string of the level 0 is an arithmetic region for the SD-FEC parity in the time period Tb. Therefore, since the arithmetic regions for the SD-FEC parity are narrower than the arithmetic region in the BICM frame format illustrated in FIG. 3, consumption power is reduced.

In the time period Ta, the SD-FEC parity is not inserted in the bit string of the level 0 and is inserted across the two bit strings of the levels 1 and 2. Thus, when the data amount of the SD-FEC parity is fixed, the time period Ta may be reduced, compared to the case where the SD-FEC parity is inserted only in one bit string.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 13:
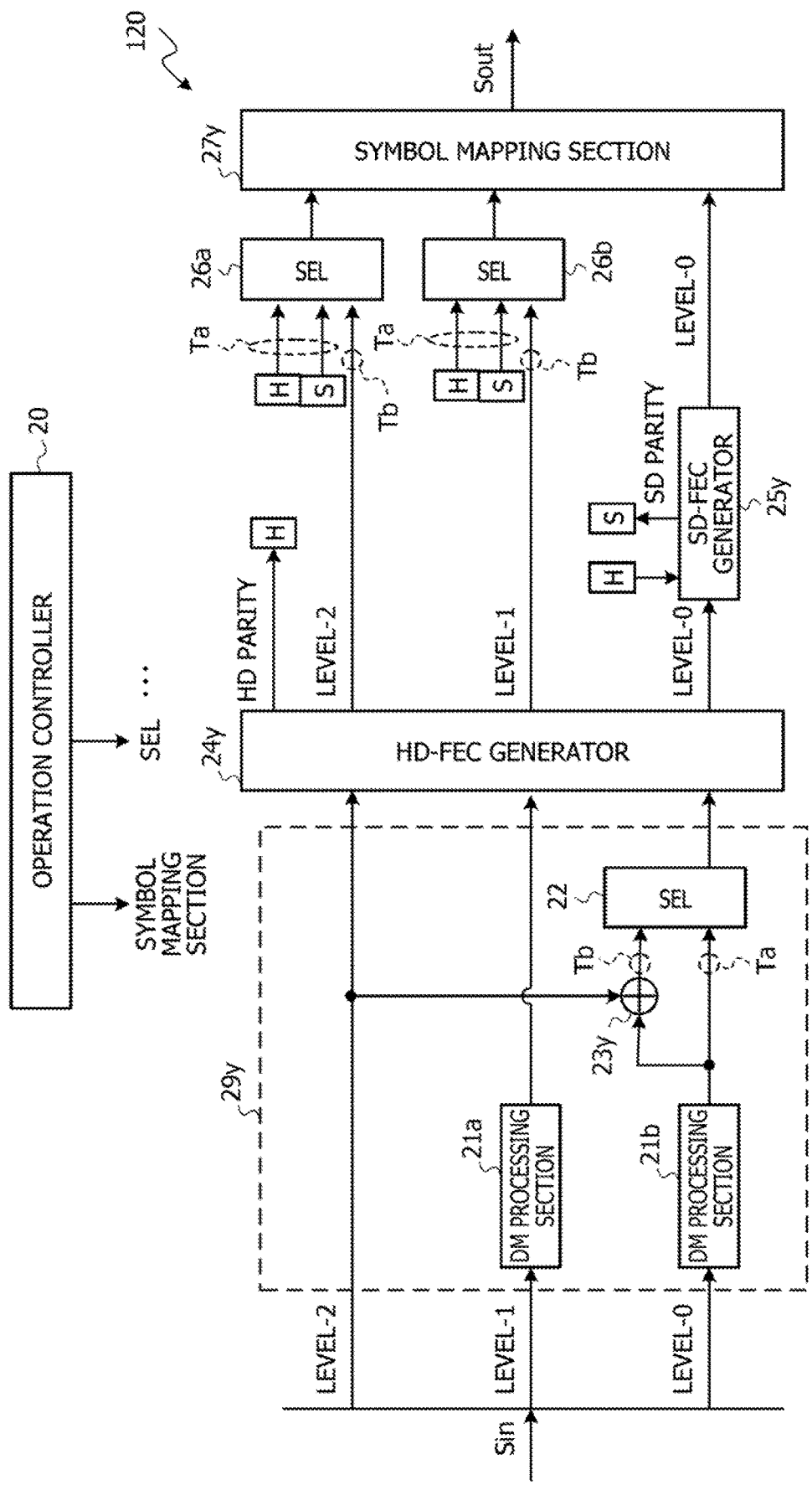
FIG. 13 is a configuration diagram illustrating the encoding circuit according to the first embodiment.

FIG. 13 is a configuration diagram illustrating the encoding circuit 120 according to the first embodiment. Configurations illustrated in FIG. 13 and common to those illustrated in FIG. 3 are indicated by the same reference symbols as those illustrated in FIG. 3 and will not be described. An encoding method according to the first embodiment is the encoding process to be executed by the encoding circuit 120 described below. The encoding circuit 120 is described with reference to FIGS. 12 and 13.

The encoding circuit 120 includes an operation controller 20, a PS converter 29y, an HD-FEC generator 24y, an SD-FEC generator 25y, a symbol mapping section 27y, and selectors (SELs) 26a and 26b. The PS converter 29y includes DM processing sections 21a and 21b, a selector (SEL) 22, and an XOR operator 23y. In this embodiment, 64 QAM is used as multilevel modulation.

The operation controller 20 is an example of a switching section. In the cycle T of the frame, the operation controller 20 switches between the time period Ta in which the SD-FEC parity is inserted in the bit strings and the time period Tb in which the SD-FEC parity is not inserted in the bit strings. For example, the operation controller 20 controls the symbol mapping section 27y and the selectors 22, 26a, and 26b according to the time periods Ta and Tb. The time period Ta is an example of a first time period. The time period Tb is an example of a second time period.

The encoding circuit 120 switches between the bit strings of the arithmetic regions for the SD-FEC parity and the symbol mapping of the symbol mapping section 27y in each of the time periods Ta and Tb within the cycle T of the frame. Therefore, the operation controller 20 switches input sources (or input signals) of the selectors 22, 26a, and 26b and switches the symbol mapping of the symbol mapping section 27y to the gray code or the set partitioning in accordance with frame synchronization information input from, for example, the setting processing section 15.

In FIG. 13, "Hs" surrounded by squares indicate coupling relationships between output and input of the HD-FEC parity (HD parity), and "Ss" surrounded by squares indicate coupling relationships between output and input of the SD-FEC parity (SD parity). For example, the SD-FEC parity output by the SD-FEC generator 25y is input to the selectors 26a and 26b.

Reference symbols (Ta and Tb) added to input signals of the selectors 22, 26a, and 26b indicate the time periods Ta and Tb in which the input signals are selected. For example, the selector 26a selects the HD-FEC parity as the input signal in the time period Ta and selects the SD-FEC parity as the input signal in the time period Tb. The foregoing expressions are used in FIG. 14 and later.

Each of the bit strings of the levels 0 to 2 is input to the PS converter 29y. The PS converter 29y is an example of a converter. The PS converter 29y converts values of each of the bit strings of the levels 0 and 1 other than the bit string of the level 2 so that, as a region within a constellation is closer to the center of the constellation, the number of symbols allocated in the region is larger. The bit string of the level 2 and the bit string of the level 1 that has been subjected to the DM process are input to the selector 22 and the HD-FEC generator 24y. The bit string of the level 2 and the bit string of the level 0 that has been subjected to the DM process are input to the XOR operator 23y and the selector 22.

The XOR operator 23y executes an XOR operation on the bit string of the level 0 that has been output from the DM processing section 21b and the bit string of the level 2. The bit string of the level 0 after the XOR operation is input to the selector 22.

The selector 22 selects a bit string to be output to the HD-FEC generator 24y from the bit string of the level 0 after the XOR operation and the bit string of the level 0 that is not subjected to the XOR operation. In the time period Ta, the selector 22 selects the bit string of the level 0 that is not subjected to the XOR operation. Although the symbol mapping based on the gray code is executed in the time period Ta, the SD-FEC parity and the HD-FEC parity are inserted in the bit string of the level 1 in the time period Ta. Therefore, an XOR operation of the bit string of the level 0 and the bit string of the level 1 is not executed, differently from the encoding circuit 120 illustrated in FIG. 3.

Since the symbol mapping based on the set partitioning is executed in the time period Tb, the XOR operation of the bit string of the level 0 and the bit string of the level 1 is executed, like the encoding circuit 120 illustrated in FIG. 8.

The HD-FEC generator 24y is an example of a second inserting section. The HD-FEC generator 24y generates, from each of the bit strings of the levels 0 to 2, the HD-FEC parity to correct an error of each of the bit strings of the levels 0 to 2 and inserts the HD-FEC parity in each of the bit strings of the levels 1 and 2 in the time period Ta in accordance with the switching between the time periods Ta and Tb by the operation controller 20. The HD-FEC parity is an example of the second error correction code.

The HD-FEC generator 24y calculates the HD-FEC parity from the data #0 to #2 of the bit strings of the levels 0 to 2 and outputs the HD-FEC parity to the SD-FEC generator 25y and the selectors 26a and 26b. The HD-FEC generator 24y outputs the input bit strings of the levels 1 and 2 to the selectors 26a and 26b without changing the bit strings of the levels 1 and 2 and outputs the input bit string of the level 0 to the SD-FEC generator 25y without changing the bit string of the level 0.

The SD-FEC generator 25y is an example of a first inserting section. The SD-FEC generator 25y generates the SD-FEC parity from the bit string of the level 0 in the time period Tb and inserts the SD-FEC parity in the bit strings of the levels 1 and 2 in the time period Ta in accordance with the switching between the time periods Ta and Tb by the operation controller 20. The SD-FEC parity is an example of a first error correction code.

The SD-FEC generator 25y generates the SD-FEC parity from the data #0 within the bit string of the level 0 and the HD-FEC parity within the bit strings of the levels 1 and 2 in the time period Ta. For example, the SD-FEC parity is calculated from each of the bit strings of the levels 0 to 2 in the time period Ta. The SD-FEC generator 25y generates the SD-FEC parity from the data #0 within the bit string of the level 0 in the time period Tb.

The SD-FEC generator 25y outputs the SD-FEC parity to the selectors 26a and 26b. The SD-FEC generator 25y outputs the input bit string of the level 0 to the symbol mapping section 27y without changing the bit string of the level 0.

The selector 26a selects, as an input signal, the SD-FEC parity and the HD-FEC parity and outputs the input signal to the symbol mapping section 27y in the time period Ta. The selector 26a selects, as an input signal, the data #2 within the bit string of the level 2 and outputs the input signal to the symbol mapping section 27y in the time period Tb. The selector 26b selects, as an input signal, the SD-FEC parity and the HD-FEC parity and outputs the input signal to the symbol mapping section 27y in the time period Ta. The selector 26b selects, as an input signal, the data #1 within the bit string of the level 1 and outputs the input signal to the symbol mapping section 27y in the time period Tb.

Therefore, the data #0 to #2 within the bit strings of the levels 0 to 2 is input to the symbol mapping section 27y in the time period Tb in accordance with the switching between the time periods Ta and Tb by the operation controller 20. The HD-FEC parity and the SD-FEC parity within the bit strings of the levels 1 and 2 and the data #0 within the bit string of the level 0 are input to the symbol mapping section 27y in the time period Ta in accordance with the switching between the time periods Ta and Tb by the operation controller 20. In this manner, the foregoing frame format is formed.

The symbol mapping section 27y is an example of an allocator. The symbol mapping section 27y allocates, to the bit strings of the levels 0 to 2, symbols that are among a plurality of symbols within the 64-QAM constellation and correspond to the values of the bit strings of the levels 0 to 2. The symbol mapping section 27y switches the symbol mapping to the method based on the set partitioning or the method based on the gray code (refer to FIGS. 6 and 10) according to the time periods Ta and Tb within the cycle T of the frame. Data of the symbol mapping is stored in a memory within the symbol mapping section 27y or the like, for example.

In this manner, in the cycle T of the frame, the operation controller switches between the time period Ta in which the SD-FEC parity is inserted in the bit strings and the time period Tb in which the SD-FEC parity is not inserted in the bit strings. The SD-FEC generator 25y generates the SD-FEC parity from the bit string of the level 0 in the time period Ta and inserts the SD-FEC parity in the bit strings of the levels 1 and 2 other than the bit string of the level 0 in the time period Ta in accordance with the switching between the time periods Ta and Tb by the operation controller 20.

Thus, in the time period Ta, each of the bit strings of the levels 0 to 2 is an arithmetic region for the SD-FEC parity. In the time period Tb, only the bit string of the level 0 is an arithmetic region for the SD-FEC parity. Therefore, since the arithmetic regions for the SD-FEC parity are narrower than the arithmetic region in the BICM frame format illustrated in FIG. 3, consumption power is reduced.

In the time period Ta, the SD-FEC parity is not inserted in the bit string of the level 0 and is inserted across the two bit strings of the levels 1 and 2. Therefore, when the data amount of the SD-FEC parity is fixed, the time period Ta may be reduced, compared to the case where the SD-FEC parity is inserted only in one bit string.

Accordingly, the encoding circuit 120 may reduce consumption power without reducing noise tolerance.

Figure 14:
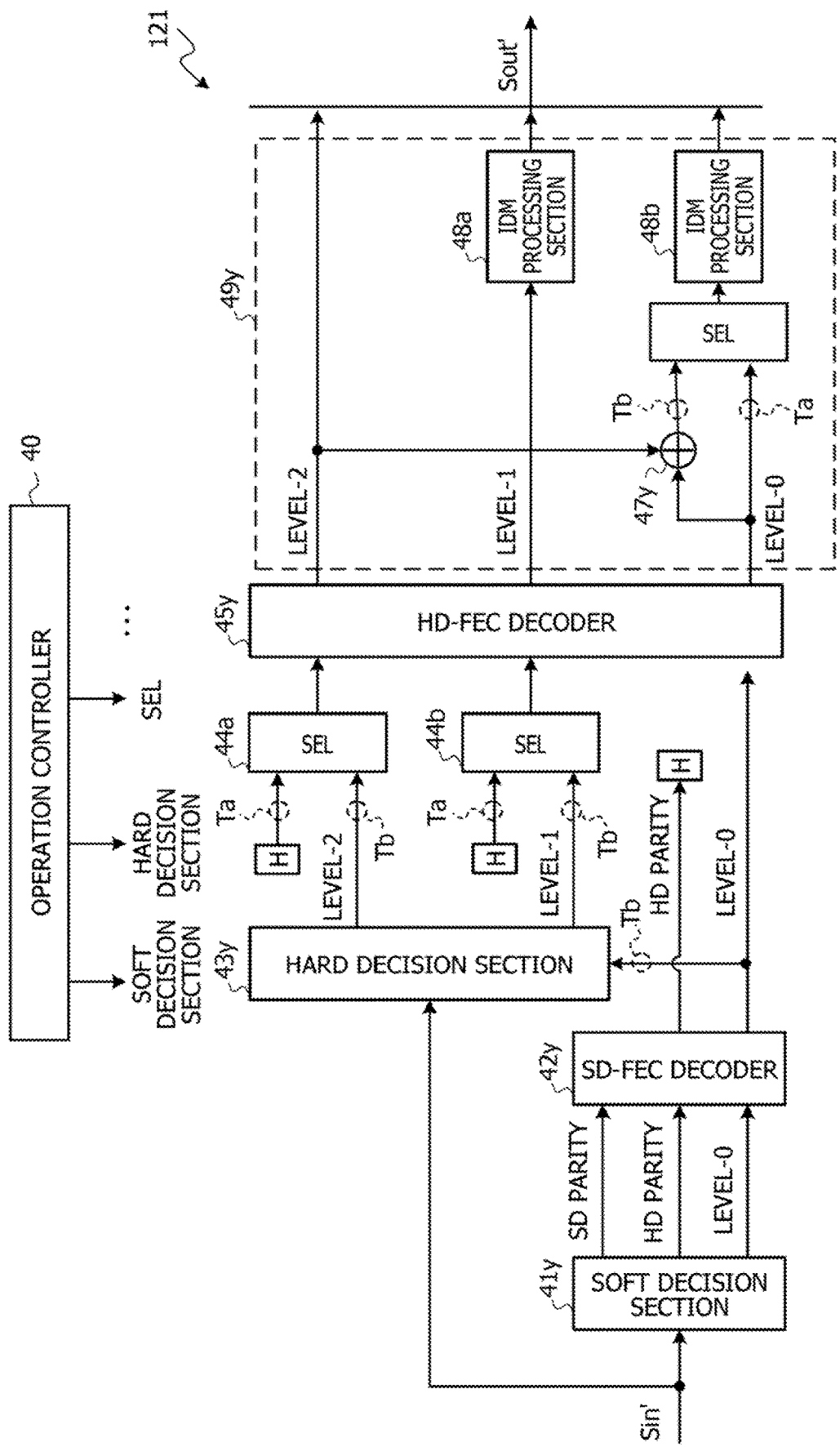
FIG. 14 is a configuration diagram illustrating a decoding circuit according to the first embodiment.

FIG. 14 is a configuration diagram illustrating the decoding circuit 121 according to the first embodiment. Configurations illustrated in FIG. 14 and common to those illustrated in FIG. 4 are indicated by the same reference symbols as those illustrated in FIG. 4 and will not be described. A decoding method according to the first embodiment is the decoding process to be executed by the decoding circuit 121 described below. The decoding circuit 121 is described below with reference to FIGS. 12 and 14.

The decoding circuit 121 includes an operation controller 40, a soft decision section 41y, an SD-FEC decoder 42y, a hard decision section 43y, selectors 44a and 44b, an HD-FEC decoder 45y, and a PS inverse converter 49y. The PS inverse converter 49y includes a selector 46, an XOR operator 47y, and IDM processing sections 48a and 48b.

The operation controller 40 is an example of a notifying section. For example, the operation controller 40 notifies, in accordance with synchronization information of the frame, the selectors 44a, 44b, and 46, the soft decision section 41y, and the hard decision section 43y of the time period Ta in which the SD-FEC parity is inserted in the bit strings and the time period Tb in which the SD-FEC parity is not inserted in the bit strings. The selectors 44a, 44b, and 46 select input signals in accordance with the notification of the time periods Ta and Tb. The soft decision section 41y and the hard decision section 43y switch symbol demapping to a method based on the set partitioning or a method based on the gray code in accordance with the notification of the time periods Ta and Tb.

An input signal Sin' is input from the analog-digital converter 13 to the soft decision section 41y and the hard decision section 43y.

The soft decision section 41y is an example of a first deciding section. The soft decision section 41y executes, based on a symbol, soft decision on each of the values of the bit strings of the levels 0 to 2 within the frame to which the symbol within the 64-QAM constellation is allocated. The soft decision section 41y extracts the HD-FEC parity and the SD-FEC parity from each of the bit strings of the levels 1 and 2 in the time period Ta based on the results of the soft decision and outputs the HD-FEC parity and the SD-FEC parity to the SD-FEC decoder 42y. The soft decision section 41y outputs the data #0 within the bit string of the level 0 to the SD-FEC decoder 42y based on the results of the soft decision.

The SD-FEC decoder 42y is an example of a corrector. The SD-FEC decoder 42y corrects an error of the results of the decision by the soft decision section 41y based on the SD-FEC parity inserted in the bit strings of the levels 1 and 2 in the time period Ta within the cycle T of the frame. For example, the SD-FEC decoder 42y decodes the bit strings of the levels 0 to 2 based on the SD-FEC parity.

The bit string of the level 0 is input from the SD-FEC decoder 42y to the hard decision section 43y and the HD-FEC decoder 45y. The HD-FEC parity is input from the SD-FEC decoder 42y to the selectors 44a and 44b.

The hard decision section 43y is an example of a second deciding section. The hard decision section 43y executes, based on the symbols, hard decision on the values of each of the bit strings of the levels 1 and 2 that are not the bit string of the level 0 and are among the bit strings of the levels 0 to 2, while the symbols within the 64-QAM constellation are allocated to the bit strings of the levels 0 to 2. For example, for the hard decision, the hard decision section 43y uses the bit string of the level 0 that has been input from the SD-FEC decoder 42y in the time period Tb. For example, the hard decision section 43y acquires, as an input signal, the data #0 within the bit string of the level 0 in the time period Tb. The bit string of the level 2 is input from the hard decision section 43y to the selector 44a. The bit string of the level 1 is input from the hard decision section 43y to the selector 44b.

The selector 44a selects, from the HD-FEC parity and the bit string (data #2) of the level 2, an output signal to be output to the HD-FEC decoder 45y. The selector 44a selects the HD-FEC parity in the time period Ta and selects the bit string of the level 2 in the time period Tb.

The selector 44b selects, from the HD-FEC parity and the data #1 within the bit string of the level 1, an output signal to be output to the HD-FEC decoder 45y. The selector 44b selects the HD-FEC parity in the time period Ta and selects the bit string of the level 1 in the time period Tb.

The HD-FEC decoder 45y uses the HD-FEC parity to execute error correction on the values of the bit strings of the levels 0 to 2. For example, the HD-FEC decoder 45y decodes each of the bit strings of the levels 0 to 2 based on the HD-FEC parity.

The HD-FEC decoder 45y decodes the data #0 to #2 of the bit strings of the levels 0 to 2 in the time period Tb and decodes the data #0 of the bit string of the level 0 in the time period Ta. In this case, the HD-FEC decoder 45y maintains an error correction ability by executing the multilevel decoding. The HD-FEC decoder 45y outputs each of the bit strings of the levels 0 to 2 to the PS inverse converter 49y.

The PS inverse converter 49y is an example of an inverse converter. The PS inverse converter 49y inversely converts the values of the bit strings of the levels 0 and 1 that have been converted by the DM process and are not the bit string of the level 2. The bit string of the level 2 is input to the XOR operator 47y and the bit string of the level 1 is input to the IDM processing section 48a. The bit string of the level 0 is input to the XOR operator 47y and the selector 46.

The XOR operator 47y executes an XOR operation on the bit string of the level 2 and the bit string of the level 0. The bit string of the level 0 after the XOR operation is inputted to the selector 46.

The selector 46 selects a bit string to be output to the IDM processing section 48b from the bit string of the level 0 after the XOR operation and the bit string of the level 0 before the XOR operation. The selector 46 selects the bit string of the level 0 after the XOR operation in the time period Tb and selects the bit string of the level 0 before the XOR operation in the time period Ta. Therefore, the values of the bit string of the level 0 that have been subjected to the XOR operation by the XOR operator 23y of the encoding circuit 120 are restored to the values before the XOR operation. The selected bit string of the level 0 is input from the selector 46 to the IDM processing section 48b.

The bit strings of the levels 0 and 1 that have been subjected to an inverse-DM process by the IDM processing sections 48a and 48b and the bit string of the level 2 are output as an output signal Sout' to the framer chip 11 via, for example, parallel-serial conversion.

In this manner, the soft decision section 41y executes, based on one of the symbols, the soft decision on each of the values of the bit strings of the levels 0 to 2 within the frame to which the one of the plurality of symbols within the 64-QAM constellation is allocated. The SD-FEC decoder 42y corrects an error of the results of the soft decision by the soft decision section 41y based on the SD-FEC parity inserted in the bit strings of the levels 1 and 2.

The hard decision section 43y executes the hard decision on the values of each of the bit strings of the levels 1 and 2 among the plurality of bit strings based on the allocated symbols. The PS inverse converter 49y inversely converts the values of the bit strings of the levels 0 and 1 that have been converted so that, as a region within the constellation is closer to the center of the constellation, the number of symbols allocated in the region is larger.

The selectors 44a and 44b select bit strings to be input to the PS inverse converter 49y from a bit string (for example, the HD-FEC parity output from the SD-FEC decoder 42y) that is included in the bit strings of the levels 1 and 2 other than the bit string of the level 0 and for which an error of the results of the soft decision has been corrected based on the SD-FEC parity and each of the bit strings of the levels 1 and 2 that have been subjected to the hard decision by the hard decision section 43y. Each of the selectors 44a and 44b is an example of a selector.

The operation controller 40 notifies the selectors 44a and 44b of the time period Ta in which the SD-FEC parity is inserted in the bit strings of the levels 1 and 2 and the time period Tb in which the SD-FEC parity is not inserted in the bit strings of the levels 1 and 2. The selectors 44a and 44b select bit strings for which errors of the results of the soft decision have been corrected based on the SD-FEC parity in the time period Ta in accordance with the notification by the operation controller 40. The selectors 44a and 44b select bit strings subjected to the hard decision by the hard decision section 43y in the time period Tb in accordance with the notification by the operation controller 40.

Therefore, in each of the bit strings of the levels 0 to 2 that has been inversely converted by the PS inverse converter 49y, a range to be decoded based on the SD-FEC parity is changed based on the frame format according to the time periods Ta and Tb. Accordingly, the decoding circuit 121 that corresponds to the encoding circuit 120 according to the first embodiment may decode each of the bit strings and may reduce consumption power without reducing noise tolerance.

Second Embodiment

Figure 15:
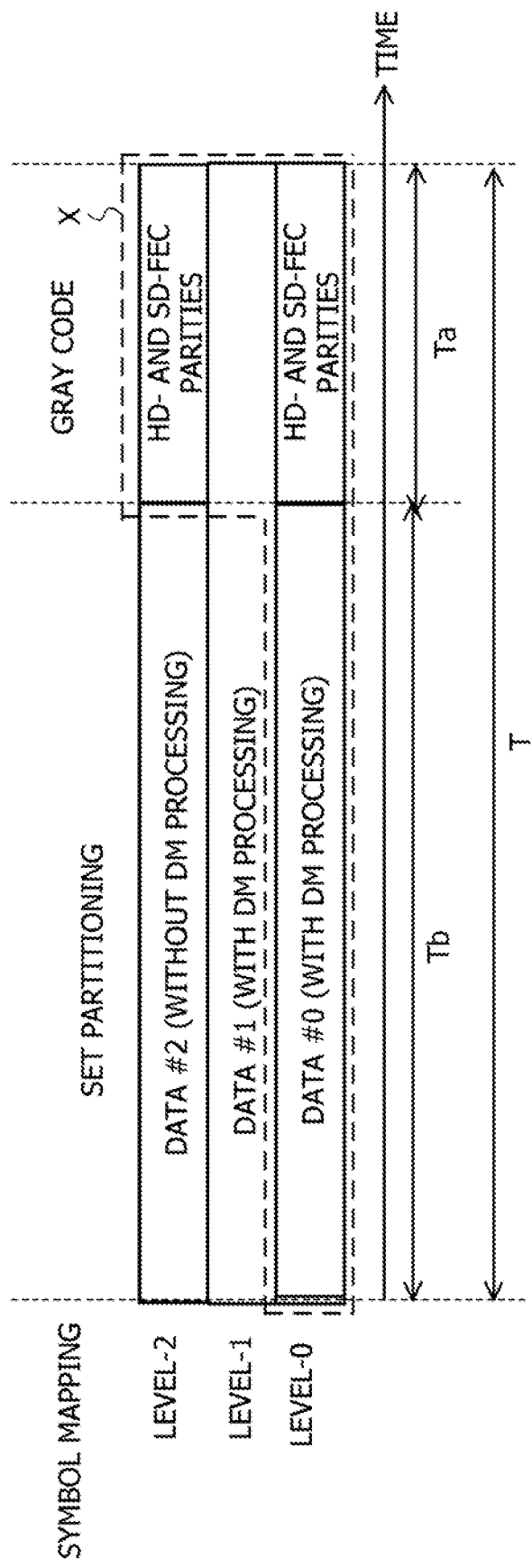
FIG. 15 is a diagram illustrating a frame format of an output signal that is output by an encoding circuit according to a second embodiment.

FIG. 15 is a diagram illustrating a frame format of an output signal Sout that is output by an encoding circuit 120 according to a second embodiment. A configuration in the frame format according to the present embodiment in the time period Ta is different from that described in the first embodiment. In the time period Ta, an HD-FEC parity and an SD-FEC parity are included in the bit string of the level 0 and the bit string of the level 2. The arrangement form of the SD-FEC parity and the HD-FEC parity is not limited.

In the time period Ta, the data #1 is included in the bit string of the level 1. The SD-FEC parity is generated from the data #1 within the bit string of the level 1 and the HD-FEC parity within the bit strings of the levels 0 and 2 in the time period Ta. The SD-FEC parity is generated from the data #0 within the bit string of the level 0 in the time period Tb.

According to the foregoing frame format, as indicated by a reference symbol X, each of the bit strings of the levels 0 to 2 is an arithmetic region for the SD-FEC parity in the time period Ta, and only the bit string of the level 0 is an arithmetic region for the SD-FEC parity in the time period Tb. Therefore, since the arithmetic regions for the SD-FEC parity are narrower than the arithmetic region in the BICM frame format illustrated in FIG. 3, consumption power is reduced.

In the time period Ta, the SD-FEC parity is not inserted in the bit string of the level 1 and is inserted across the two bit strings of the levels 0 and 2. Therefore, when the data amount of the SD-FEC parity is fixed, the time period Ta may be reduced, compared to the case where the SD-FEC parity is inserted only in one bit string.

Therefore, the encoding circuit 120 and a decoding circuit 121 execute an encoding process and a decoding process, respectively, based on the foregoing frame format, and thus may reduce consumption power without reducing noise tolerance. In the time period Ta, the SD-FEC parity is not inserted in the bit string of the level 1 that is higher than the level 0, and the data #1 to be subjected to the DM process is included in the bit string of the level 1. An effect of probabilistic shaping is higher as the level of a bit string subjected to the probabilistic shaping is higher. Therefore, according to the frame format according to the present embodiment, noise tolerance may be improved, compared to the first embodiment. The bit string of the level 1 is an example of a third bit string.

Configurations of the encoding circuit 120 and the decoding circuit 121 are described below.

Figure 16:
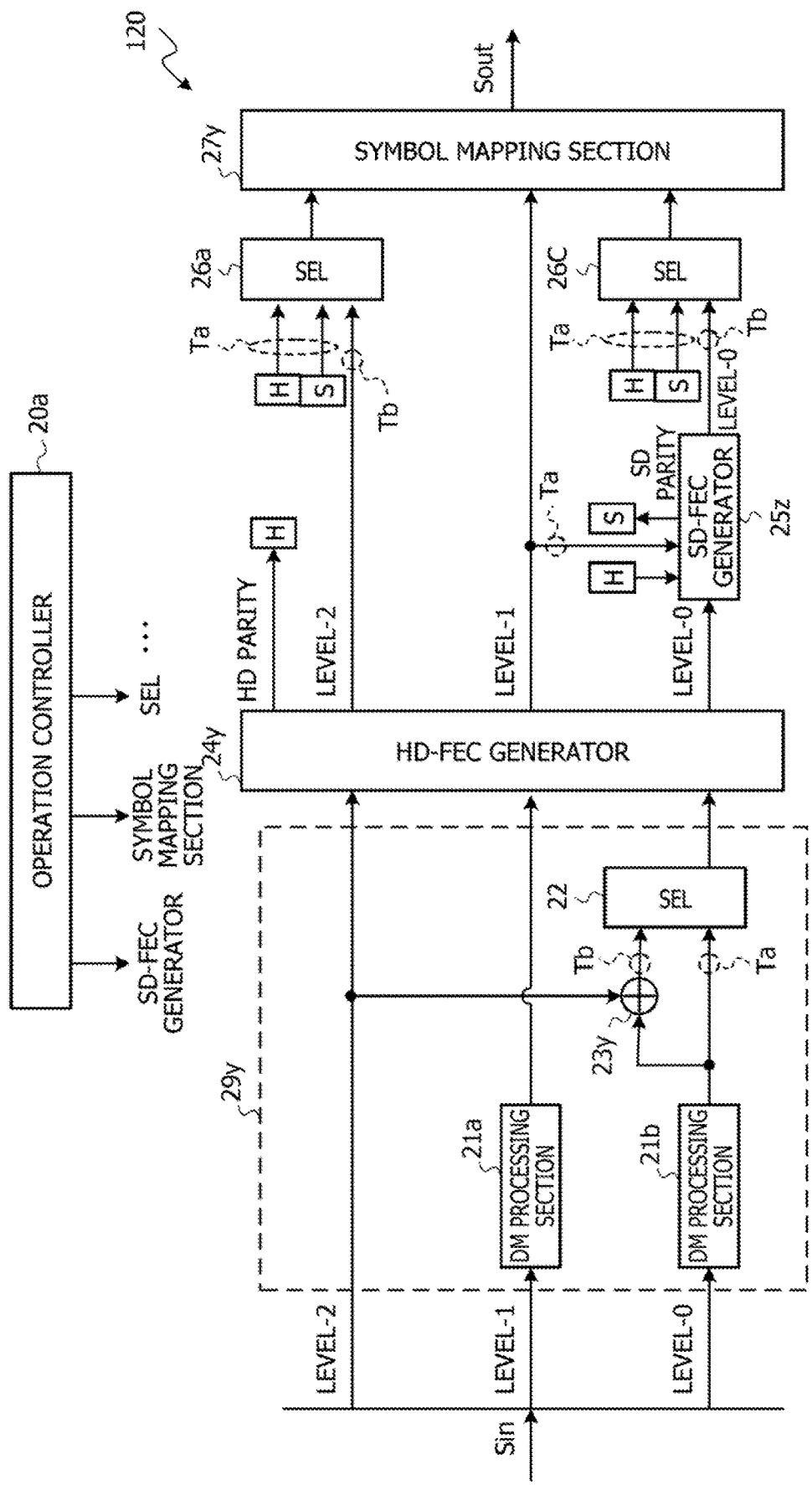
FIG. 16 is a configuration diagram illustrating the encoding circuit according to the second embodiment.

FIG. 16 is a configuration diagram illustrating the encoding circuit 120 according to the second embodiment. Configurations illustrated in FIG. 16 and common to those illustrated in FIG. 13 are indicated by the same reference symbols as those illustrated in FIG. 13 and will not be described. An encoding method according to the second embodiment is the encoding process to be executed by the encoding circuit 120 described below. Differences from the encoding circuit 120 according to the first embodiment are described below with reference to FIGS. 15 and 16.

The encoding circuit 120 includes an operation controller 20a, a PS converter 29y, an HD-FEC generator 24y, an SD-FEC generator 25z, a symbol mapping section 27y, and selectors 26a and 26c. The PS converter 29y includes DM processing sections 21a and 21b, a selector 22, and an XOR operator 23y. In this embodiment, 64 QAM is used as multilevel modulation.

The operation controller 20a is an example of the switching section. In the cycle T of the frame, the operation controller 20a switches between the time period Ta in which the SD-FEC parity is inserted in the bit strings and the time period Tb in which the SD-FEC parity is not inserted in the bit strings. For example, the operation controller 20a controls the symbol mapping section 27y, the SD-FEC generator 25z, and the selectors 22, 26a, and 26c according to the time periods Ta and Tb.

The HD-FEC generator 24y outputs the inputted bit string of the level 2 to the selector 26a without changing the bit string of the level 2 and outputs the inputted bit string of the level 1 to the symbol mapping section 27y and the SD-FEC generator 25z without changing the bit string of the level 1. The HD-FEC generator 24y outputs the inputted bit string of the level 0 to the SD-FEC generator 25z without changing the bit string of the level 0.

The SD-FEC generator 25z is an example of the first inserting section. The SD-FEC generator 25z generates the SD-FEC parity from the bit string of the level 0 in the time period Tb and inserts the SD-FEC parity in the bit strings of the levels 0 and 2 in the time period Ta in accordance with the switching between the time periods Ta and Tb by the operation controller 20a. The SD-FEC generator 25z generates the SD-FEC parity from the data #1 within the bit string of the level 1 and the HD-FEC parity within the bit strings of the levels 0 and 2 in the time period Ta. For example, the SD-FEC parity is calculated from each of the bit strings of the levels 0 to 2 in the time period Ta.

The SD-FEC generator 25z outputs the SD-FEC parity to the selectors 26a and 26c. The SD-FEC generator 25z outputs the input bit string of the level 0 to the symbol mapping section 27y without changing the bit string of the level 0.

The selector 26a selects, as an input signal, the SD-FEC parity and the HD-FEC parity and outputs the input signal to the symbol mapping section 27y in the time period Ta. The selector 26a selects, as an input signal, the data #2 within the bit string of the level 2 and outputs the input signal to the symbol mapping section 27y in the time period Tb.

The selector 26c selects, as an input signal, the SD-FEC parity and the HD-FEC parity and outputs the input signal to the symbol mapping section 27y in the time period Ta. The selector 26c selects, as an input signal, the data #0 within the bit string of the level 0 and outputs the input signal to the symbol mapping section 27y in the time period Tb.

Therefore, the data #0 to #2 within the bit strings of the levels 0 to 2 is input to the symbol mapping section 27y in the time period Tb in accordance with the switching between the time periods Ta and Tb by the operation controller 20a. The HD-FEC parity and the SD-FEC parity within the bit strings of the levels 0 and 2 and the data #0 within the bit string of the level 0 are input to the symbol mapping section 27y in the time period Ta in accordance with the switching between the time periods Ta and Tb by the operation controller 20a. In this manner, the foregoing frame format is formed.

In this manner, the SD-FEC generator 25z inserts the SD-FEC parity in two or more bit strings other than the bit string of the level 1 higher than the lowest level 0 or in the bit strings of the levels 0 and 2.

Therefore, in the time period Ta, the SD-FEC parity is not inserted in the bit string of the level 1 higher than the level 0, and the data #1 with DM processing is included in the bit string of the level 1. An effect of the probabilistic shaping is higher as the level of a bit string subjected to the probabilistic shaping is higher. Therefore, according to the configuration described in the present embodiment, noise tolerance may be improved, compared to the first embodiment.

Figure 17:
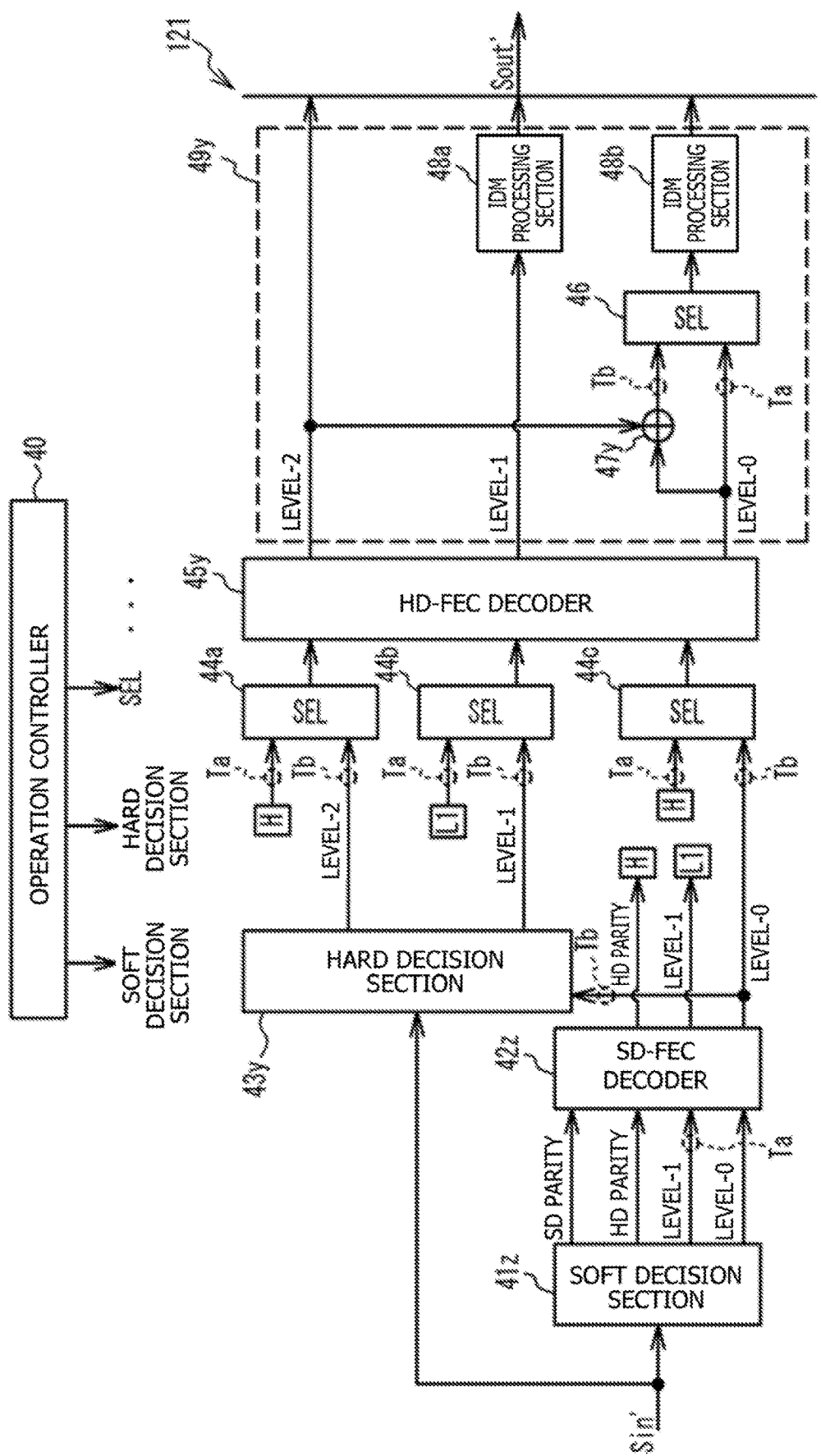
FIG. 17 is a configuration diagram illustrating a decoding circuit according to the second embodiment.

FIG. 17 is a configuration diagram illustrating the decoding circuit 121 according to the second embodiment. Configurations illustrated in FIG. 17 and common to those illustrated in FIG. 14 are indicated by the same reference symbols as those illustrated in FIG. 14 and will not be described. A decoding method according to the first embodiment is the decoding process to be executed by the decoding circuit 121 described below. Differences from the decoding circuit 121 according to the first embodiment are described below with reference to FIGS. 15 and 17.

In FIG. 17, "L1" surrounded by squares indicate a coupling relationship between output and input of the data #1 of the bit string of the level 1. This expression is used in FIG. 18 and later.

The decoding circuit 121 includes an operation controller 40, a soft decision section 41z, an SD-FEC decoder 42z, a hard decision section 43y, selectors 44a to 44c, an HD-FEC decoder 45y, and a PS inverse converter 49y. The PS inverse converter 49y includes a selector 46, an XOR operator 47y, and IDM processing sections 48a and 48b.

An input signal Sin' is input from the analog-digital converter 13 to the soft decision section 41z and the hard decision section 43y.

The soft decision section 41z is an example of the first deciding section. The soft decision section 41z executes, based on a symbol, soft decision on each of the values of the bit strings of the levels 0 to 2 within the frame to which the symbol within the 64-QAM constellation is allocated. The soft decision section 41z extracts the HD-FEC parity and the SD-FEC parity from each of the bit strings of the levels 0 and 2 based on the results of the soft decision and outputs the HD-FEC parity and the SD-FEC parity to the SD-FEC decoder 42z. The soft decision section 41z outputs the data #0 and #1 within the bit strings of the levels 0 and 1 to the SD-FEC decoder 42z based on the results of the soft decision.

The SD-FEC decoder 42z is an example of a corrector. The SD-FEC decoder 42z corrects an error of the results of the decision by the soft decision section 41z based on the SD-FEC parity inserted in the bit strings of the levels 0 and 2 in the time period Ta within the cycle T of the frame. For example, the SD-FEC decoder 42z decodes the bit strings of the levels 0 to 2 based on the SD-FEC parity.

The SD-FEC decoder 42z outputs the bit string of the level 1 to the selector 44b in the time period Ta. The SD-FEC decoder 42z outputs the HD-FEC parity to the selectors 44a and 44c and outputs the bit string of the level 0 to the selector 44c.

The selector 44b selects an output signal to be output to the HD-FEC decoder 45y from the data #1 included in the bit string of the level 1 that has been subjected to the soft decision and the data #1 included in the bit string of the level 1 that has been subjected to hard decision. In the time period Tb, the selector 44b selects the bit string of the level 1 that has been subjected to the hard decision. In the time period Ta, the selector 44b selects the bit string of the level 1 that has been subjected to the soft decision.

The selector 44c selects an output signal to be output to the HD-FEC decoder 45y from the HD-FEC parity and the data #0 within the bit string of the level 0. The selector 44c selects the HD-FEC parity in the time period Ta and selects the bit string of the level 0 in the time period Tb.

The HD-FEC decoder 45y decodes the data #0 to #2 of the bit strings of the levels 0 to 2 in the time period Tb and decodes the data #1 of the bit string of the level 1 in the time period Ta.

As described above, the SD-FEC decoder 42z corrects an error of the results of the soft decision by the soft decision section 41z based on the SD-FEC parity inserted in the bit strings of the levels 0 and 2. The selectors 44a and 44b select bit strings to be input to the PS inverse converter 49y from a bit string that is included in the bit strings other than the bit string of the level 0 and for which an error of the results of the soft decision has been corrected based on the SD-FEC parity and a bit string that is included in the bit strings other than the bit string of the level 0 and has been subjected to the hard decision by the hard decision section 43y.

The selectors 44a and 44b select bit strings for which errors of the results of the soft decision have been corrected based on the SD-FEC parity in the time period Ta in accordance with notification by the operation controller 40. The selectors 44a and 44b select bit strings subjected to the hard decision by the hard decision section 43y in the time period Tb in accordance with notification by the operation controller 40.

Therefore, in each of the bit strings of the levels 0 to 2 that has been inversely converted by the PS inverse converter 49y, a range to be decoded based on the SD-FEC parity is changed based on the frame format according to the time periods Ta and Tb. Accordingly, the decoding circuit 121 that corresponds to the encoding circuit 120 according to the second embodiment may decode each of the bit strings and may reduce consumption power without reducing noise tolerance.

Third Embodiment

Figure 18:
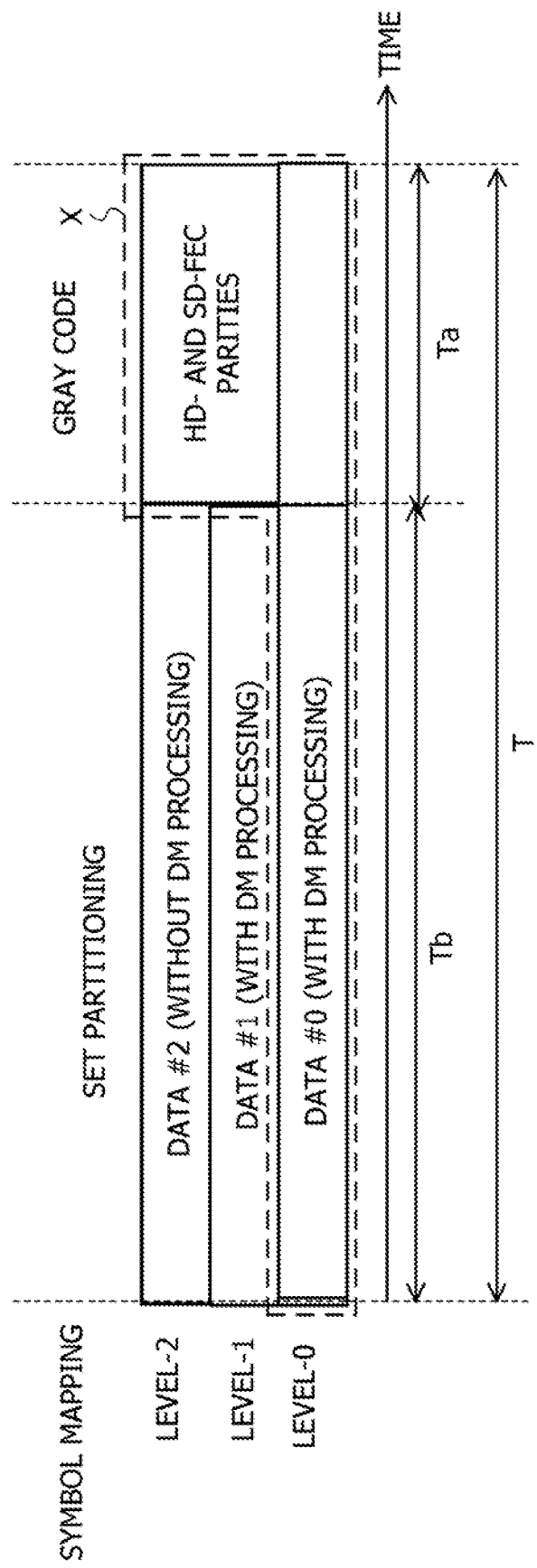
FIG. 18 is a diagram illustrating a frame format of an output signal that is output by an encoding circuit according to a third embodiment.

FIG. 18 is a diagram illustrating a frame format of an output signal Sout that is output by an encoding circuit 120 according to a third embodiment. A configuration in the frame format according to the present embodiment in the time period Ta is different from that described in the first embodiment. In the time period Ta, an HD-FEC parity and an SD-FEC parity are included in each of the bit strings of the levels 0 to 2. The arrangement form of the SD-FEC parity and the HD-FEC parity is not limited.

The SD-FEC parity is generated from the HD-FEC parity within the bit strings of the levels 0 to 2 in the time period Ta. The SD-FEC parity is generated from the data #0 within the bit string of the level 0 in the time period Tb.

According to the foregoing frame format, as indicated by a reference symbol X, each of the bit strings of the levels 0 to 2 is an arithmetic region for the SD-FEC parity in the time period Ta, and only the bit string of the level 0 is an arithmetic region for the SD-FEC parity in the time period Tb. Therefore, since the arithmetic regions for the SD-FEC parity are narrower than the arithmetic region in the BICM frame format illustrated in FIG. 3, consumption power is reduced.

In the time period Ta, the SD-FEC parity is inserted across the three bit strings of the levels 0 to 2. Therefore, when the data amount of the SD-FEC parity is fixed, the time period Ta may be reduced, compared to the case where the SD-FEC parity is inserted only in one bit string. Since the SD-FEC parity is divided and inserted across the three strings, the time period Ta is reduced, compared to the cases described in the first and second embodiments. Therefore, regions for the data #0 and #1 included in the bit strings of the levels 0 and 1 and to be subjected to the DM process may be increased.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 19:
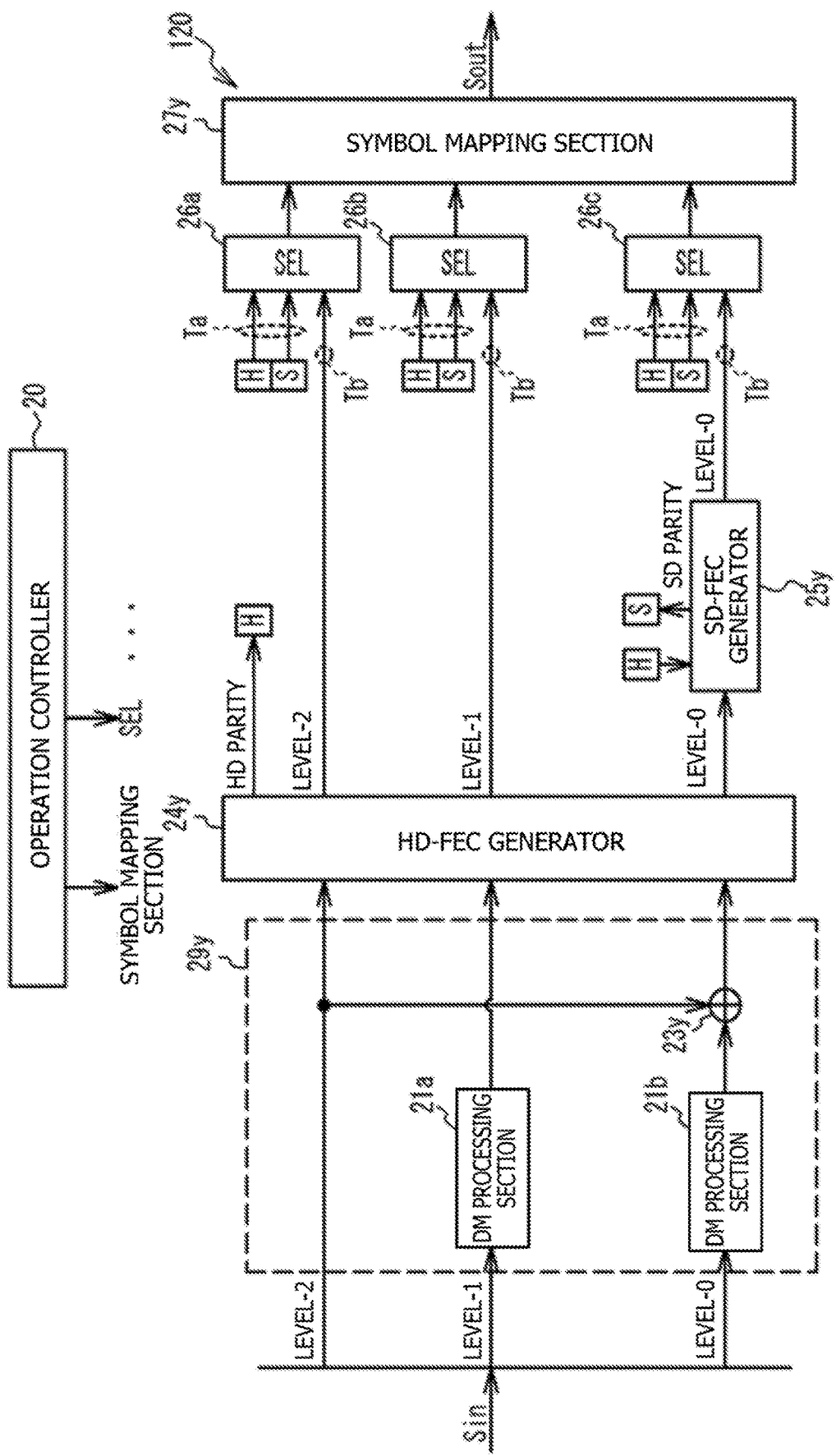
FIG. 19 is a configuration diagram illustrating the encoding circuit according to the third embodiment.

FIG. 19 is a configuration diagram illustrating the encoding circuit 120 according to the third embodiment. Configurations illustrated in FIG. 19 and common to those illustrated in FIGS. 13 and 16 are indicated by the same reference symbols as those illustrated in FIGS. 13 and 16 and will not be described. An encoding method according to the third embodiment is the encoding process to be executed by the encoding circuit 120 described below. Differences from the encoding circuit 120 according to the first embodiment are described below with reference to FIGS. 18 and 19.

The encoding circuit 120 includes an operation controller 20, a PS converter 29y, an HD-FEC generator 24y, an SD-FEC generator 25y, a symbol mapping section 27y, and selectors 26a to 26c. The PS converter 29y includes DM processing sections 21a and 21b and an XOR operator 23y. In this embodiment, 64 QAM is used as multilevel modulation.

The PS converter 29y does not include the selector 22. Thus, the PS converter 29y outputs, to the HD-FEC generator 24y, the bit string of the level 0 that has been subjected to an XOR operation with the bit string of the level 2 in each of the time periods Ta and Tb. This is due to the fact that the HD-FEC parity and the SD-FEC parity are inserted in the bit strings of the levels 0 to 2 in the time period Ta and that whether the XOR operation is executed is not switched.

The selectors 26a to 26c select, as input signals, the SD-FEC parity and the HD-FEC parity and output the input signals to the symbol mapping section 27y in the time period Ta. The selectors 26a to 26c select, as input signals, the data #0 to #2 within the bit strings of the levels 0 to 2, respectively, and output the input signals to the symbol mapping section 27y in the time period Tb. Thus, in the time period Ta, the SD-FEC parity and the HD-FEC parity are inserted in the bit strings of the levels 0 to 2.

In this manner, the SD-FEC generator 25y inserts the SD-FEC parity in the bit strings of the levels 0 to 2 in the time period Ta. The SD-FEC parity is inserted across the three bit strings of the levels 0 to 2. Thus, when the data amount of the SD-FEC parity is fixed, the time period Ta may be reduced, compared to the case where the SD-FEC parity is inserted only in one bit string.

Therefore, according to the foregoing configuration, regions for the data #0 and #1 included in the bit strings of the levels 0 and 1 and to be subjected to the DM process may be increased and noise tolerance may be improved, compared to the first and second embodiments.

Figure 20:
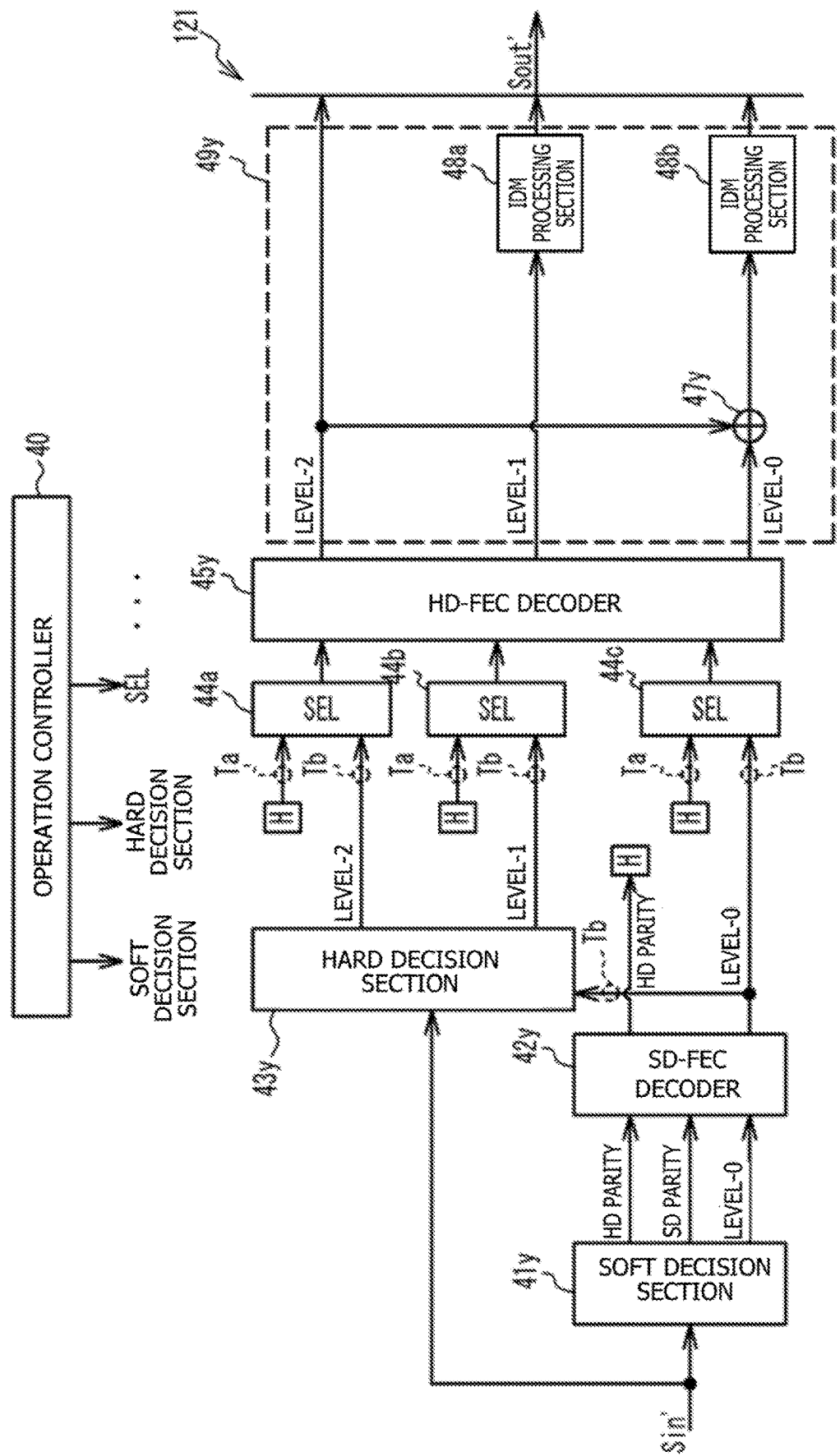
FIG. 20 is a configuration diagram illustrating a decoding circuit according to the third embodiment.

FIG. 20 is a configuration diagram illustrating the decoding circuit 121 according to the third embodiment. Configurations illustrated in FIG. 20 and common to those illustrated in FIG. 14 are indicated by the same reference symbols as those illustrated in FIG. 14 and will not be described. A decoding method according to the first embodiment is the decoding process to be executed by the decoding circuit 121 described below. The decoding circuit 121 is described below with reference to FIGS. 18 and 20.

The decoding circuit 121 includes an operation controller 40, a soft decision section 41y, an SD-FEC decoder 42y, a hard decision section 43y, selectors 44a to 44c, an HD-FEC decoder 45y, and a PS inverse converter 49y. The PS inverse converter 49y includes an XOR operator 47y and IDM processing sections 48a and 48b. Differences from the decoding circuit 121 according to the first embodiment are described below.

The selectors 44a to 44c select output signals to be output to the HD-FEC decoder 45y from the HD-FEC parity and the data #0 to #2 within the bit strings of the levels 0 to 2, respectively. The selectors 44a to 44c select the HD-FEC parity in the time period Ta and select the data #0 to #2 within the bit strings of the levels 0 to 2, respectively, in the time period Tb.

Each of the bit strings of the levels 0 to 2 is decoded by the HD-FEC decoder 45y and output to the PS inverse converter 49y.

The PS inverse converter 49y does not include the selector 46. Thus, the bit string of the level 0 that has been subjected to the XOR operation with the bit string of the level 2 is input to the IDM processing section 48b in the PS inverse converter 49y in each of the time periods Ta and Tb. This is due to the fact that the HD-FEC parity and the SD-FEC parity are inserted in the bit strings of the levels 0 to 2 in the time period Ta and that whether the XOR operation is executed is not switched.

In this manner, the SD-FEC decoder 42y corrects an error of results of the soft decision by the soft decision section 41y based on the SD-FEC parity inserted in the bit strings of the levels 0 to 2. The selectors 44a and 44b select bit strings to be input to the PS inverse converter 49y from a bit string that is included in the bit strings other than the bit string of the level 0 and for which an error of the results of the soft decision has been corrected based on the SD-FEC parity and a bit string that is included in the bit strings other than the bit string of the level 0 and has been subjected to hard decision by the hard decision section 43y.

The selectors 44a and 44b are an example of the selector. The selectors 44a and 44b select bit strings for which errors of results of the soft decision have been corrected based on the SD-FEC parity in the time period Ta in accordance with notification by the operation controller 40. The selectors 44a and 44b select bit strings subjected by the hard decision by the hard decision section 43y in the time period Tb in accordance with notification by the operation controller 40.

Therefore, in each of the bit strings of the levels 0 to 2 that has been inversely converted by the PS inverse converter 49y, a range to be decoded based on the SD-FEC parity is changed based on the frame format according to the time periods Ta and Tb. Accordingly, the decoding circuit 121 that corresponds to the encoding circuit 120 according to the third embodiment may decode each of the bit strings and may reduce consumption power without reducing noise tolerance.

As described above, in the first to third embodiments, each of the SD-FEC generators 25y and 25z generates the SD-FEC parity from the bit string of the level 0 in the time period Tb and inserts the SD-FEC parity in two or more bit strings including the bit string of the level 2 in the time period Ta in accordance with the switching by each of the operation controllers 20 and 20a. Therefore, as described above, the encoding circuit 120 may reduce consumption power without reducing noise tolerance.

The HD-FEC generator 24y generates, from each of the bit strings of the levels 0 to 2, the HD-FEC parity to correct an error of the bit strings of the levels 0 to 2 and inserts the HD-FEC parity in two or more bit strings including the bit string of the level 1 in the time period Ta in accordance with the switching between the time periods Ta and Tb by the operation controller 20. The SD-FEC parity is used to correct an error of results of executing the soft decision on each of the bit strings of the levels 0 to 2. The HD-FEC parity is used to correct an error of results of executing the hard decision on each of the bit strings of the levels 0 to 2.

Therefore, the encoding circuit 120 may use the low power consuming HD-FEC parity to correct an error of regions other than the arithmetic regions for the SD-FEC parity while suppressing an increase in consumption power.

Although 64 QAM is used as the multilevel modulation, the multilevel modulation is not limited to this. An encoding circuit 120 and a decoding circuit 121 that are used when 256 QAM is used as the multilevel modulation are described below embodiment.

Fourth Embodiment

Figure 21:
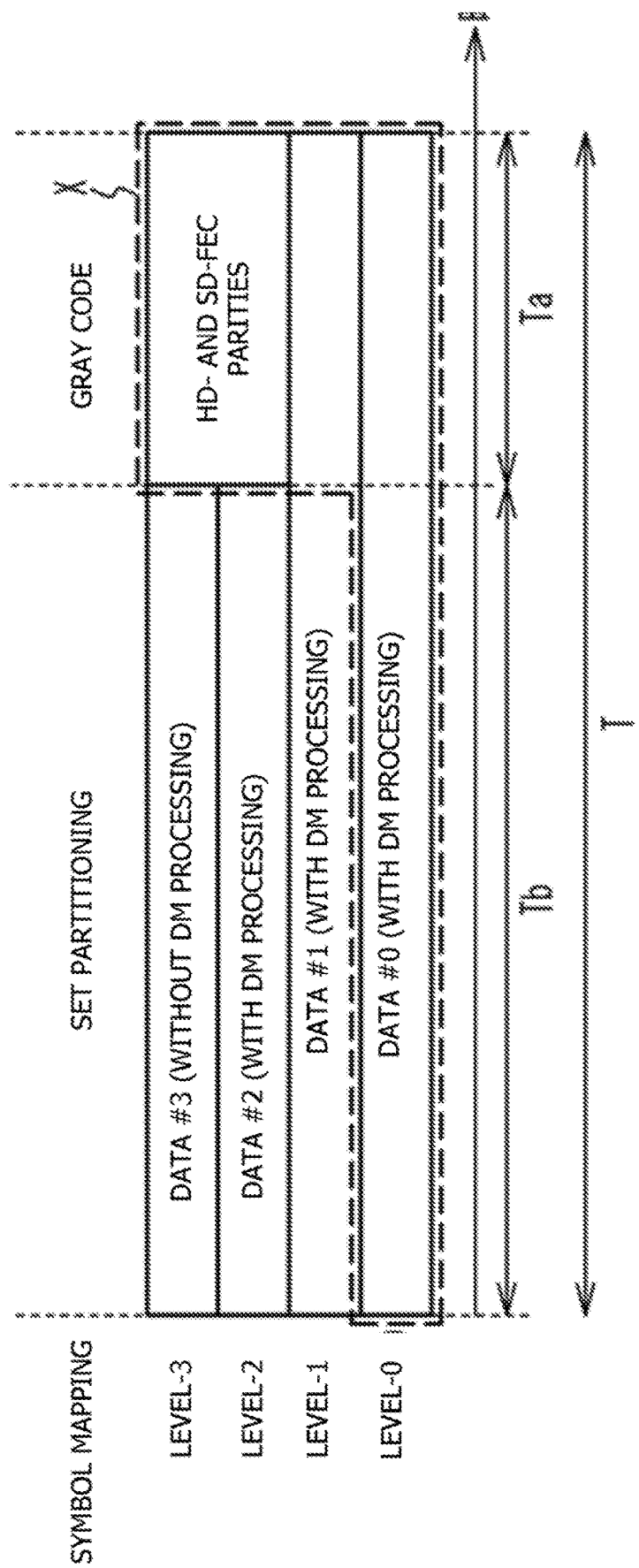
FIG. 21 is a diagram illustrating a frame format of an output signal that is output by an encoding circuit according to a fourth embodiment.

FIG. 21 is a diagram illustrating a frame format of an output signal Sout that is outputted by the encoding circuit 120 according to a fourth embodiment. For 64 QAM, the three bit strings are included in the frame. However, for 256 QAM, four bit strings are included in a frame.

The encoding circuit 120 divides a cycle T of the frame into two time periods Ta and Tb. The encoding circuit 120 uses MLC to generate an SD-FEC parity from the bit string of the level 0 in the time period Tb and inserts the SD-FEC parity in the bit string of the level 2 and a bit string of a level 3 in the time period Ta.

In the time period Tb, the data #0 to #3 is included in the bit strings of the levels 0 to 3, respectively. Since the data #3 of the highest level 3 is used to determine a quadrant of a constellation in symbol mapping, the data #3 is not subjected to the DM process. The data #0 to #2 of the levels 0 to 2 is already subjected to the DM process for the symbol mapping by the PS.

In the time period Tb, the encoding circuit 120 generates the SD-FEC parity from the data #0 within the bit string of the lowest level 0 and executes the symbol mapping based on the set partitioning.

In the time period Ta, the data #0 and #1 subjected to the DM process is included in the bit strings of the levels 0 and 1, respectively, and the SD-FEC parity and an HD-FEC parity are inserted in the bit strings of the levels 2 and 3. The HD-FEC parity is generated from the data #0 to #3 within the bit strings of the levels 0 to 3 in the time period Tb. The HD-FEC parity is generated from the data #0 and #1 within the bit strings of the levels 0 and 1 in the time period Ta. The arrangement form of the SD-FEC parity and the HD-FEC parity is not limited.

In the time period Ta, the encoding circuit 120 generates the SD-FEC parity from the data #0 and #1 within the bit strings of the levels 0 and 1 and the HD-FEC parity within the bit strings of the levels 2 and 3 and executes symbol mapping based on a gray code. The bit string of the level 3 is an example of a first bit string. The bit string of the level 0 is an example of a second bit string.

According to the frame format, as indicated by a reference symbol X, each of the bit strings of the levels 0 to 3 is an arithmetic region for the SD-FEC parity in the time period Ta, and only the bit string of the level 0 is an arithmetic region for the SD-FEC parity in the time period Tb. Thus, power to be consumed for the arithmetic region for the SD-FEC parity is reduced, compared to the case where the entire region is an arithmetic region for the SD-FEC parity, like the BICM frame format illustrated in FIG. 3.

In the time period Ta, the SD-FEC parity is not inserted in the bit string of the level 0 and is inserted across the two bit strings of the levels 2 and 3. Thus, when the data amount of the SD-FEC parity is fixed, the time period Ta may be reduced, compared to the case where the SD-FEC parity is inserted only in one bit string.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 22:
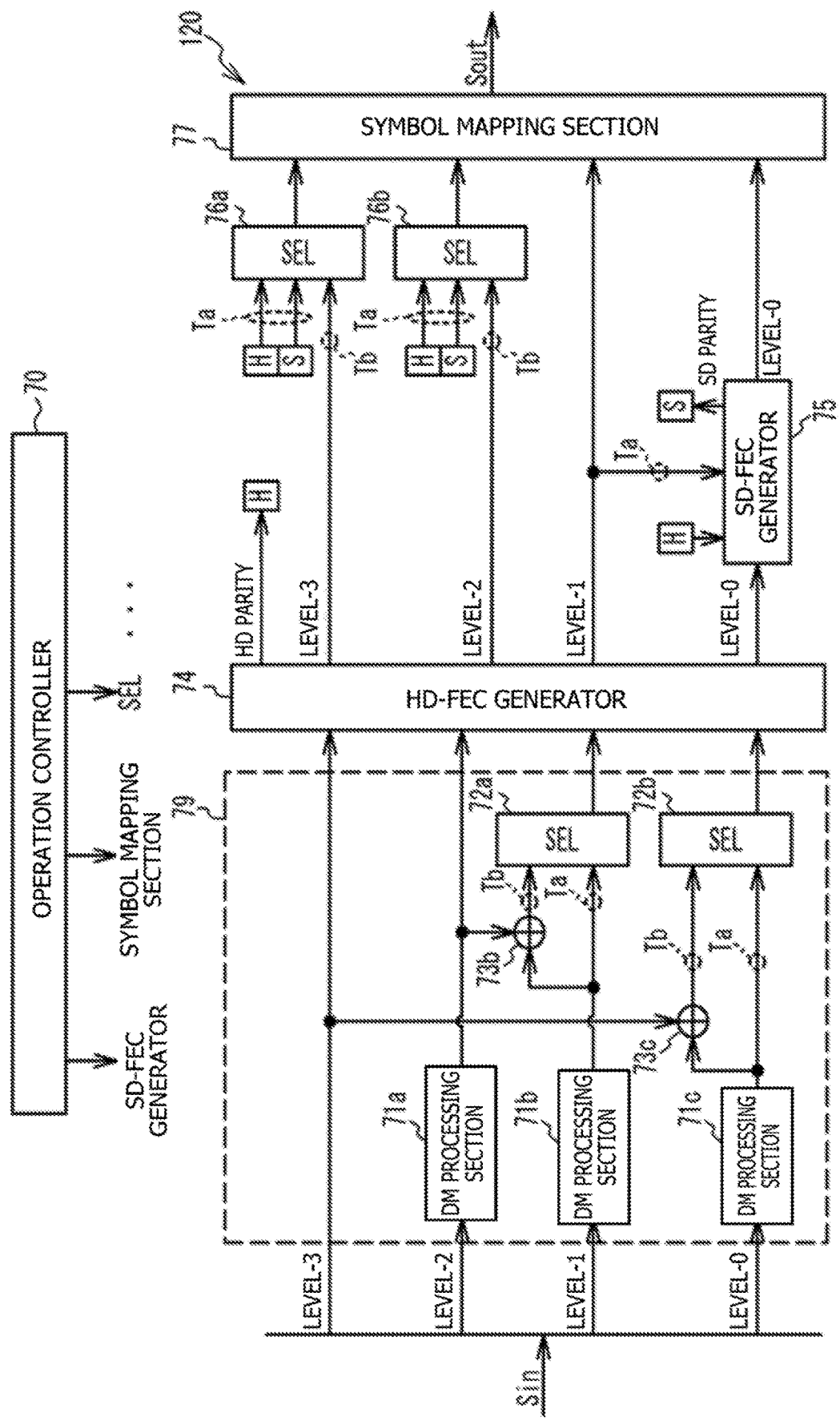
FIG. 22 is a configuration diagram illustrating the encoding circuit according to the fourth embodiment.

FIG. 22 is a configuration diagram illustrating the encoding circuit 120 according to the fourth embodiment. An encoding method according to the fourth embodiment is the encoding process to be executed by the encoding circuit 120 described below. The encoding circuit 120 is described below with reference to FIGS. 21 and 22. In the following description, details related to items common to 64 QAM are omitted.

The encoding circuit 120 includes an operation controller 70, a PS converter 79, an HD-FEC generator 74, an SD-FEC generator 75, a symbol mapping section 77, and selectors 76a and 76b. The PS converter 79 includes DM processing sections 71a to 71c, selectors 72a and 72b, and XOR operators 73b and 73c.

The operation controller 70 is an example of the switching section. In the cycle T of the frame, the operation controller 70 switches between the time period Ta in which the SD-FEC parity is inserted in the bit strings and the time period Tb in which the SD-FEC parity is not inserted in the bit strings. For example, the operation controller 70 controls the SD-FEC generator 75, the symbol mapping section 77, and the selectors 72a, 72b, 76a, and 76b according to the time periods Ta and Tb. The time period Ta is an example of the first time period. The time period Tb is an example of the second time period.

Each of the bit strings of the levels 0 to 2 is input to the PS converter 79. The PS converter 79 is an example of the converter. The PS converter 79 converts values of each of the bit strings of the levels 0 to 2 other than the bit string of the level 3 so that, as a region within the constellation is closer to the center of the constellation, the number of symbols allocated in the region is larger.

The bit strings of the levels 0 to 2 are inputted to the DM processing sections 71c, 71b, and 71a, respectively. The DM processing sections 71c, 71b, and 71a execute the DM process in the same manner as the foregoing DM processing sections 21a and 21b. The bit string of the level 3 is input to the HD-FEC generator 74 and the XOR operator 73c. The bit string of the level 2 with DM processing is inputted to the HD-FEC generator 74 and the XOR operator 73b. The bit string of the level 1 that has been subjected to the DM process is input to the selector 72a and the XOR operator 73b. The bit string of the level 0 with DM processing is inputted to the selector 72b and the XOR operator 73c.

The XOR operator 73b executes an XOR operation on the bit string of the level 1 that has been output from the DM processing section 71b and the bit string of the level 2. The bit string of the level 1 after the XOR operation is inputted to the selector 72a.

The XOR operator 73c executes an XOR operation on the bit string of the level 0 that has been outputted from the DM processing section 71c and the bit string of the level 3. The bit string of the level 0 after the XOR operation is inputted to the selector 72b.

The selector 72a selects a bit string to be output to the HD-FEC generator 74 from the bit string of the level 1 after the XOR operation and the bit string of the level 1 without the XOR operation. The selector 72a selects the bit string of the level 1 without the XOR operation in the time period Ta. The selector 72a selects the bit string of the level 1 after the XOR operation in the time period Tb.

The selector 72b selects a bit string to be outputted to the HD-FEC generator 74 from the bit string of the level 0 after the XOR operation and the bit string of the level 0 without the XOR operation. The selector 72b selects the bit string of the level 0 without the XOR operation in the time period Ta. The selector 72b selects the bit string of the level 0 after the XOR operation in the time period Tb.

The HD-FEC generator 74 is an example of the second inserting section. The HD-FEC generator 74 generates, from each of the bit strings of the levels 0 to 3, the HD-FEC parity to correct an error of the bit strings of the levels 0 to 3 and inserts the HD-FEC parity in the bit strings of the levels 2 and 3 in the time period Ta in accordance with the switching between the time periods Ta and Tb by the operation controller 20.

The HD-FEC generator 74 calculates the HD-FEC parity from the data #0 to #3 of the bit strings of the levels 0 to 3 and outputs the HD-FEC parity to the SD-FEC generator 75 and the selectors 76a and 76b. The HD-FEC generator 74 outputs the input bit strings of the levels 2 and 3 to the selectors 76a and 76b without changing the bit strings of the levels 2 and 3 and outputs the input bit string of the level 1 to the SD-FEC generator 75 and the symbol mapping section 77 without changing the bit string of the level 1. The HD-FEC generator 74 outputs the input bit string of the level 0 to the SD-FEC generator 75 without changing the bit string of the level 0.

The SD-FEC generator 75 is an example of the first inserting section. The SD-FEC generator 75 generates the SD-FEC parity from the bit string of the level 0 in the time period Tb and inserts the SD-FEC parity in the bit strings of the levels 2 and 3 in the time period Ta in accordance with the switching between the time periods Ta and Tb by the operation controller 70. The SD-FEC generator 75 generates the SD-FEC parity from the data #0 and #1 within the bit strings of the levels 0 and 1 and the HD-FEC parity within the bit strings of the levels 2 and 3 in the time period Ta. For example, the SD-FEC parity is calculated from each of the bit strings of the levels 0 to 3 in the time period Ta.

The SD-FEC generator 75 outputs the SD-FEC parity to the selectors 76a and 76b. The SD-FEC generator 75 outputs the input bit string of the level 0 to the symbol mapping section 77 without changing the bit string of the level 0.

The selector 76a selects, as an input signal, the SD-FEC parity and the HD-FEC parity and outputs the input signal to the symbol mapping section 77 in the time period Ta. The selector 76a selects, as an input signal, the data #3 within the bit string of the level 3 and outputs the input signal to the symbol mapping section 77 in the time period Tb. The selector 76b selects, as an input signal, the SD-FEC parity and the HD-FEC parity and outputs the input signal to the symbol mapping section 77 in the time period Ta. The selector 76b selects, as an input signal, the data #2 within the bit string of the level 2 and outputs the input signal to the symbol mapping section 77 in the time period Tb.

Thus, the data #0 to #3 within the bit strings of the levels 0 to 3 is inputted to the symbol mapping section 77 in the time period Tb in accordance with the switching between the time periods Ta and Tb by the operation controller 70. The HD-FEC parity and the SD-FEC parity within the bit strings of the levels 2 and 3 and the data #0 and #1 within the bit strings of the levels 0 and 1 are inputted to the symbol mapping section 77 in the time period Ta in accordance with the switching between the time periods Ta and Tb by the operation controller 70. In this manner, the foregoing frame format is formed.

The symbol mapping section 77 is an example of the allocator. The symbol mapping section 77 allocates, to the bit strings of the levels 0 to 3, symbols that are among a plurality of symbols within the 256-QAM constellation and correspond to the values of the bit strings of the levels 0 to 3. The symbol mapping section 77 switches the symbol mapping to the method based on the set partitioning or the method based on the gray code (refer to FIGS. 6 and 10) according to the time periods Ta and Tb in the cycle T of the frame. Data of the symbol mapping is stored in a memory within the symbol mapping section 77 or the like, for example.

In this manner, in the cycle T of the frame, the operation controller 70 switches between the time period Ta in which the SD-FEC parity is inserted in the bit strings and the time period Tb in which the SD-FEC parity is not inserted in the bit strings. The SD-FEC generator 75 generates the SD-FEC parity from the bit string of the level 0 in the time period Ta and inserts the SD-FEC parity in the bit strings of the levels 2 and 3 other than the bit string of the level 0 in the time period Ta in accordance with the switching between the time periods Ta and Tb by the operation controller 70.

Thus, each of the bit strings of the levels 0 to 3 is an arithmetic region for the SD-FEC parity in the time period Ta, and only the bit string of the level 0 is an arithmetic region for the SD-FEC parity in the time period Tb. Therefore, power to be consumed for the arithmetic regions for the SD-FEC parity is reduced, compared to the case where the entire region is an arithmetic region for the SD-FEC parity, like the BICM frame format illustrated in FIG. 3.

In the time period Ta, the SD-FEC parity is not inserted in the bit strings of the levels 0 and 1 and is inserted across the two bit strings of the levels 2 and 3. Thus, when the data amount of the SD-FEC parity is fixed, the time period Tb may be reduced, compared to the case where the SD-FEC parity is inserted only in one bit string.

Accordingly, the encoding circuit 120 may reduce consumption power without reducing noise tolerance.

Figure 23:
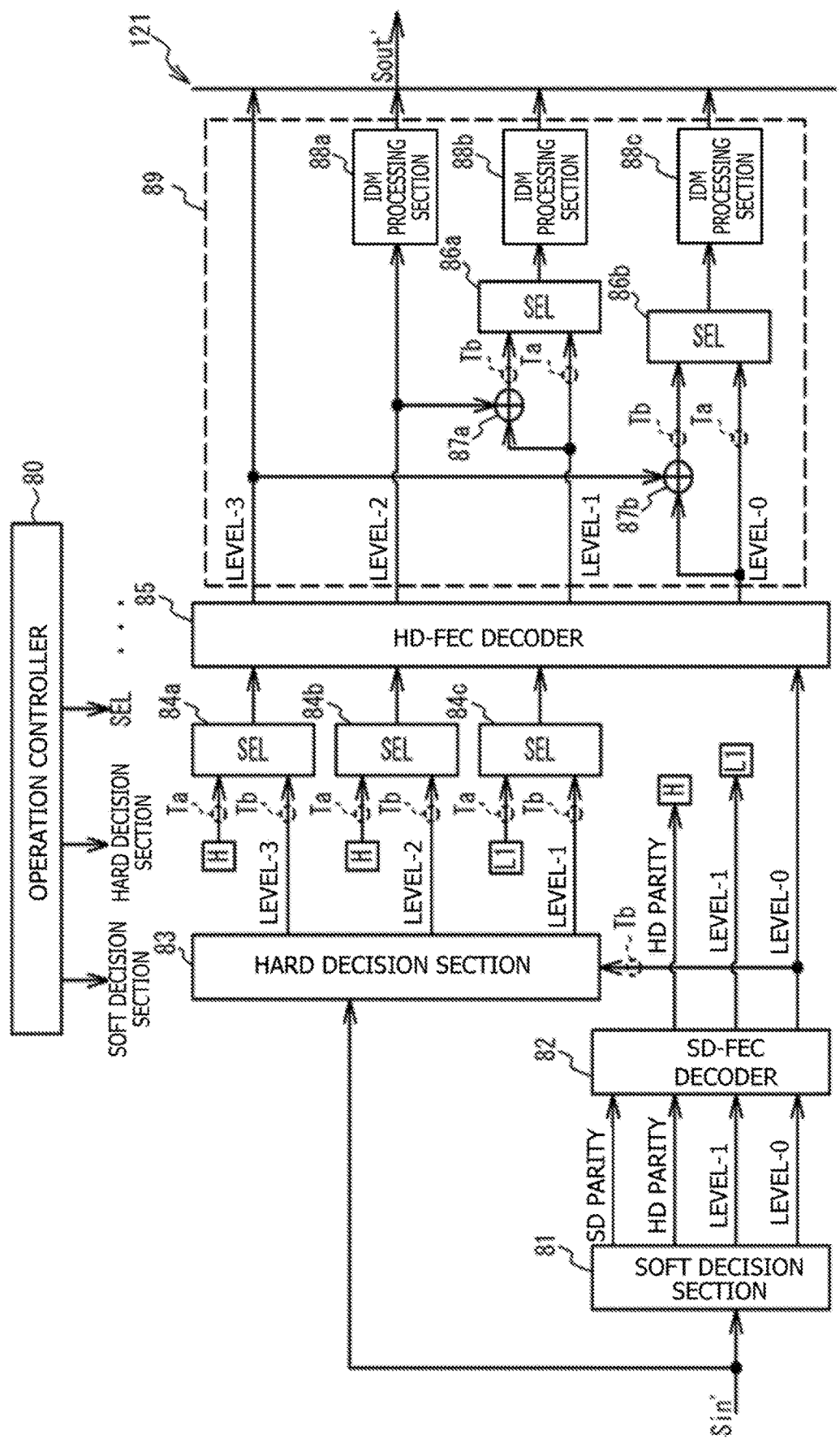
FIG. 23 is a configuration diagram illustrating a decoding circuit according to the fourth embodiment.

FIG. 23 is a configuration diagram illustrating the decoding circuit 121 according to the fourth embodiment. A decoding method according to the present embodiment is the decoding process to be executed by the decoding circuit 121 described below. The decoding circuit 121 is described below with reference to FIGS. 21 and 23.

The decoding circuit 121 includes an operation controller 80, a soft decision section 81, an SD-FEC decoder 82, a hard decision section 83, selectors 84a to 84c, an HD-FEC decoder 85, and a PS inverse converter 89. The PS inverse converter 89 includes selectors 86a and 86b, XOR operators 87a and 87b, and IDM processing sections 88a to 88c.

The operation controller 80 is an example of the notifying section. For example, the operation controller 80 notifies, in accordance with synchronization information of the frame, the selectors 84a to 84c, the soft decision section 81, and the hard decision section 83 of the time period Ta in which the SD-FEC parity is inserted in the bit strings and the time period Tb in which the SD-FEC parity is not inserted in the bit strings. The selectors 84a to 84c, 86a, and 86b select input signals in accordance with the notification of the time periods Ta and Tb. The soft decision section 81 and the hard decision section 83 switch symbol demapping to a method based on the set partitioning or a method based on the gray code in accordance with the notification of the time periods Ta and Tb.

An input signal Sin' is inputted from the analog-digital converter 13 to the soft decision section 81 and the hard decision section 83.

The soft decision section 81 is an example of the first deciding section. The soft decision section 81 executes, based on a symbol, soft decision on each of the values of the bit strings of the levels 0 to 3 within the frame to which the symbol within the 256-QAM constellation is allocated. The soft decision section 81 extracts the HD-FEC parity and the SD-FEC parity from each of the bit strings of the levels 2 and 3 based on the results of the soft decision and outputs the HD-FEC parity and the SD-FEC parity to the SD-FEC decoder 82. The soft decision section 81 outputs the bit strings of the levels 0 and 1 to the SD-FEC decoder 82 based on the results of the soft decision.

The SD-FEC decoder 82 is an example of the corrector. The SD-FEC decoder 82 corrects an error of the results of the decision by the soft decision section 81 based on the SD-FEC parity inserted in the bit strings of the levels 2 and 3 in the time period Ta within the cycle T of the frame. For example, the SD-FEC decoder 82 decodes the bit strings of the levels 0 to 3 based on the SD-FEC parity.

The bit string of the level 0 is inputted from the SD-FEC decoder 82 to the hard decision section 83 and the HD-FEC decoder 85. The HD-FEC parity is inputted from the SD-FEC decoder 82 to the selectors 84a and 84b. The bit string of the level 1 is inputted from the SD-FEC decoder 82 to the selector 84c.

The hard decision section 83 is an example of the second deciding section. The hard decision section 83 executes hard decision on the values of each of the bit strings of the levels 1 to 3 other than the bit string of the level 0 among the bit strings of the levels 0 to 3, while symbols within the 256-QAM constellation are allocated to the bit strings of the levels 0 to 3. For example, in the time period Tb, for the hard decision, the hard decision section 83 uses the bit string of the level 0 that has been input from the SD-FEC decoder 82. The bit strings of the levels 1 to 3 are inputted from the hard decision section 83 to the selectors 84c, 84b, and 84a, respectively.

The selector 84a selects an output signal to be outputted to the HD-FEC decoder 85 from the HD-FEC parity and the data #3 within the bit string of the level 3. The selector 84a selects the HD-FEC parity in the time period Ta and selects the data #3 within the bit string of the level 3 in the time period Tb.

The selector 84b selects an output signal to be outputted to the HD-FEC decoder 85 from the HD-FEC parity and the data #2 within the bit string of the level 2. The selector 84b selects the HD-FEC parity in the time period Ta and selects the data #2 within the bit string of the level 2 in the time period Tb.

The selector 84c selects an output signal to be outputted to the HD-FEC decoder 85 from the data #1 included in the bit string of the level 1 that has been subjected to the soft decision and the data #1 included in the bit string of the level 1 that has been subjected to the hard decision. In the time period Ta, the selector 84c selects the bit string of the level 1 that has been subjected to the hard decision. In the time period Tb, the selector 84c selects the bit string of the level 1 that has been subjected to the soft decision.

The HD-FEC decoder 85 uses the HD-FEC parity to execute error correction on the values of each of the bit strings of the levels 0 to 3. For example, the HD-FEC decoder 85 decodes each of the bit strings of the levels 0 to 3 based on the HD-FEC parity.

The HD-FEC decoder 85 decodes the data #0 to #2 of the bit strings of the levels 0 to 3 in the time period Tb and decodes the data #0 and #1 of the bit strings of the levels 0 and 1 in the time period Ta. In this case, the HD-FEC decoder 85 maintains an error correction ability by executing the multilevel decoding. The HD-FEC decoder 85 outputs each of the bit strings of the levels 0 to 3 to the PS inverse converter 89.

The PS inverse converter 89 is an example of the inverse converter. The PS inverse converter 89 inversely converts the values of the bit strings of the levels 0 to 2 that have been converted by the DM process and exclude the bit string of the level 3. The bit string of the level 3 is inputted to the XOR operator 87b. The bit string of the level 2 is inputted to the XOR operator 87a and the IDM processing section 88a. The bit string of the level 1 is inputted to the XOR operator 87a and the selector 86a. The bit string of the level 0 is inputted to the XOR operator 87b and the selector 86b.

The XOR operator 87a executes an XOR operation on the bit string of the level 2 and the bit string of the level 1. The bit string of the level 1 after the XOR operation is inputted to the selector 86a.

The XOR operator 87b executes an XOR operation on the bit string of the level 3 and the bit string of the level 1. The bit string of the level 1 after the XOR operation is inputted to the selector 86b.

The selector 86a selects a bit string to be outputted to the IDM processing section 88b from the bit string of the level 1 after the XOR operation and the bit string of the level 1 before the XOR operation. The selector 46 selects the bit string of the level 1 after the XOR operation in the time period Tb and selects the bit string of the level 1 before the XOR operation in the time period Ta. Thus, the values of the bit string of the level 1 that have been subjected to the XOR operation by the XOR operator 73b of the encoding circuit 120 are restored to the values before the XOR operation. The selected bit string of the level 1 is inputted from the selector 86a to the IDM processing section 88b.

The selector 86b selects a bit string to be outputted to the IDM processing section 88c from the bit string of the level 0 after the XOR operation and the bit string of the level 0 before the XOR operation. The selector 86b selects the bit string of the level 0 after the XOR operation in the time period Tb and selects the bit string of the level 0 before the XOR operation in the time period Ta. Thus, the values of the bit string of the level 0 that have been subjected to the XOR operation by the XOR operator 73c of the encoding circuit 120 are restored to the values before the XOR operation. The selected bit string of the level 0 is inputted from the selector 86b to the IDM processing section 88c. The bit string of the level 2 is input to the IDM processing section 88a.

The IDM processing sections 88a to 88c execute an inverse-DM process on the bit strings of the levels 2, 1, and 0, like the foregoing IDM processing sections 48a and 48b. The bit strings of the levels 0 to 2 that have been subjected to the inverse-DM process and the bit string of the level 3 are output as an output signal Sout to the framer chip 11 via parallel-serial conversion.

As described above, the selectors 84a to 84c select bit strings for which errors of results of the soft decision have been corrected based on the SD-FEC parity in the time period Ta in accordance with notification by the operation controller 40. The selectors 84a to 84c select bit strings subjected to the hard decision by the hard decision section 43y in the time period Tb in accordance with the notification by the operation controller 40. Each of the selectors 84a to 84c is an example of the selector.

Therefore, in each of the bit strings of the levels 0 to 3 that has been inversely converted by the PS inverse converter 89, a range to be decoded based on the SD-FEC parity is changed based on the frame format according to the time periods Ta and Tb. Accordingly, the decoding circuit 121 that corresponds to the encoding circuit 120 according to the fourth embodiment may decode each of the bit strings and may reduce consumption power without reducing noise tolerance.

Fifth Embodiment

Figure 24:
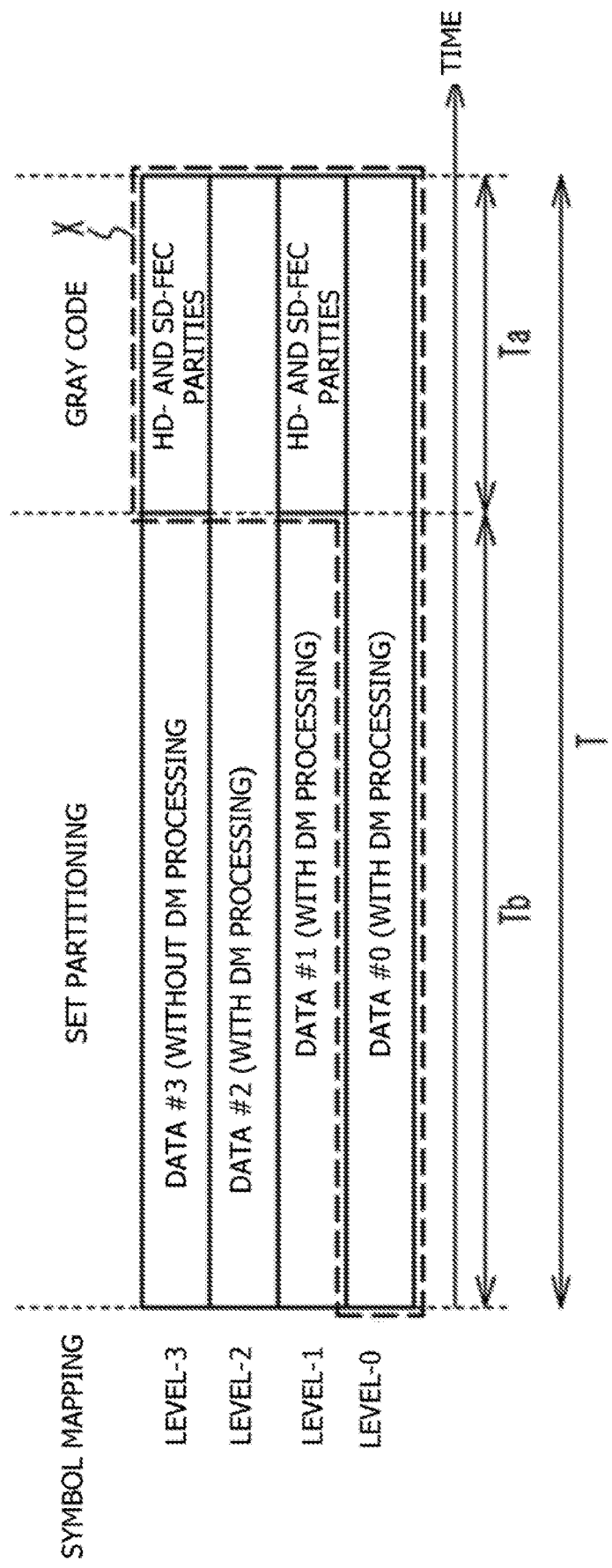
FIG. 24 is a diagram illustrating a frame format of an output signal that is output by an encoding circuit according to a fifth embodiment.

FIG. 24 is a diagram illustrating a frame format of an output signal Sout that is outputted by an encoding circuit 120 according to a fifth embodiment. A configuration in the frame format according to the present embodiment in the time period Ta is different from that described in the fourth embodiment. In the time period Ta, an HD-FEC parity and an SD-FEC parity are included in the bit string of the level 1 and the bit string of the level 3. The arrangement form of the SD-FEC parity and the HD-FEC parity is not limited.

In the time period Ta, the data #0 and #2 is included in the bit strings of the levels 0 and 2, respectively. In the time period Ta, the SD-FEC parity is generated from the data #0 and #2 within the bit strings of the levels 0 and 2 and the HD-FEC parity within the bit strings of the levels 1 and 3. In the time period Tb, the SD-FEC parity is generated from the data #0 within the bit string of the level 0.

According to the frame format, as indicated by a reference symbol X, each of the bit strings of the levels 0 to 3 is an arithmetic region for the SD-FEC parity in the time period Ta, and only the bit string of the level 0 is an arithmetic region for the SD-FEC parity in the time period Tb. In the time period Ta, the SD-FEC parity is not inserted in the bit string of the level 1 and is inserted across the two bit strings of the levels 0 and 2.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 25:
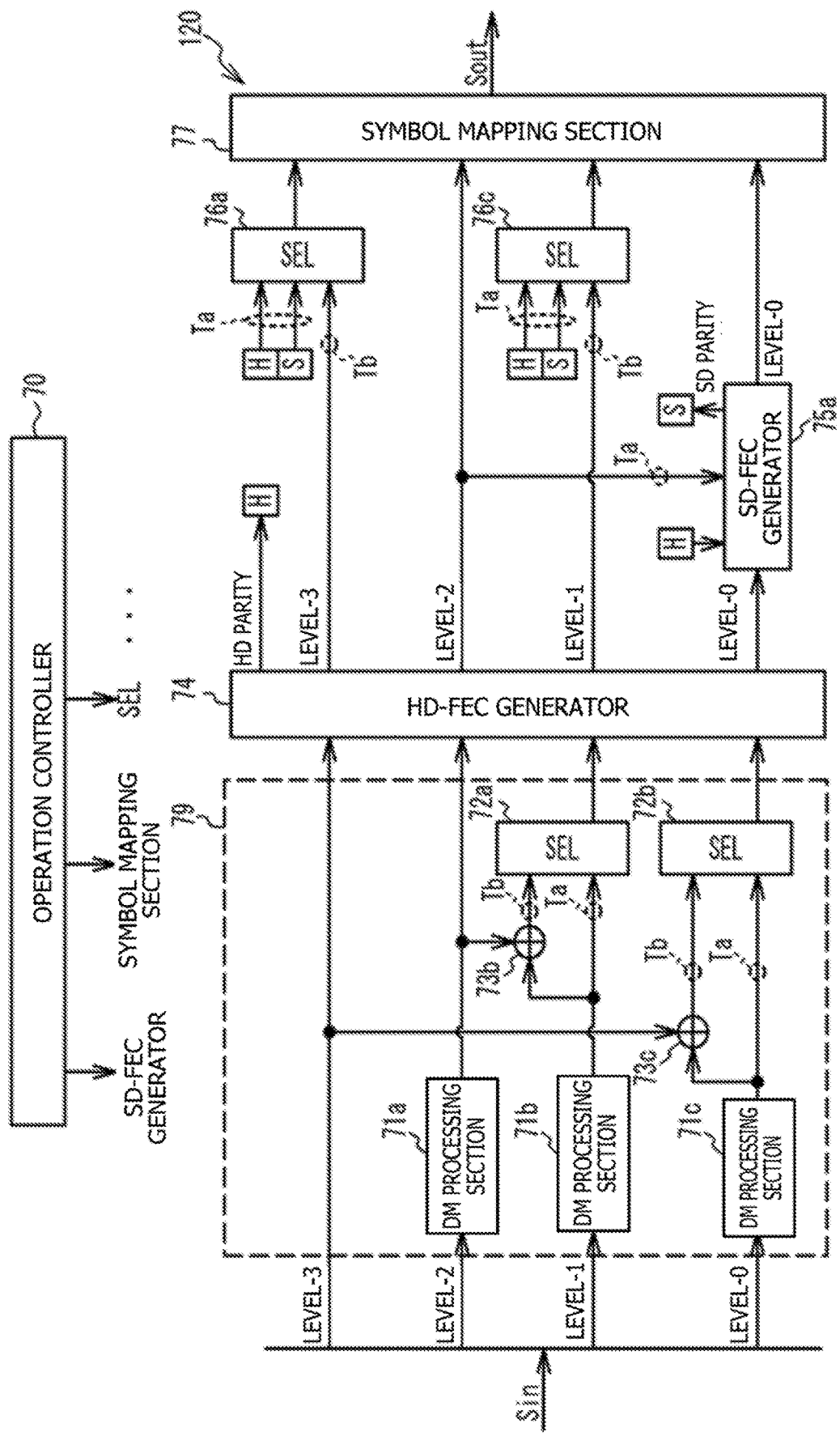
FIG. 25 is a configuration diagram illustrating the encoding circuit according to the fifth embodiment.

FIG. 25 is a configuration diagram illustrating the encoding circuit 120 according to the fifth embodiment. Configurations illustrated in FIG. 25 and common to those illustrated in FIG. 22 are indicated by the same reference symbols as those illustrated in FIG. 22 and will not be described. An encoding method according to the fifth embodiment is the encoding process to be executed by the encoding circuit 120 described below. Differences from the encoding circuit 120 according to the fourth embodiment are described below with reference to FIGS. 24 and 25.

The encoding circuit 120 includes an operation controller 70, a PS converter 79, an HD-FEC generator 74, an SD-FEC generator 75a, a symbol mapping section 77, and selectors 76a and 76b. The PS converter 79 includes DM processing sections 71a to 71c, selectors 72a and 72b, and XOR operators 73b and 73c.

The HD-FEC generator 74 calculates the HD-FEC parity from the data #0 and #3 of the bit strings of the levels 0 to 3 and outputs the HD-FEC parity to the SD-FEC generator 75a and the selectors 76a and 76c. The HD-FEC generator 74 outputs the input bit strings of the levels 3 and 1 to the selectors 76a and 76c without changing the bit strings of the levels 3 and 1 and outputs the input bit string of the level 2 to the SD-FEC generator 75a and the symbol mapping section 77 without changing the bit string of the level 2. The HD-FEC generator 74 outputs the input bit string of the level 0 to the SD-FEC generator 75a without changing the bit string of the level 0.

The SD-FEC generator 75a is an example of the first inserting section. The SD-FEC generator 75a generates the SD-FEC parity from the bit string of the level 0 in the time period Tb and inserts the SD-FEC parity in the bit strings of the levels 1 and 3 in the time period Ta in accordance with the switching between the time periods Ta and Tb by the operation controller 70. The SD-FEC generator 75a generates the SD-FEC parity from the data #0 and #2 within the bit strings of the levels 0 and 2 and the HD-FEC parity within the bit strings of the levels 1 and 3 in the time period Ta. The SD-FEC generator 75a generates the SD-FEC parity from the data #0 and #2 within the bit strings of the levels 0 and 2 in the time period Tb.

The SD-FEC generator 75a outputs the SD-FEC parity to the selectors 76a and 76c. The SD-FEC generator 75a outputs the input bit string of the level 0 to the symbol mapping section 77 without changing the bit string of the level 0.

The selector 76c selects, as an input signal, the SD-FEC parity and the HD-FEC parity and outputs the input signal to the symbol mapping section 77 in the time period Ta. The selector 76c selects, as an input signal, the data #1 within the bit string of the level 1 and outputs the input signal to the symbol mapping section 77 in the time period Tb.

Thus, the data #0 to #3 within the bit strings of the levels 0 to 3 is inputted to the symbol mapping section 77 in the time period Tb in accordance with the switching between the time periods Ta and Tb by the operation controller 70. The HD-FEC parity and the SD-FEC parity within the bit strings of the levels 1 and 3 and the data #0 and #2 within the bit strings of the levels 0 and 2 are input to the symbol mapping section 77 in the time period Ta in accordance with the switching between the time periods Ta and Tb by the operation controller 70. In this manner, the foregoing frame format is formed.

According to the foregoing configuration, the encoding circuit 120 may reduce consumption power without reducing noise tolerance.

Figure 26:
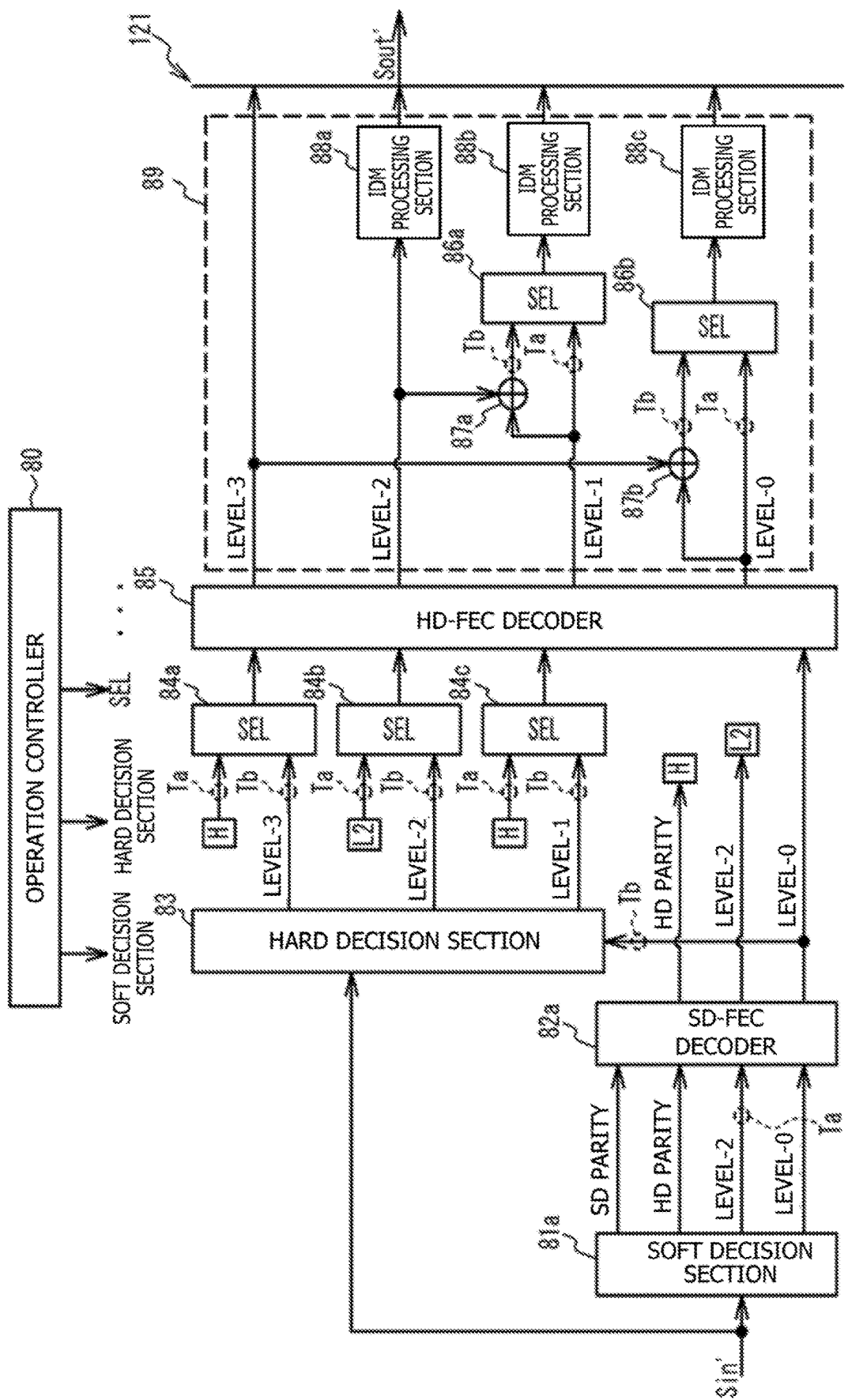
FIG. 26 is a configuration diagram illustrating a decoding circuit according to the fifth embodiment.

FIG. 26 is a configuration diagram illustrating the decoding circuit 121 according to the fifth embodiment. Configurations illustrated in FIG. 26 and common to those illustrated in FIG. 23 are indicated by the same reference symbols as those illustrated in FIG. 23 and will not be described. A decoding method according to the present embodiment is the decoding process to be executed by the decoding circuit 121 described below. Differences from the decoding circuit 121 according to the fourth embodiment are described below with reference to FIGS. 24 and 26.

In FIG. 26, "L2s" surrounded by squares indicate a coupling relationship between output and input of the data #2 of the bit string of the level 2. This expression is used in FIG. 27 and later.

The decoding circuit 121 includes an operation controller 80, a soft decision section 81a, an SD-FEC decoder 82a, a hard decision section 83, selectors 84a to 84c, an HD-FEC decoder 85, and a PS inverse converter 89. The PS inverse converter 89 includes selectors 86a and 86b, XOR operators 87a and 87b, and IDM processing sections 88a to 88c.

An input signal Sin' is inputted from the analog-digital converter 13 to the soft decision section 81a and the hard decision section 83.

The soft decision section 81a is an example of the first deciding section. The soft decision section 81a executes, based on a symbol, soft decision on each of the values of the bit strings of the levels 0 to 3 within the frame to which the symbol within the 256-QAM constellation is allocated. The soft decision section 81a extracts the HD-FEC parity and the SD-FEC parity from each of the bit strings of the levels 1 and 3 based on the results of the soft decision and outputs the HD-FEC parity and the SD-FEC parity to the SD-FEC decoder 82a. The soft decision section 81a outputs the bit strings of the levels 0 and 2 to the SD-FEC decoder 82a based on the results of the soft decision.

The SD-FEC decoder 82a is an example of the corrector. The SD-FEC decoder 82a corrects an error of the results of the decision by the soft decision section 81a based on the SD-FEC parity inserted in the bit strings of the levels 1 and 3 in the time period Ta within the cycle T of the frame. The SD-FEC decoder 82a corrects the values of the bit string of the level 0 in the time period Tb. The SD-FEC decoder 82a acquires the bit string of the level 1 from the soft decision section 81a and corrects the values of each of the bit strings of the levels 0 and 1 in the time period Ta.

The SD-FEC decoder 82a outputs the bit string of the level 2 to the selector 84b in the time period Ta. The SD-FEC decoder 82a outputs the HD-FEC parity to the selectors 84a and 84b and outputs the bit string of the level 0 to the hard decision section 83 and the HD-FEC decoder 85.

The selector 84b selects an output signal to be output to the HD-FEC decoder 85 from the data #2 included in the bit string of the level 2 that has been subjected to the soft decision and the data #2 included in the bit string of the level 2 that has been subjected to the hard decision. In the time period Tb, the selector 84b selects the bit string of the level 2 that has been subjected to the hard decision. In the time period Ta, the selector 84b selects the bit string of the level 2 that has been subjected to the soft decision.

The selector 84c selects an output signal to be output to the HD-FEC decoder 85 from the HD-FEC parity and the data #1 within the bit string of the level 1. The selector 84c selects the HD-FEC parity in the time period Ta and selects the bit string of the level 1 in the time period Tb.

The HD-FEC decoder 85 decodes the data #0 to #3 of the bit strings of the levels 0 to 3 in the time period Tb and decodes the data #0 and #2 within the bit strings of the levels 0 and 2 in the time period Ta.

As described above, the selectors 84a to 84c select bit strings for which errors of the results of the soft decision have been corrected based on the SD-FEC parity in the time period Ta in accordance with notification by the operation controller 40. The selectors 84a to 84c select bit strings subjected to the hard decision by the hard decision section 83 in the time period Tb in accordance with the notification by the operation controller 40. Therefore, effects that are the same as or similar to those obtained in the fourth embodiment are obtained.

Sixth Embodiment

Figure 27:
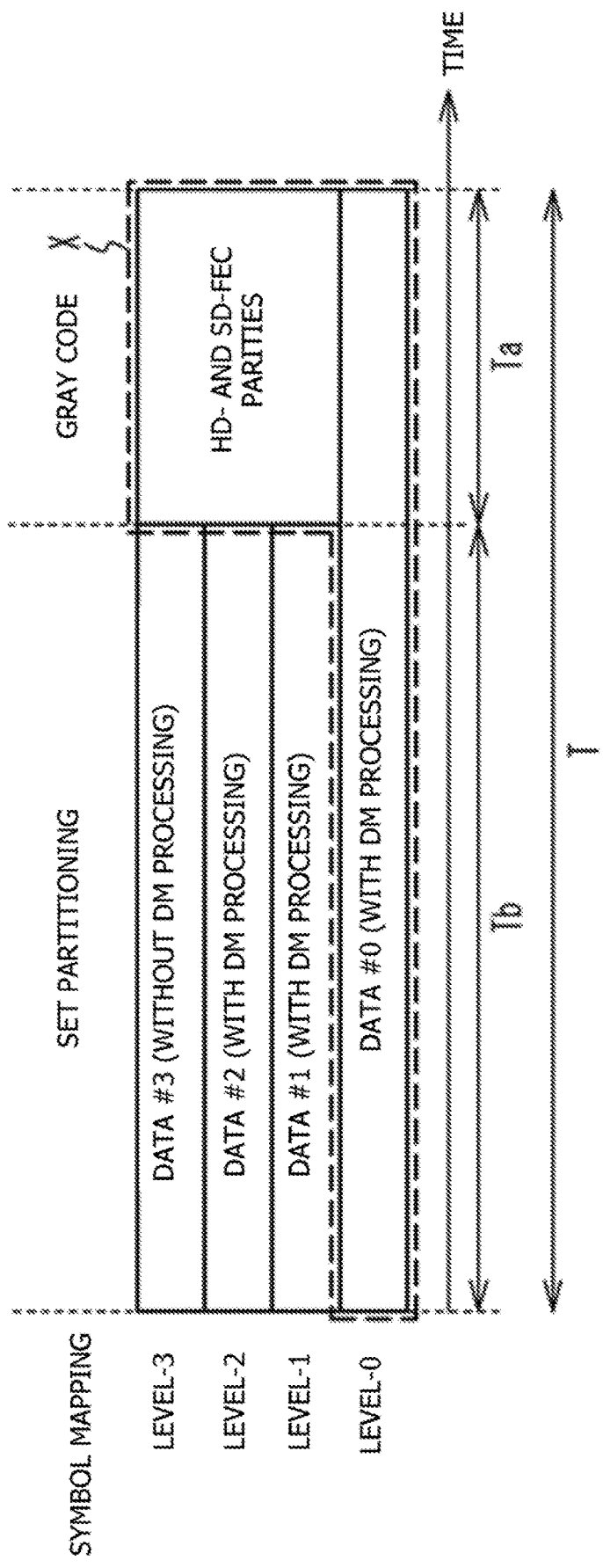
FIG. 27 is a diagram illustrating a frame format of an output signal that is output by an encoding circuit according to a sixth embodiment.

FIG. 27 is a diagram illustrating a frame format of an output signal Sout that is output by an encoding circuit 120 according to a sixth embodiment. A configuration in the frame format according to the present embodiment in the time period Ta is different from that described in the fourth embodiment. In the time period Ta, an HD-FEC parity and an SD-FEC parity are included in the bit string of the level 1, the bit string of the level 2, and the bit string of the level 3. The arrangement form of the SD-FEC parity and the HD-FEC parity is not limited.

In the time period Ta, the data #0 is included in the bit string of the level 0. In the time period Ta, the SD-FEC parity is generated from the data #0 within the bit string of the level 0 and the HD-FEC parity within the bit strings of the levels 1 to 3. In the time period Tb, the SD-FEC parity is generated from the data #0 within the bit string of the level 0.

According to the frame format, as indicated by a reference symbol X, each of the bit strings of the levels 0 to 3 is an arithmetic region for the SD-FEC parity in the time period Ta, and only the bit string of the level 0 is an arithmetic region for the SD-FEC parity in the time period Tb. In the time period Ta, the SD-FEC parity is not inserted in the bit string of the level 0 and is inserted across the three bit strings of the levels 1 to 3.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 28:
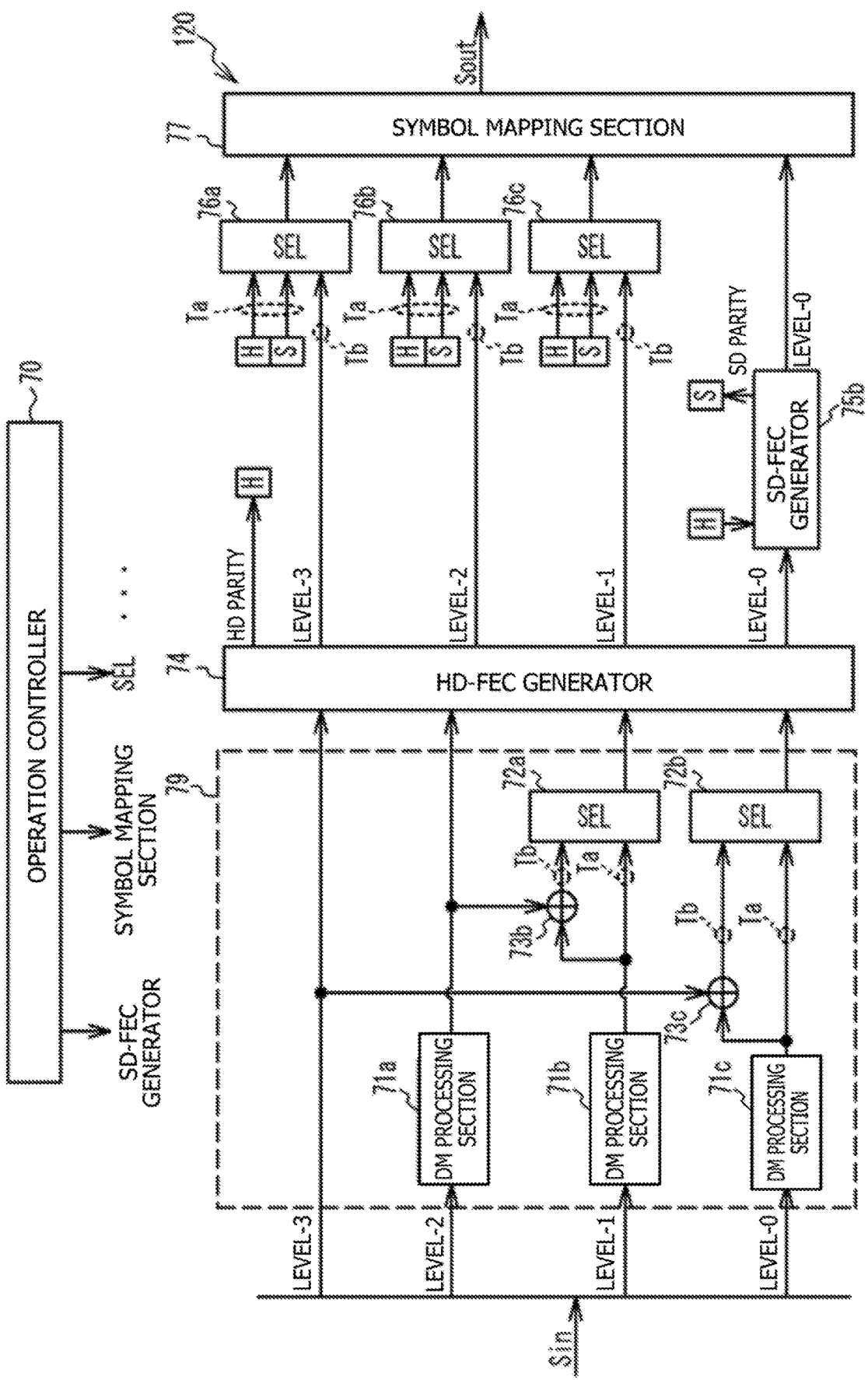
FIG. 28 is a configuration diagram illustrating the encoding circuit according to the sixth embodiment.

FIG. 28 is a configuration diagram illustrating the encoding circuit 120 according to the sixth embodiment. Configurations illustrated in FIG. 28 and common to those illustrated in FIGS. 22 and 25 are indicated by the same reference symbols as those illustrated in FIGS. 22 and 25 and will not be described. An encoding method according to the sixth embodiment is the encoding process to be executed by the encoding circuit 120 described below. Differences from the encoding circuit 120 according to the fourth embodiment are described below with reference to FIGS. 27 and 28.

The encoding circuit 120 includes an operation controller 70, a PS converter 79, an HD-FEC generator 74, an SD-FEC generator 75b, a symbol mapping section 77, and selectors 76a to 76c. The PS converter 79 includes DM processing sections 71a to 71c, selectors 72a and 72b, and XOR operators 73b and 73c.

The HD-FEC generator 74 calculates the HD-FEC parity from the data #0 to #3 of the bit strings of the levels 0 to 3 and outputs the HD-FEC parity to the SD-FEC generator 75b and the selectors 76a to 76c. The HD-FEC generator 74 outputs the input bit strings of the levels 1 to 3 to the selectors 76a to 76c without changing the bit strings of the levels 1 to 3.

The SD-FEC generator 75b is an example of the first inserting section. The SD-FEC generator 75b generates the SD-FEC parity from the bit string of the level 0 in the time period Tb and inserts the SD-FEC parity in the bit strings of the levels 1 to 3 in the time period Ta in accordance with the switching between the time periods Ta and Tb by the operation controller 70. The SD-FEC generator 75b generates the SD-FEC parity from the data #0 within the bit string of the level 0 and the HD-FEC parity within the bit strings of the levels 1 to 3 in the time period Ta.

The SD-FEC generator 75b outputs the SD-FEC parity to the selectors 76a to 76c. The SD-FEC generator 75b outputs the input bit string of the level 0 to the symbol mapping section 77 without changing the bit string of the level 0.

The selector 76c selects, as an input signal, the SD-FEC parity and the HD-FEC parity and outputs the input signal to the symbol mapping section 77 in the time period Ta. The selector 76c selects, as an input signal, the data #1 within the bit string of the level 1 and outputs the input signal to the symbol mapping section 77 in the time period Tb.

Thus, the data #0 to #3 within the bit strings of the levels 0 to 3 is input to the symbol mapping section 77 in the time period Tb in accordance with the switching between the time periods Ta and Tb by the operation controller 70. The HD-FEC parity and the SD-FEC parity within the bit strings of the levels 1 to 3 and the data #0 within the bit string of the level 0 are input to the symbol mapping section 77 in the time period Ta in accordance with the switching between the time periods Ta and Tb by the operation controller 70. In this manner, the foregoing frame format is formed.

According to the foregoing configuration, the encoding circuit 120 may reduce consumption power without reducing noise tolerance.

Figure 29:
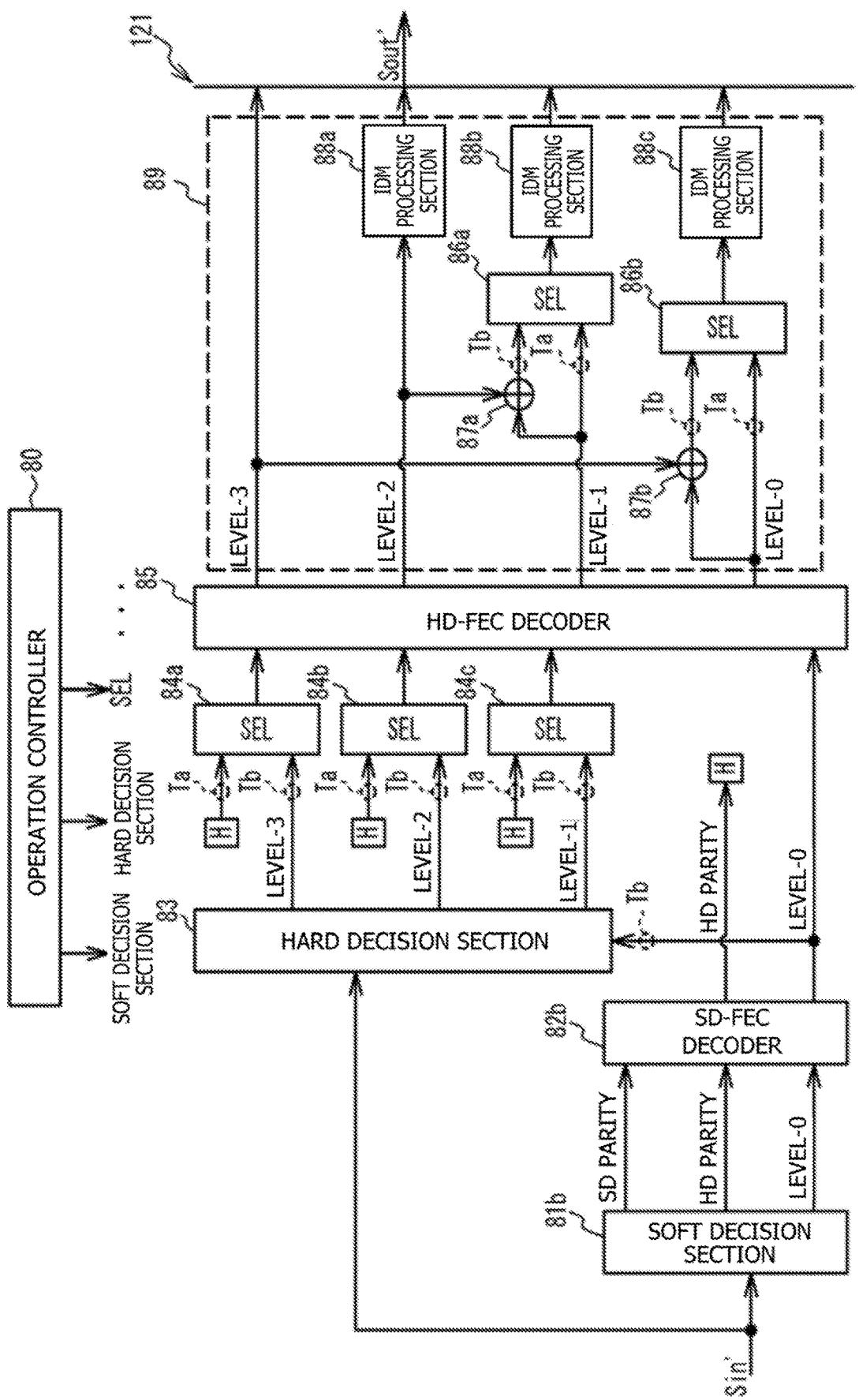
FIG. 29 is a configuration diagram illustrating a decoding circuit according to the sixth embodiment.

FIG. 29 is a configuration diagram illustrating the decoding circuit 121 according to the sixth embodiment. Configurations illustrated in FIG. 29 and common to those illustrated in FIGS. 23 and 26 are indicated by the same reference symbols as those illustrated in FIGS. 23 and 26 and will not be described. A decoding method according to the present embodiment is the decoding process to be executed by the decoding circuit 121 described below. Differences from the decoding circuit 121 according to the fourth embodiment are described below with reference to FIGS. 27 and 29.

The decoding circuit 121 includes an operation controller 80, a soft decision section 81b, an SD-FEC decoder 82b, a hard decision section 83, selectors 84a to 84c, an HD-FEC decoder 85, and a PS inverse converter 89. The PS inverse converter 89 includes selectors 86a and 86b, XOR operators 87a and 87b, and IDM processing sections 88a to 88c.

An input signal Sin' is input from the analog-digital converter 13 to the soft decision section 81b and the hard decision section 83.

The soft decision section 81b is an example of the first deciding section. The soft decision section 81b executes, based on a symbol, soft decision on each of the values of the bit strings of the levels 0 to 3 within the frame to which the symbol within the 256-QAM constellation is allocated. The soft decision section 81b extracts the HD-FEC parity and the SD-FEC parity from each of the bit strings of the levels 1 to 3 based on the results of the soft decision and outputs the HD-FEC parity and the SD-FEC parity to the SD-FEC decoder 82b. The soft decision section 81b outputs the bit string of the level 0 to the SD-FEC decoder 82b based on the results of the soft decision.

The SD-FEC decoder 82b is an example of the corrector. The SD-FEC decoder 82b corrects an error of the results of the decision by the soft decision section 81b based on the SD-FEC parity inserted in the bit strings of the levels 1 to 3 in the time period Ta within the cycle T of the frame. The SD-FEC decoder 82b corrects the values of the bit string of the level 0 in the time period Tb and corrects the values of the bit strings of the levels 0 to 3 in the time period Ta.

The SD-FEC decoder 82b outputs the HD-FEC parity to the selectors 84a to 84c and outputs the bit string of the level 0 to the hard decision section 83 and the HD-FEC decoder 85.

The selector 84c selects an output signal to be output to the HD-FEC decoder 85 from the HD-FEC parity and the data #1 within the bit string of the level 1. The selector 84c selects the HD-FEC parity in the time period Ta and selects the bit string of the level 1 in the time period Tb.

The HD-FEC decoder 85 decodes the data #0 to #3 of the bit strings of the levels 0 to 3 based on the HD-FEC parity in the time period Tb and decodes the data #0 within the bit string of the level 0 based on the HD-FEC parity in the time period Ta.

As described above, the selectors 84a to 84c select bit strings for which errors of results of the soft decision have been corrected based on the SD-FEC parity in the time period Ta in accordance with notification by the operation controller 40. The selectors 84a to 84c select bit strings subjected to the hard decision by the hard decision section 83 in the time period Tb in accordance with the notification by the operation controller 40. Therefore, effects that are the same as or similar to those obtained in the fourth embodiment are obtained.

Seventh Embodiment

Figure 30:
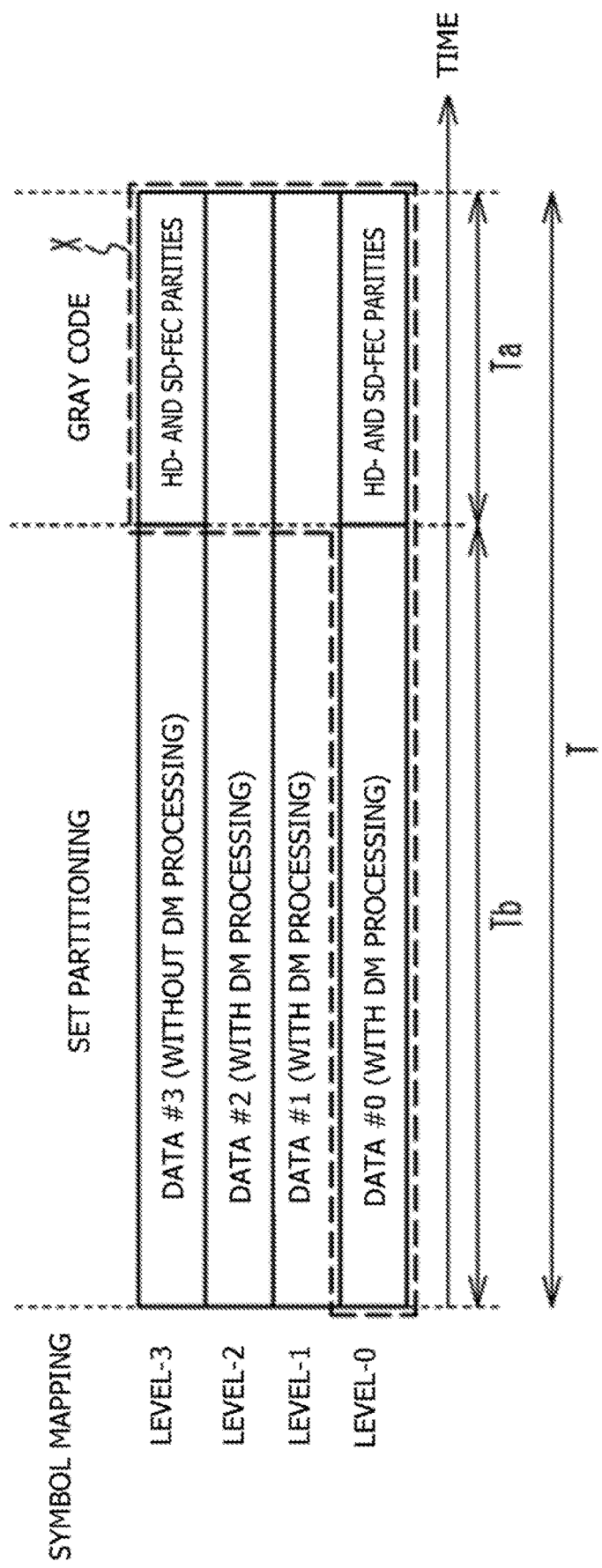
FIG. 30 is a diagram illustrating a frame format of an output signal that is output by an encoding circuit according to a seventh embodiment.

FIG. 30 is a diagram illustrating a frame format of an output signal Sout that is output by an encoding circuit 120 according to a seventh embodiment. A configuration in the frame format according to the present embodiment in the time period Ta is different from that described in the fourth embodiment. In the time period Ta, an HD-FEC parity and an SD-FEC parity are included in the bit string of the level 0 and the bit string of the level 3. The arrangement form of the SD-FEC parity and the HD-FEC parity is not limited.

In the time period Ta, the data #0 and #1 is included in the bit strings of the levels 0 and 1, respectively. In the time period Ta, the SD-FEC parity is generated from the data #0 and #1 within the bit strings of the levels 0 and 1 and the HD-FEC parity within the bit strings of the levels 1 and 2. In the time period Tb, the SD-FEC parity is generated from the data #0 within the bit string of the level 0.

According to the frame format, as indicated by a reference symbol X, each of the bit strings of the levels 0 to 3 is an arithmetic region for the SD-FEC parity in the time period Ta, and only the bit string of the level 0 is an arithmetic region for the SD-FEC parity in the time period Tb. In the time period Ta, the SD-FEC parity is not inserted in the bit strings of the levels 1 and 2 and is inserted across the two bit strings of the levels 0 and 3.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 31:
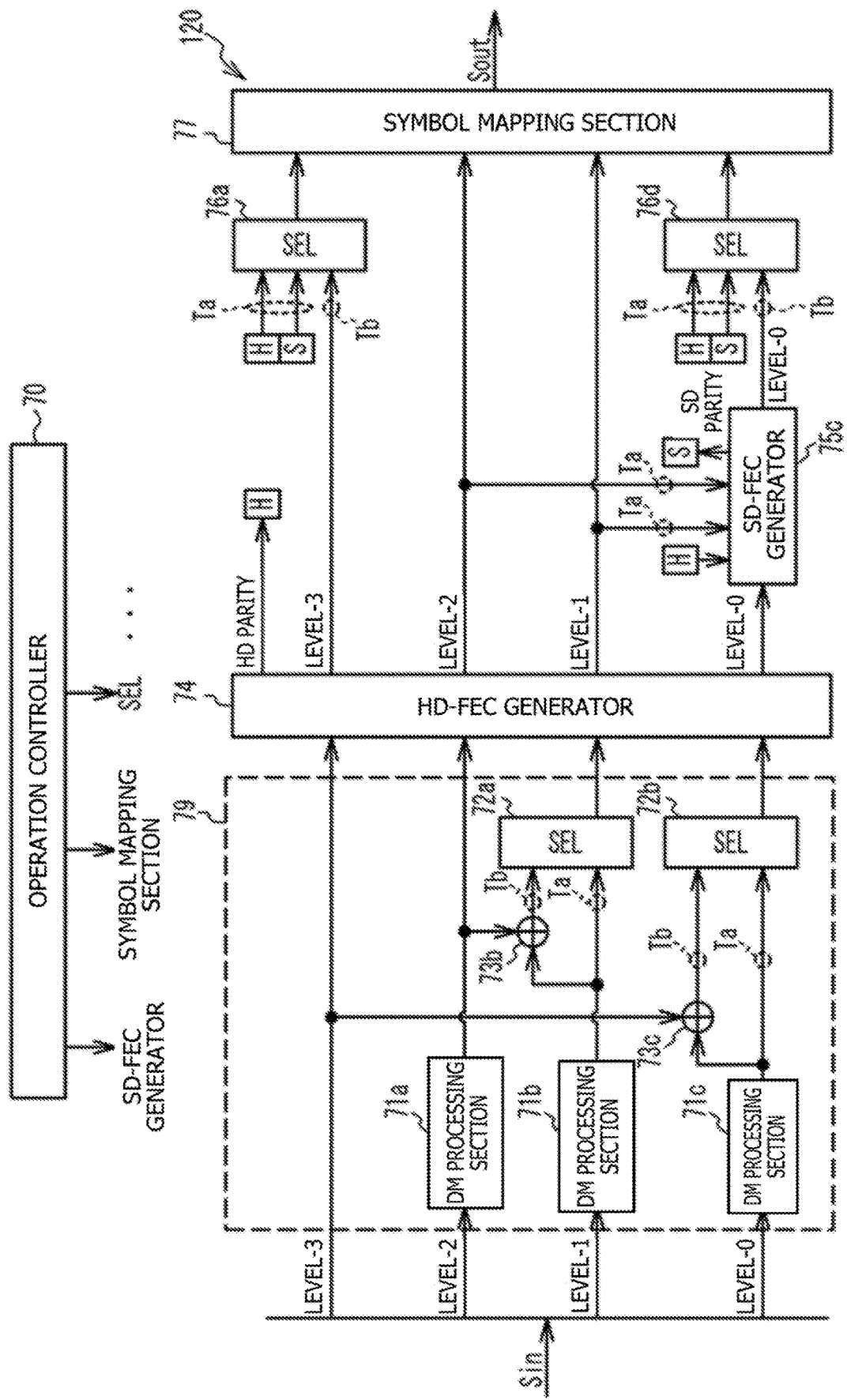
FIG. 31 is a configuration diagram illustrating the encoding circuit according to the seventh embodiment.

FIG. 31 is a configuration diagram illustrating the encoding circuit 120 according to the seventh embodiment. Configurations illustrated in FIG. 31 and common to those illustrated in FIGS. 22, 25, and 28 are indicated by the same reference symbols as those illustrated in FIGS. 22, 25, and 28 and will not be described. An encoding method according to the seventh embodiment is the encoding process to be executed by the encoding circuit 120 described below. Differences from the encoding circuit 120 according to the fourth embodiment are described below with reference to FIGS. 30 and 31.

The encoding circuit 120 includes an operation controller 70, a PS converter 79, an HD-FEC generator 74, an SD-FEC generator 75c, a symbol mapping section 77, and selectors 76a and 76d. The PS converter 79 includes DM processing sections 71a to 71c, selectors 72a and 72b, and XOR operators 73b and 73c.

The HD-FEC generator 74 calculates the HD-FEC parity from the data #0 to #3 of the bit strings of the levels 0 to 3 and outputs the HD-FEC parity to the SD-FEC generator 75c and the selectors 76a and 76d. The HD-FEC generator 74 outputs the input bit strings of the levels 1 and 2 to the symbol mapping section 77 without changing the bit strings of the levels 1 and 2, outputs the input bit string of the level 3 to the selector 76a without changing the bit string of the level 3, and outputs the input bit string of the level 0 to the SD-FEC generator 75c without changing the bit string of the level 0.

The SD-FEC generator 75c is an example of the first inserting section. The SD-FEC generator 75c generates the SD-FEC parity from the bit string of the level 0 in the time period Tb and inserts the SD-FEC parity in the bit strings of the levels 1 and 3 in the time period Ta in accordance with the switching between the time periods Ta and Tb by the operation controller 70. The SD-FEC generator 75c generates the SD-FEC parity from the data #1 and #2 within the bit strings of the levels 1 and 2 and the HD-FEC parity within the bit strings of the levels 1 and 3 in the time period Ta.

The SD-FEC generator 75c outputs the SD-FEC parity to the selectors 76a and 76d. The SD-FEC generator 75c outputs the input bit string of the level 0 to the selector 76d without changing the bit string of the level 0.

The selector 76d selects, as an input signal, the SD-FEC parity and the HD-FEC parity and outputs the input signal to the symbol mapping section 77 in the time period Ta. The selector 76d selects, as an input signal, the data #1 within the bit string of the level 1 and outputs the input signal to the symbol mapping section 77 in the time period Tb.

Therefore, the data #0 to #3 within the bit strings of the levels 0 to 3 is input to the symbol mapping section 77 in the time period Tb in accordance with the switching between the time periods Ta and Tb by the operation controller 70. The HD-FEC parity and the SD-FEC parity within the bit strings of the levels 0 and 3 and the data #1 and #2 within the bit strings of the levels 1 and 2 are input to the symbol mapping section 77 in the time period Ta in accordance with the switching between the time periods Ta and Tb by the operation controller 70. In this manner, the foregoing frame format is formed.

According to the foregoing configuration, the encoding circuit 120 may reduce consumption power without reducing noise tolerance.

Figure 32:
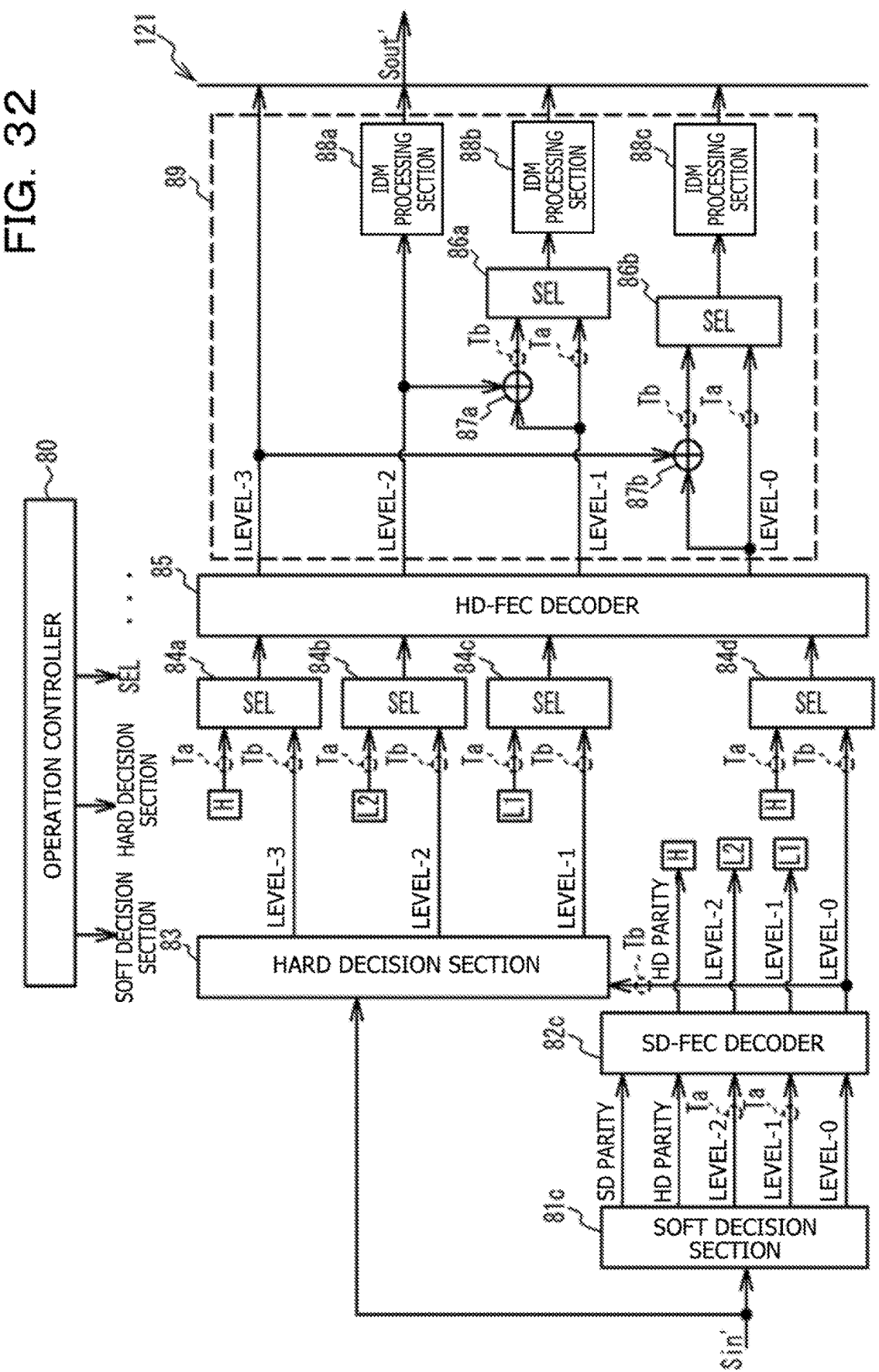
FIG. 32 is a configuration diagram illustrating a decoding circuit according to the seventh embodiment.

FIG. 32 is a configuration diagram illustrating the decoding circuit 121 according to the seventh embodiment. Configurations illustrated in FIG. 32 and common to those illustrated in FIGS. 23, 26, and 29 are indicated by the same reference symbols as those illustrated in FIGS. 23, 26, and 29 and will not be described. A decoding method according to the present embodiment is the decoding process to be executed by the decoding circuit 121 described below. Differences from the decoding circuit 121 according to the fourth embodiment are described below with reference to FIGS. 30 and 32.

The decoding circuit 121 includes an operation controller 80, a soft decision section 81c, an SD-FEC decoder 82c, a hard decision section 83, selectors 84a to 84d, an HD-FEC decoder 85, and a PS inverse converter 89. The PS inverse converter 89 includes selectors 86a and 86b, XOR operators 87a and 87b, and IDM processing sections 88a to 88c.

An input signal Sin' is inputted from the analog-digital converter 13 to the soft decision section 81c and the hard decision section 83.

The soft decision section 81c is an example of the first deciding section. The soft decision section 81c executes, based on a symbol, soft decision on each of the values of the bit strings of the levels 1 and 3 within the frame to which the symbol within the 256-QAM constellation is allocated. The soft decision section 81c extracts the HD-FEC parity and the SD-FEC parity from each of the bit strings of the levels 1 and 3 based on the results of the soft decision and outputs the HD-FEC parity and the SD-FEC parity to the SD-FEC decoder 82c. The soft decision section 81c outputs the bit strings of the levels 0 to 2 to the SD-FEC decoder 82c based on the results of the soft decision.

The SD-FEC decoder 82c is an example of the corrector. The SD-FEC decoder 82c corrects an error of the results of the decision by the soft decision section 81c based on the SD-FEC parity inserted in the bit strings of the levels 1 and 3 in the time period Ta within the cycle T of the frame. The SD-FEC decoder 82c corrects the values of the bit string of the level 0 in the time period Tb and corrects the values of the bit strings of the levels 0 to 3 in the time period Ta.

The SD-FEC decoder 82c outputs the HD-FEC parity to the selectors 84a to 84c and outputs the bit string of the level 0 to the hard decision section 83 and the selector 84d. The SD-FEC decoder 82c outputs the bit strings of the levels 1 and 2 in the time period Ta to the selectors 84c and 84b.

The selector 84d selects an output signal to be outputted to the HD-FEC decoder 85 from the HD-FEC parity and the data #0 within the bit string of the level 0. The selector 84d selects the HD-FEC parity in the time period Ta and selects the bit string of the level 0 in the time period Tb.

The selector 84b selects an output signal to be outputted to the HD-FEC decoder 85 from the bit string (data #2) of the level 2 that has been subjected to the soft decision and the bit string (data #2) of the level 2 that has been subjected to the hard decision. In the time period Ta, the selector 84b selects the bit string of the level 2 that has been subjected to the hard decision. In the time period Tb, the selector 84b selects the bit string of the level 2 that has been subjected to the soft decision.

The HD-FEC decoder 85 decodes the data #0 to #3 of the bit strings of the levels 0 to 3 in the time period Tb. The HD-FEC decoder 85 decodes the data #1 and #2 within the bit strings of the levels 1 and 2 in the time period Ta.

As described above, the selectors 84a to 84c select bit strings for which errors of the results of the soft decision have been corrected based on the SD-FEC parity in the time period Ta in accordance with the notification by the operation controller 80. The selectors 84a to 84c select bit strings subjected to the hard decision by the hard decision section 83 in the time period Tb in accordance with the notification by the operation controller 80. Therefore, effects that are the same as or similar to those obtained in the fourth embodiment are obtained.

Eighth Embodiment

Figure 33:
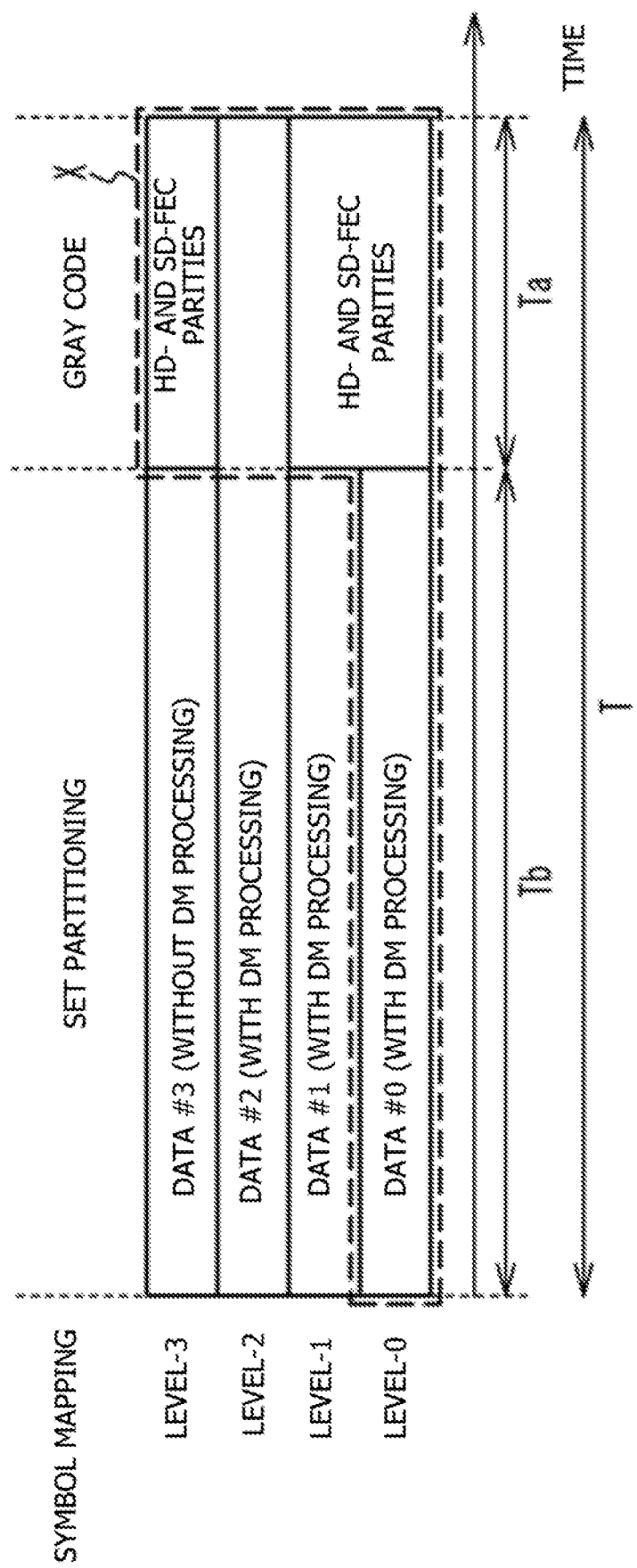
FIG. 33 is a diagram illustrating a frame format of an output signal that is output by an encoding circuit according to an eighth embodiment.

FIG. 33 is a diagram illustrating a frame format of an output signal Sout that is outputted by an encoding circuit 120 according to an eighth embodiment. A configuration in the frame format according to the present embodiment in the time period Ta is different from that described in the fourth embodiment. In the time period Ta, an HD-FEC parity and an SD-FEC parity are included in the bit string of the level 0, the bit string of the level 1, and the bit string of the level 3. The arrangement form of the SD-FEC parity and the HD-FEC parity is not limited.

In the time period Ta, the data #2 is included in the bit string of the level 2. In the time period Ta, the SD-FEC parity is generated from the data #2 within the bit string of the level 2 and the HD-FEC parity within the bit strings of the levels 0, 1, and 3. In the time period Tb, the SD-FEC parity is generated from the data #0 within the bit string of the level 0.

According to the frame format, as indicated by a reference symbol X, each of the bit strings of the levels 0 to 3 is an arithmetic region for the SD-FEC parity in the time period Ta, and only the bit string of the level 0 is an arithmetic region for the SD-FEC parity in the time period Tb. In the time period Ta, the SD-FEC parity is not inserted in the bit string of the level 2 and is inserted across the three bit strings of the levels 0, 1, and 3.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 34:
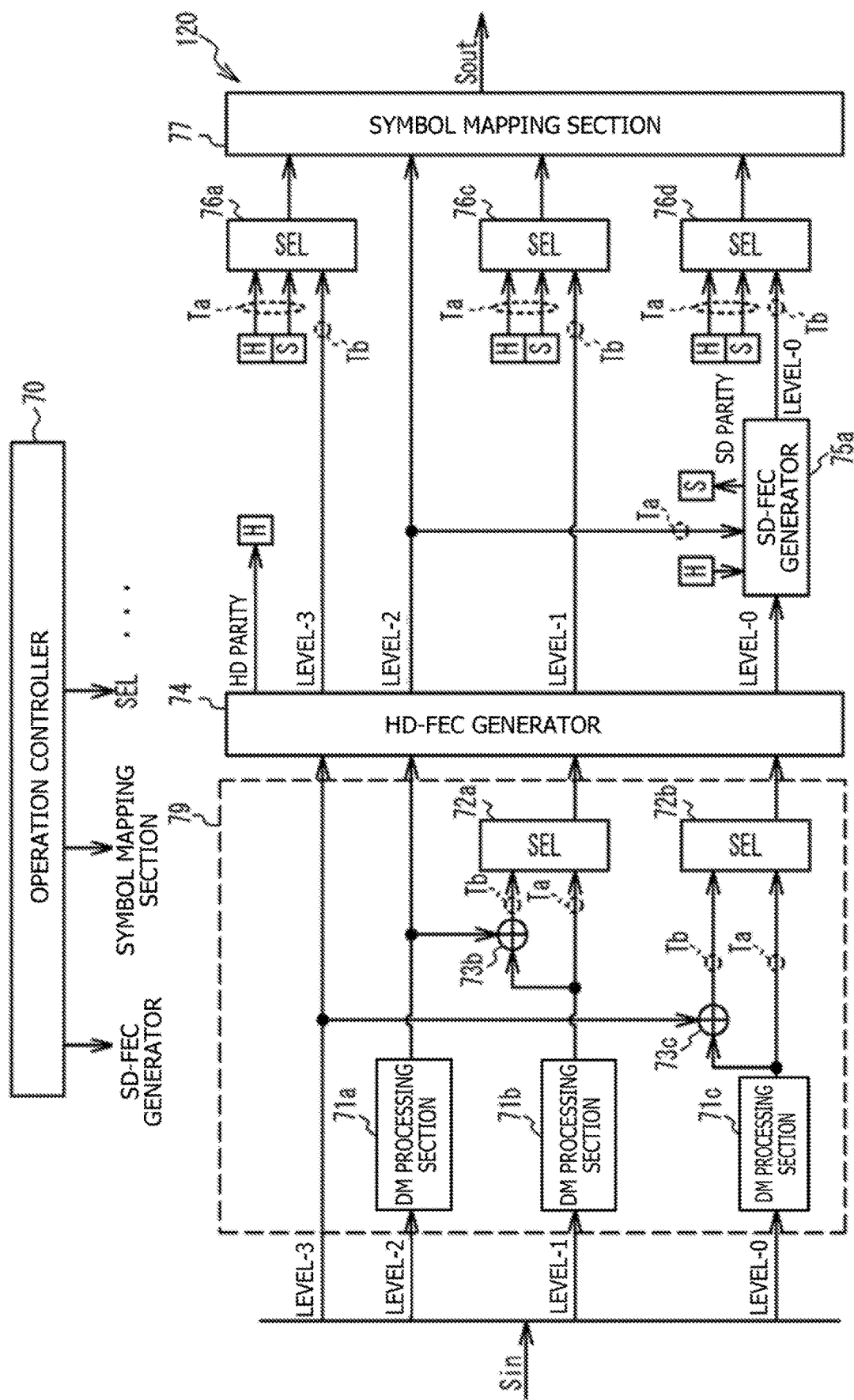
FIG. 34 is a configuration diagram illustrating the encoding circuit according to the eighth embodiment.

FIG. 34 is a configuration diagram illustrating the encoding circuit 120 according to the eighth embodiment. Configurations illustrated in FIG. 34 and common to those illustrated in FIGS. 22, 25, and 28 are indicated by the same reference symbols as those illustrated in FIGS. 22, 25, and 28 and will not be described. An encoding method according to the eighth embodiment is the encoding process to be executed by the encoding circuit 120 described below. Differences from the encoding circuit 120 according to the fourth embodiment are described below with reference to FIGS. 33 and 34.

The encoding circuit 120 includes an operation controller 70, a PS converter 79, an HD-FEC generator 74, an SD-FEC generator 75*a*, a symbol mapping section 77, and selectors 76*a*, 76*c*, and 76*d*. The PS converter 79 includes DM processing sections 71*a* to 71*c*, selectors 72*a* and 72*b*, and XOR operators 73*b* and 73*c*.

The HD-FEC generator 74 calculates the HD-FEC parity from the data #0 to #3 of the bit strings of the levels 0 to 3 and outputs the HD-FEC parity to the SD-FEC generator 75*a* and the selectors 76*a*, 76*c*, and 76*d*. The HD-FEC generator 74 outputs the input bit string of the level 2 to the symbol mapping section 77 without changing the bit string of the level 2, outputs the input bit strings of the levels 3 and 1 to the selectors 76*a* and 76*c* without changing the bit strings of the levels 3 and 1, and outputs the input bit string of the level 0 to the SD-FEC generator 75*a* without changing the bit string of the level 0.

The SD-FEC generator 75*a* is an example of the first inserting section. The SD-FEC generator 75*a* generates the SD-FEC parity from the bit string of the level 0 in the time period Tb and inserts the SD-FEC parity in the bit strings of the levels 0, 1, and 3 in the time period Ta in accordance with the switching between the time periods Ta and Tb by the operation controller 70. The SD-FEC generator 75*a* generates the SD-FEC parity from the data #2 within the bit string of the level 2 and the HD-FEC parity within the bit strings of the levels 0, 1, and 3 in the time period Ta.

The SD-FEC generator 75*a* outputs the SD-FEC parity to the selectors 76*a*, 76*c*, and 76*d*. The SD-FEC generator 75*a* outputs the input bit string of the level 0 to the selector 76*d* without changing the bit string of the level 0.

The selector 76*d* selects, as an input signal, the SD-FEC parity and the HD-FEC parity and outputs the input signal to the symbol mapping section 77 in the time period Ta. The selector 76*d* selects, as an input signal, the data #0 within the bit string of the level 0 and outputs the input signal to the symbol mapping section 77 in the time period Tb.

The selector 76*c* selects, as an input signal, the SD-FEC parity and the HD-FEC parity and outputs the input signal to the symbol mapping section 77 in the time period Ta. The selector 76*c* selects, as an input signal, the data #1 within the bit string of the level 1 and outputs the input signal to the symbol mapping section 77 in the time period Tb.

Thus, the data #0 to #3 within the bit strings of the levels 0 to 3 is input to the symbol mapping section 77 in the time period Tb in accordance with the switching between the time periods Ta and Tb by the operation controller 70. The HD-FEC parity and the SD-FEC parity within the bit strings of the levels 0, 1, and 3 and the data #2 within the bit string of the level 2 are input to the symbol mapping section 77 in the time period Ta in accordance with the switching between the time periods Ta and Tb by the operation controller 70. In this manner, the foregoing frame format is formed.

According to the foregoing configuration, the encoding circuit 120 may reduce consumption power without reducing noise tolerance.

Figure 35:
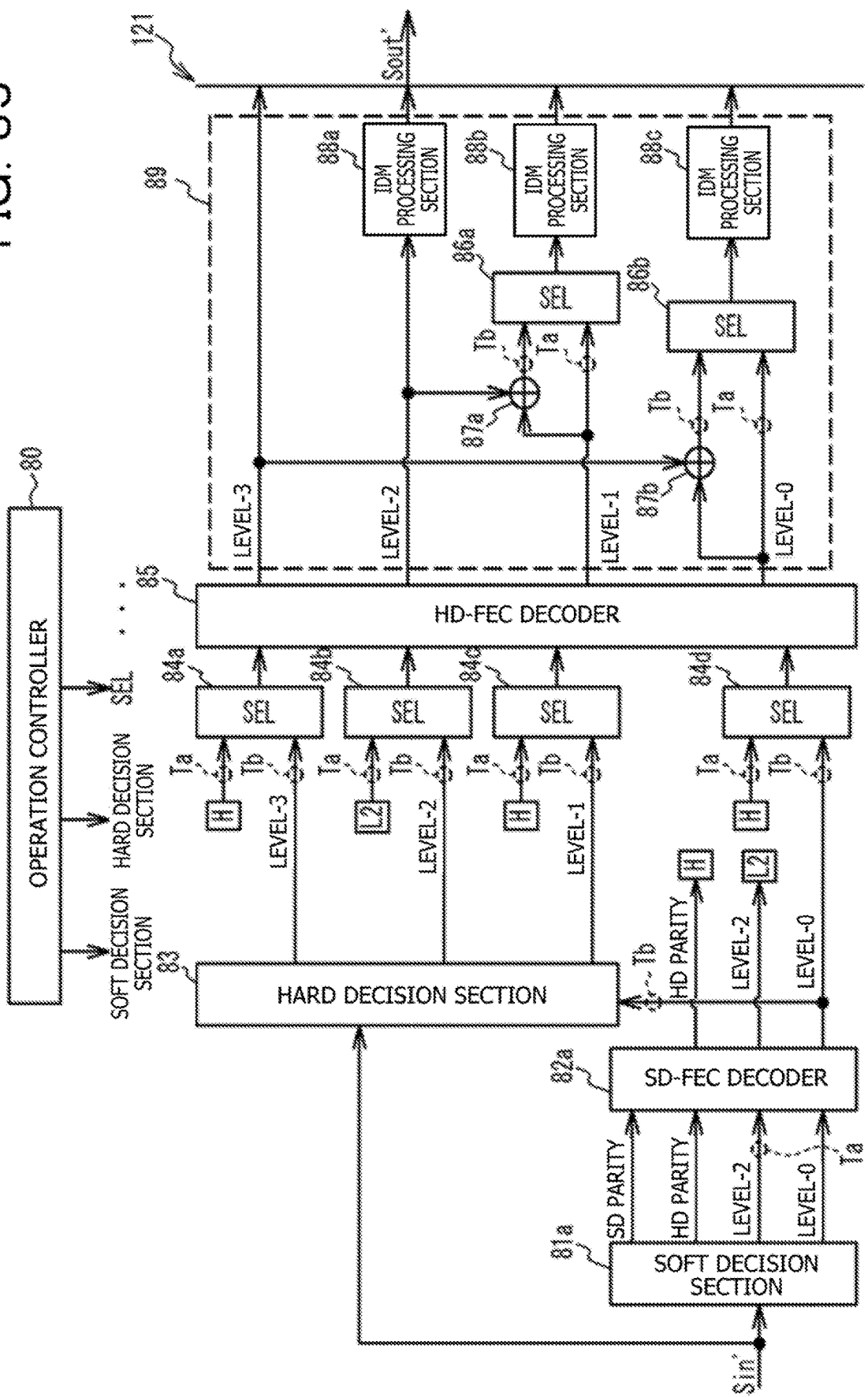
FIG. 35 is a configuration diagram illustrating a decoding circuit according to the eighth embodiment.

FIG. 35 is a configuration diagram illustrating the decoding circuit 121 according to the eighth embodiment. Configurations illustrated in FIG. 35 and common to those illustrated in FIGS. 23, 26, 29, and 32 are indicated by the same reference symbols as those illustrated in FIGS. 23, 26, 29, and 32 and will not be described. A decoding method according to the present embodiment is the decoding process to be executed by the decoding circuit 121 described below. Differences from the decoding circuit 121 according to the fourth embodiment are described below with reference to FIGS. 33 and 35.

The decoding circuit 121 includes an operation controller 80, a soft decision section 81*a*, an SD-FEC decoder 82*a*, a hard decision section 83, selectors 84*a* to 84*d*, an HD-FEC decoder 85, and a PS inverse converter 89. The PS inverse converter 89 includes selectors 86*a* and 86*b*, XOR operators 87*a* and 87*b*, and IDM processing sections 88*a* to 88*c*.

An input signal Sin' is input from the analog-digital converter 13 to the soft decision section 81*a* and the hard decision section 83.

The soft decision section 81*a* is an example of the first deciding section. The soft decision section 81*a* executes, based on a symbol, soft decision on each of the values of the bit strings of the levels 0, 1, and 3 within the frame to which the symbol within the 256-QAM constellation is allocated. The soft decision section 81*a* extracts the HD-FEC parity and the SD-FEC parity from each of the bit strings of the levels 0, 1, and 3 based on the results of the soft decision and outputs the HD-FEC parity and the SD-FEC parity to the SD-FEC decoder 82*a*. The soft decision section 81*a* outputs the bit strings of the levels 0, 1, and 3 to the SD-FEC decoder 82*a* based on the results of the soft decision.

The SD-FEC decoder 82*a* is an example of the corrector. The SD-FEC decoder 82*a* corrects an error of the results of the decision by the soft decision section 81*c* based on the SD-FEC parity inserted in the bit strings of the levels 0, 1, and 3 in the time period Ta within the cycle T of the frame. The SD-FEC decoder 82*a* corrects the values of the bit string of the level 0 in the time period Tb and corrects the values of the bit strings of the levels 0 to 3 in the time period Ta.

The SD-FEC decoder 82*a* outputs the HD-FEC parity to the selectors 84*b* to 84*d* and outputs the bit string of the level 0 to the hard decision section 83 and the selector 84*d*. The SD-FEC decoder 82*a* outputs the bit string of the level 2 in the time period Ta to the selector 84*b* and outputs the bit string of the level 0 to the selector 84*d*.

The selector 84*d* selects an output signal to be output to the HD-FEC decoder 85 from the HD-FEC parity and the data #0 within the bit string of the level 0. The selector 84*d* selects the HD-FEC parity in the time period Ta and selects the bit string of the level 0 in the time period Tb.

The selector 84*b* selects an output signal to be output to the HD-FEC decoder 85 from the data #2 included in the bit string of the level 2 that has been subjected to the soft decision and the data #2 included in the bit string of the level 2 that has been subjected to the hard decision. In the time period Ta, the selector 84*b* selects the bit string of the level 2 that has been subjected to the hard decision. In the time period Tb, the selector 84*b* selects the bit string of the level 2 that has been subjected to the soft decision.

The selector 84*c* selects an output signal to be outputted to the HD-FEC decoder 85 from the HD-FEC parity and the data #1 within the bit string of the level 1. The selector 84*c* selects the HD-FEC parity in the time period Ta and selects the bit string of the level 1 in the time period Tb.

The HD-FEC decoder 85 decodes the data #0 to #3 of the bit strings of the levels 0 to 3 in the time period Tb and decodes the data #2 within the bit string of the level 2 in the time period Ta.

As described above, the selectors 84*a* to 84*c* select bit strings for which errors of the results of the soft decision have been corrected based on the SD-FEC parity in the time period Ta in accordance with notification by the operation controller 80. The selectors 84*a* to 84*c* select bit strings subjected to the hard decision by the hard decision section 83 in the time period Tb in accordance with the notification by the operation controller 80. Therefore, effects that are the same as or similar to those described in the fourth embodiment are obtained.

Ninth Embodiment

Figure 36:
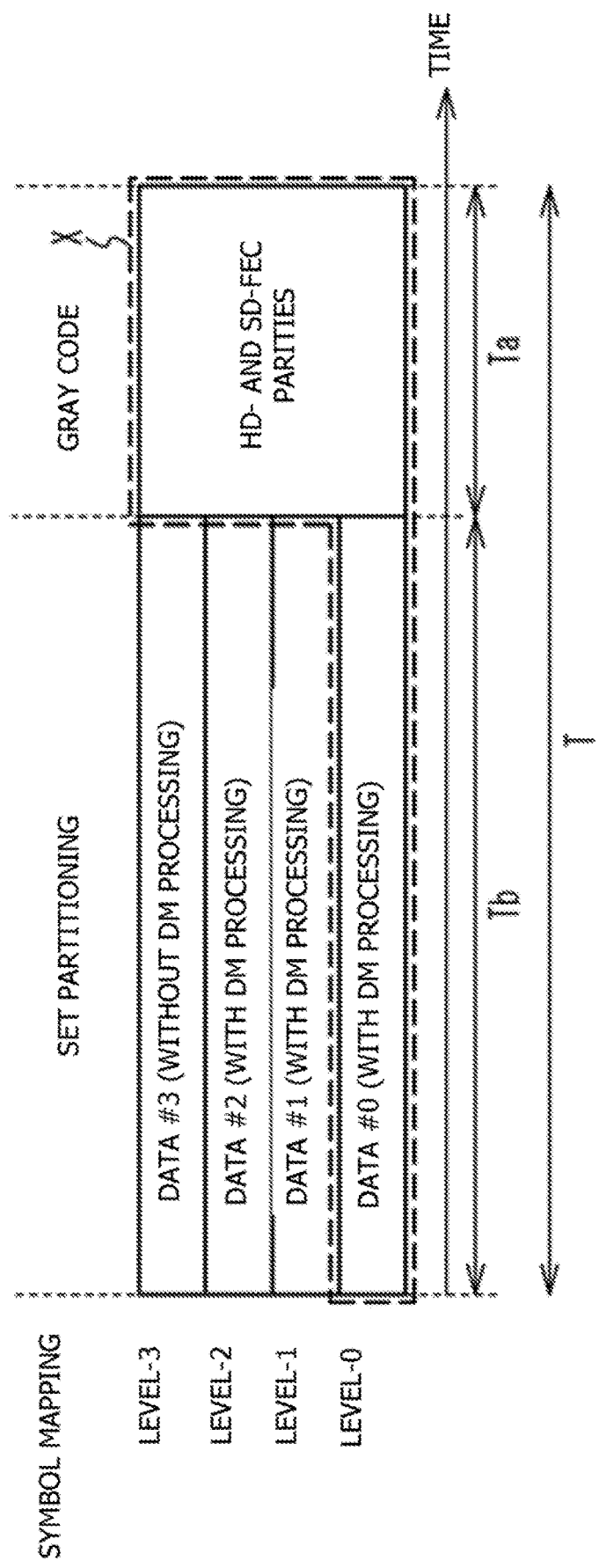
FIG. 36 is a diagram illustrating a frame format of an output signal that is output by an encoding circuit according to a ninth embodiment.

FIG. 36 is a diagram illustrating a frame format of an output signal Sout that is output by an encoding circuit 120 according to a ninth embodiment. A configuration in the frame format according to the present embodiment in the time period Ta is different from that described in the fourth embodiment. In the time period Ta, an HD-FEC parity and an SD-FEC parity are included in the bit string of the level 0 and the bit string of the level 1. In the time period Ta, the HD-FEC parity and the SD-FEC parity are included in the bit string of the level 2 and the bit string of the level 3. The arrangement form of the SD-FEC parity and the HD-FEC parity is not limited.

The SD-FEC parity is generated from the HD-FEC parity within the bit strings of the levels 0 to 3 in the time period Ta. The SD-FEC parity is generated from the data #0 within the bit string of the level 0 in the time period Tb.

According to the frame format, as indicated by a reference symbol X, each of the bit strings of the levels 0 to 3 is an arithmetic region for the SD-FEC parity in the time period Ta, and only the bit string of the level 0 is an arithmetic region for the SD-FEC parity in the time period Tb. In the time period Ta, the SD-FEC parity is not inserted in each of the bit strings and is inserted across the four bit strings of the levels 0 to 3.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 37:
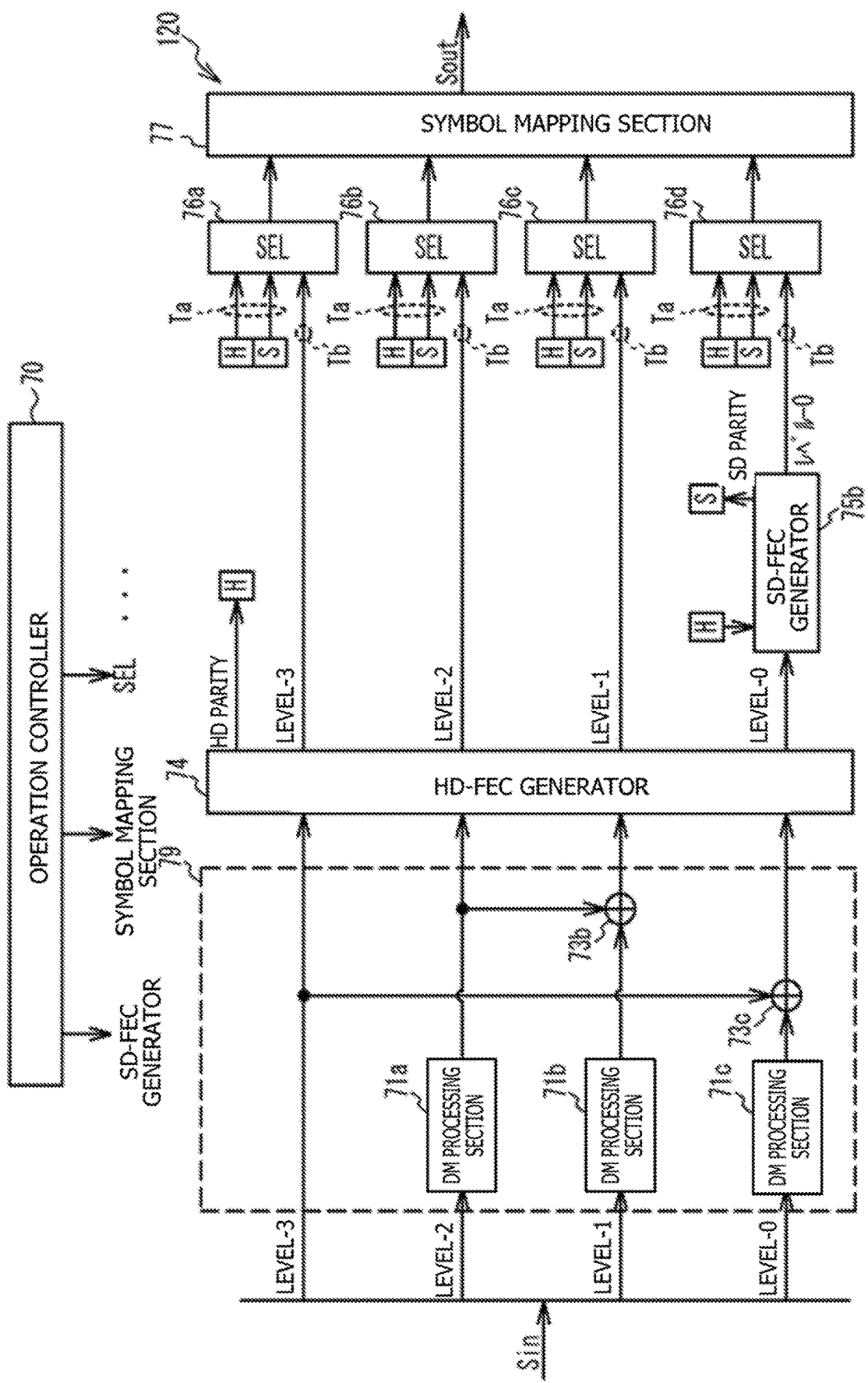
FIG. 37 is a configuration diagram illustrating the encoding circuit according to the ninth embodiment.

FIG. 37 is a configuration diagram illustrating the encoding circuit 120 according to the ninth embodiment. Configurations illustrated in FIG. 37 and common to those illustrated in FIGS. 22, 25, 28, 31, and 34 are indicated by the same reference symbols as those illustrated in FIGS. 22, 25, 28, 31, and 34 and will not be described. An encoding method according to the ninth embodiment is the encoding process to be executed by the encoding circuit 120 described below. Differences from the encoding circuit 120 according to the fourth embodiment are described below with reference to FIGS. 36 and 37.

The encoding circuit 120 includes an operation controller 70, a PS converter 79, an HD-FEC generator 74, an SD-FEC generator 75*b*, a symbol mapping section 77, and selectors 76*a* to 76*d*. The PS converter 79 includes DM processing sections 71*a* to 71*c* and XOR operators 73*b* and 73*c*.

The PS converter 79 does not include the selectors 72*a* and 72*b*. Thus, the PS converter 79 outputs, to the HD-FEC generator 74, the bit string of the level 0 that has been subjected to an XOR operation with the bit string of the level 2 in each of the time periods Ta and Tb. This is due to the fact that the HD-FEC parity and the SD-FEC parity are inserted in the bit strings of the levels 0 to 3 in the time period Ta and that whether the XOR operation is executed is not switched.

The SD-FEC generator 75*b* is an example of the first inserting section. The SD-FEC generator 75*b* generates the SD-FEC parity from the bit string of the level 0 in the time period Tb and inserts the SD-FEC parity in the bit strings of the levels 0 to 3 in the time period Ta in accordance with the switching between the time periods Ta and Tb by the operation controller 70. The SD-FEC generator 75*a* generates the SD-FEC parity from the HD-FEC parity within the bit strings of the levels 0 to 3 in the time period Ta.

The SD-FEC generator 75*b* outputs the SD-FEC parity to the selectors 76*a* to 76*d*. The SD-FEC generator 75*b* outputs the input bit string of the level 0 to the symbol mapping section 77 without changing the bit string of the level 0.

The selectors 76*a* to 76*d* select, as input signals, the SD-FEC parity and the HD-FEC parity and outputs the input signals to the symbol mapping section 77 in the time period Ta. The selectors 76*a* to 76*d* select, as input signals, the data #3, #2, #1, and #0 within the bit strings of the levels 3, 2, 1, and 0, respectively, and output the input signals to the symbol mapping section 77 in the time period Tb.

Therefore, the data #0 to #3 within the bit strings of the levels 0 to 3 is input to the symbol mapping section 77 in the time period Tb in accordance with the switching between the time periods Ta and Tb by the operation controller 70. The HD-FEC parity and the SD-FEC parity within the bit strings of the levels 0 to 3 are input to the symbol mapping section 77 in the time period Ta in accordance with the switching between the time periods Ta and Tb by the operation controller 70. In this manner, the foregoing frame format is formed.

According to the foregoing configuration, the encoding circuit 120 may reduce consumption power without reducing noise tolerance.

Figure 38:
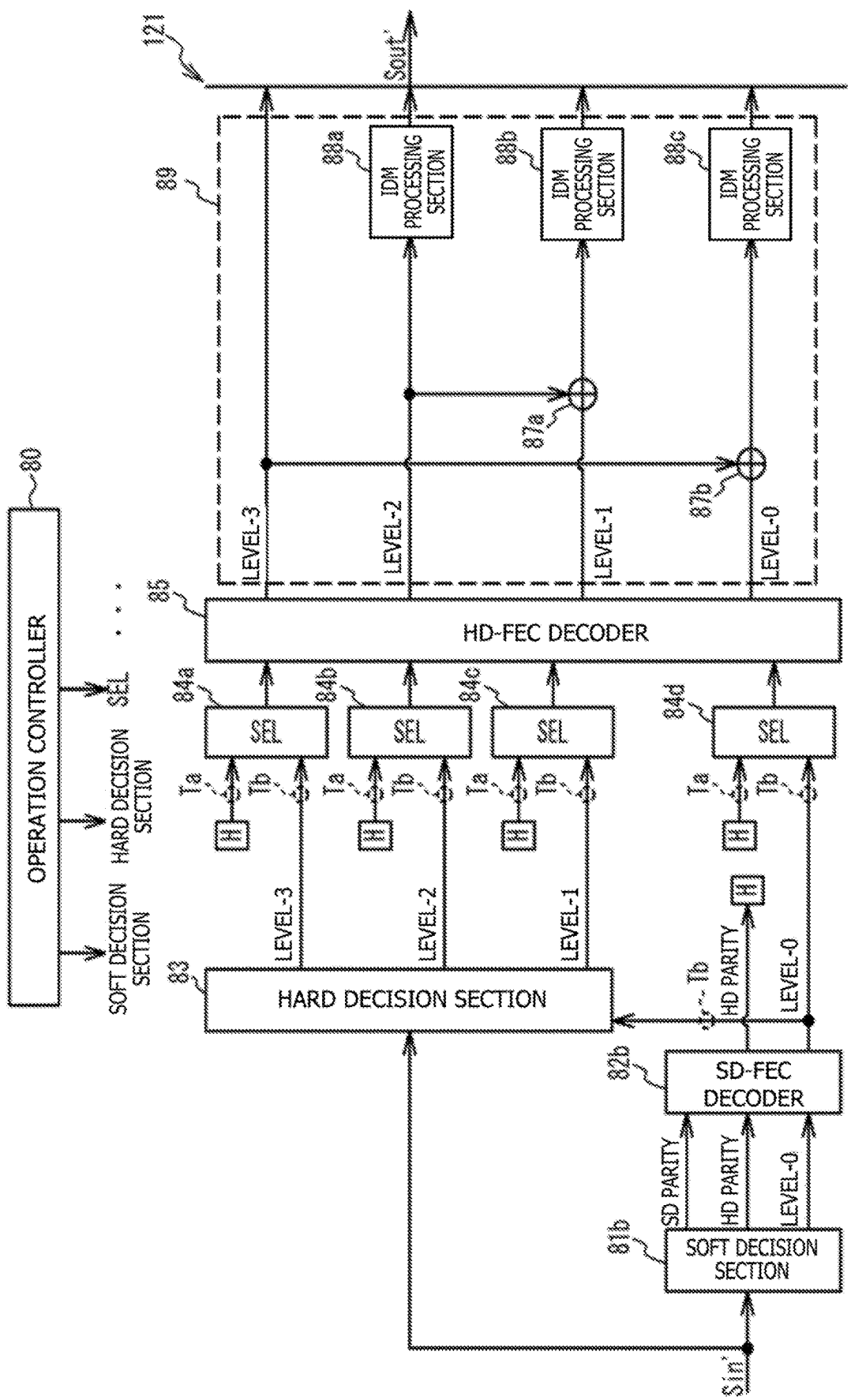
FIG. 38 is a configuration diagram illustrating a decoding circuit according to the ninth embodiment.

FIG. 38 is a configuration diagram illustrating the decoding circuit 121 according to the ninth embodiment. Configurations illustrated in FIG. 38 and common to those illustrated in FIGS. 23, 26, 29, 33, and 35 are indicated by the same reference symbols as those illustrated in FIGS. 23, 26, 29, 33, and 35 and will not be described. A decoding method according to the present embodiment is the decoding process to be executed by the decoding circuit 121 described below. Differences from the decoding circuit 121 according to the fourth embodiment are described below with reference to FIGS. 36 and 38.

The decoding circuit 121 includes an operation controller 80, a soft decision section 81*b*, an SD-FEC decoder 82*b*, a hard decision section 83, selectors 84a to 84d, an HD-FEC decoder 85, and a PS inverse converter 89. The PS inverse converter 89 includes XOR operators 87a and 87b and IDM processing sections 88a to 88c.

An Input signal Sin' Is Input from the analog-digital converter 13 to the soft decision section 81b and the hard decision section 83.

The soft decision section 81b is an example of the first deciding section. The soft decision section 81b executes, based on a symbol, soft decision on each of the values of the bit strings of the levels 0 to 3 within the frame to which the symbol within the 256-QAM constellation is allocated. The soft decision section 81b extracts the HD-FEC parity and the SD-FEC parity from each of the bit strings of the levels 0 to 3 based on the results of the soft decision and outputs the HD-FEC parity and the SD-FEC parity to the SD-FEC decoder 82b. The soft decision section 81b outputs the bit string of the level 0 to the SD-FEC decoder 82b based on the results of the soft decision.

The SD-FEC decoder 82b is an example of the corrector. The SD-FEC decoder 82b corrects an error of the results of the decision by the soft decision section 81b based on the SD-FEC parity inserted in the bit strings of the levels 0 to 3 in the time period Ta within the cycle T of the frame. The SD-FEC decoder 82b corrects the values of the bit string of the level 0 in the time period Tb and corrects the values of the bit strings of the levels 0 to 3 in the time period Ta.

The selector 84c selects an output signal to be output to the HD-FEC decoder 85 from the HD-FEC parity and the data #1 within the bit string of the level 1. The selector 84c selects the HD-FEC parity in the time period Ta and selects the bit string of the level 1 in the time period Tb.

The selector 84d selects an output signal to be output to the HD-FEC decoder 85 from the HD-FEC parity and the data #0 within the bit string of the level 0. The selector 84d selects the HD-FEC parity in the time period Ta and selects the bit string of the level 0 in the time period Tb.

The HD-FEC decoder 85 decodes the data #0 to #3 of the bit strings of the levels 0 to 3 in the time period Tb. The HD-FEC decoder 85 outputs the bit strings of the levels 0 to 3 to the PS inverse converter 89.

The PS inverse converter 89 does not include the selectors 86a and 86b. Therefore, in the PS inverse converter 89, the bit string of the level 1 that has been subjected to an XOR operation with the bit string of the level 2 is input to the IDM processing section 88b in each of the time periods Ta and Tb, and the bit string of the level 0 that has been subjected to an XOR operation with the bit string of the level 3 is input to the IDM processing section 88c in each of the time periods Ta and Tb. This is due to the fact that the HD-FEC parity and the SD-FEC parity are inserted in the bit strings of the levels 0 to 2 in the time period Ta and that whether the XOR operations are executed is not switched.

As described above, the selectors 84a to 84c select bit strings for which errors of the results of the soft decision have been corrected based on the SD-FEC parity in the time period Ta in accordance with notification by the operation controller 80. The selectors 84a to 84c select bit strings subjected to the hard decision by the hard decision section 83 in the time period Tb in the notification by the operation controller 80. Therefore, effects that are the same as or similar to those described in the fourth embodiment are obtained.

Tenth Embodiment

Figure 39:
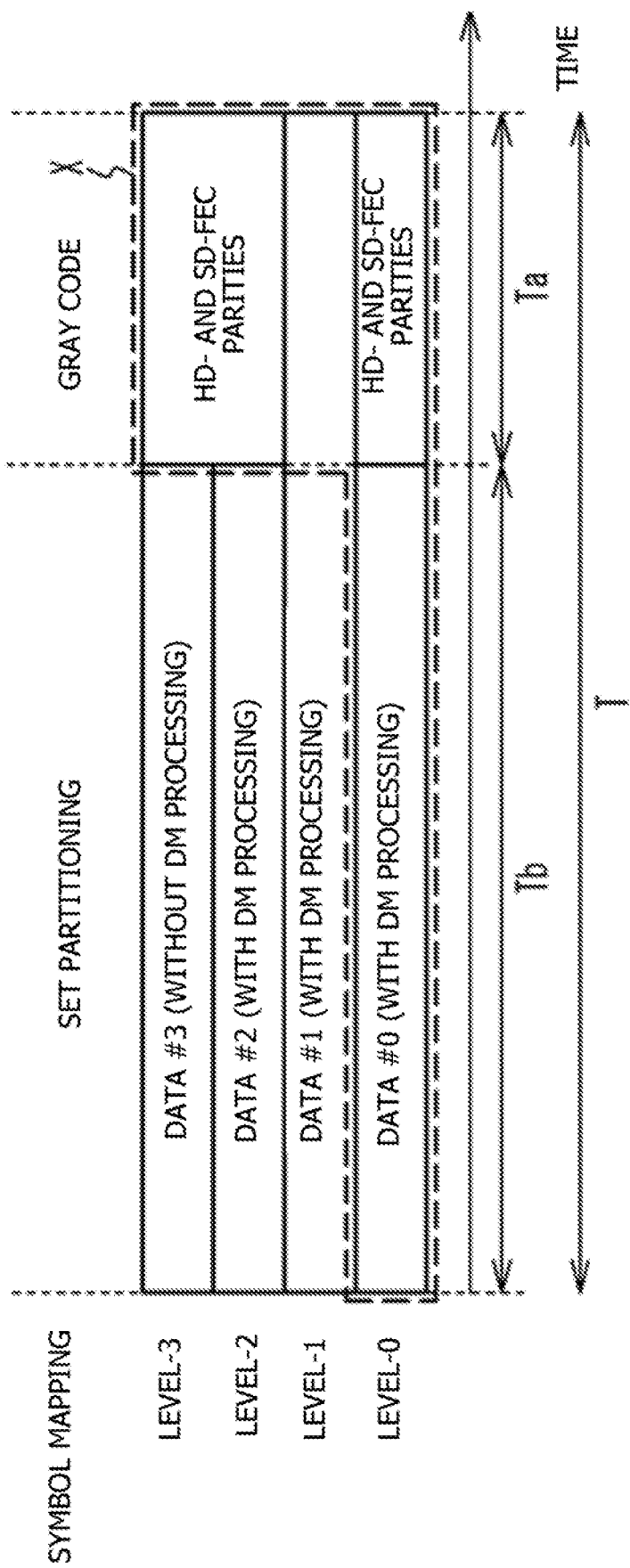
FIG. 39 is a diagram illustrating a frame format of an output signal that is output by an encoding circuit according to a tenth embodiment.

FIG. 39 is a diagram illustrating a frame format of an output signal Sout that is output by an encoding circuit 120 according to a tenth embodiment. A configuration in the frame format according to the present embodiment in the time period Ta is different from that described in the fourth embodiment. In the time period Ta, an HD-FEC parity and an SD-FEC parity are included in the bit string of the level 0, the bit string of the level 2, and the bit string of the level 3. The arrangement form of the SD-FEC parity and the HD-FEC parity is not limited.

The SD-FEC parity is generated from the HD-FEC parity within the bit strings of the levels 0, 2, and 3 in the time period Ta. The SD-FEC parity is generated from the data #0 within the bit string of the level 0 in the time period Tb.

According to the frame format as indicated by a reference symbol X, each of the bit strings of the levels 0 to 3 is an arithmetic region for the SD-FEC parity in the time period Ta, and only the bit string of the level 0 is an arithmetic region for the SD-FEC parity in the time period Tb. In the time period Ta, the SD-FEC parity is not inserted in each of the bit strings and is inserted across the three bit strings of the levels 0, 2, and 3.

Therefore, the encoding circuit 120 and a decoding circuit 121 execute an encoding process and a decoding process, respectively, based on the foregoing frame format, and thus may reduce consumption power without reducing noise tolerance. Configurations of the encoding circuit 120 and the decoding circuit 121 are described below.

Figure 40:
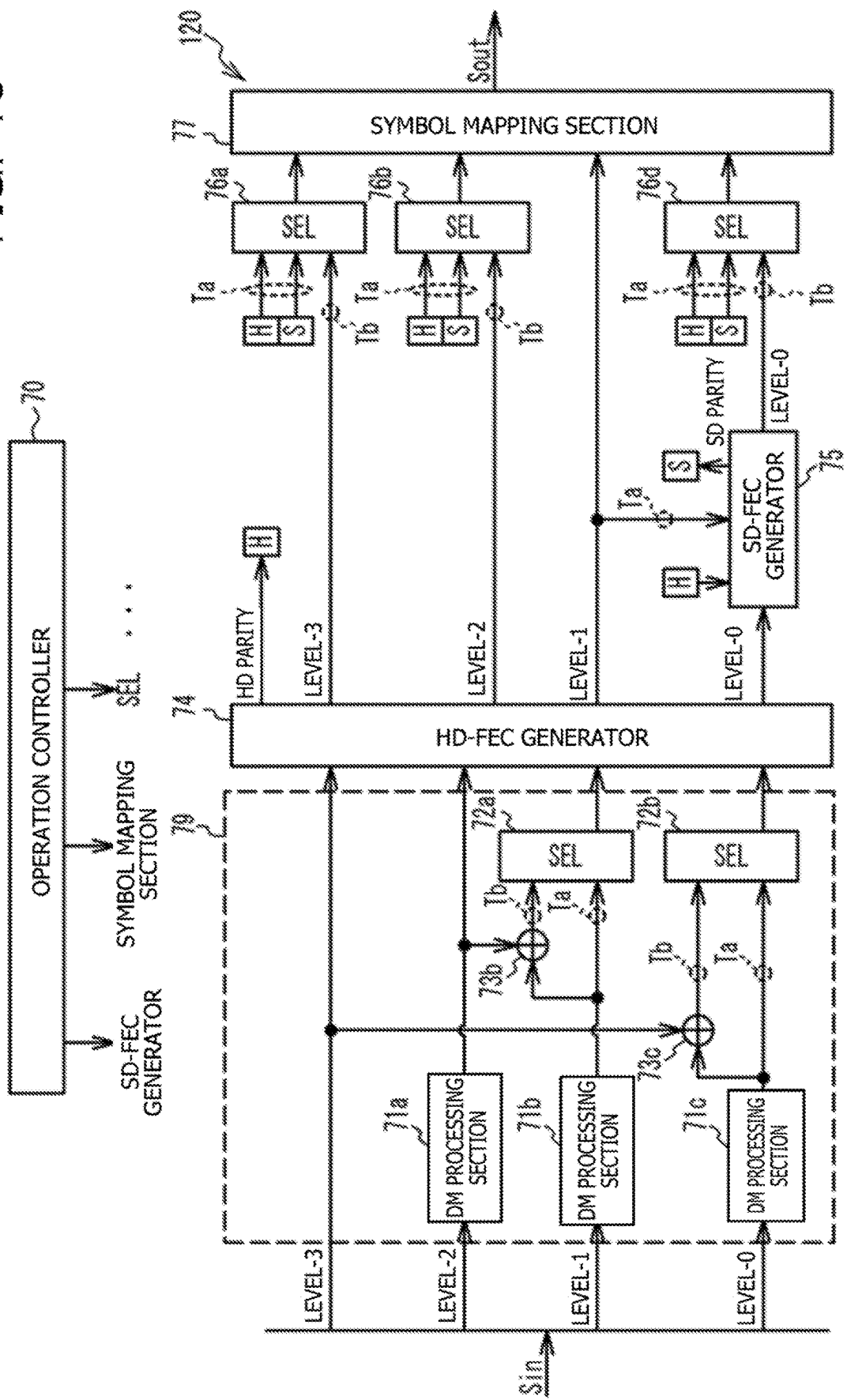
FIG. 40 is a configuration diagram illustrating the encoding circuit according to the tenth embodiment.

FIG. 40 is a configuration diagram illustrating the encoding circuit 120 according to the tenth embodiment. Configurations illustrated in FIG. 40 and common to those illustrated in FIGS. 22, 25, 28, 31, 34, and 37 are indicated by the same reference symbols as those illustrated in FIGS. 22, 25, 28, 31, 34, and 37 and will not be described. An encoding method according to the tenth embodiment is the encoding process to be executed by the encoding circuit 120 described below. Differences from the encoding circuit 120 according to the fourth embodiment are described below with reference to FIGS. 39 and 40.

The SD-FEC generator 75 is an example of the first inserting section. The SD-FEC generator 75 generates the SD-FEC parity from the bit string of the level 0 in the time period Tb and inserts the SD-FEC parity in the bit strings of the levels 0, 2, and 3 in the time period Ta in accordance with the switching between the time periods Ta and Tb by the operation controller 70. The SD-FEC generator 75 generates the SD-FEC parity from the data #1 within the bit string of the level 1 and the HD-FEC parity within the bit strings of the levels 0, 2, and 3 in the time period Ta. For example, the SD-FEC parity is calculated from each of the bit strings of the levels 0 to 3 in the time period Ta.

The SD-FEC generator 75 outputs the SD-FEC parity to the selectors 76a, 76b, and 76d. The SD-FEC generator 75 outputs the input bit string of the level 0 to the selector 76d without changing the bit string of the level 0.

The selectors 76a, 76b, and 76d select, as input signals, the SD-FEC parity and the HD-FEC parity and output the input signals to the symbol mapping section 77 in the time period Ta. The selectors 76a, 76b, and 76d select, as input signals, the data #3, #2, and #0 within the bit strings of the levels 3, 2, 0, respectively, and output the input signals to the symbol mapping section 77 in the time period Tb.

Therefore, the data #0 to #3 within the bit strings of the levels 0 to 3 is input to the symbol mapping section 77 in the time period Tb in accordance with the switching between the time periods Ta and Tb by the operation controller 70. The HD-FEC parity and the SD-FEC parity within the bit strings of the levels 0, 2, and 3 and the data #1 within the bit string of the level 1 are input to the symbol mapping section 77 in the time period Ta in accordance with the switching between the time periods Ta and Tb by the operation controller 70. In this manner, the foregoing frame format is formed.

According to the foregoing configuration, the encoding circuit 120 may reduce consumption power without reducing noise tolerance.

Figure 41:
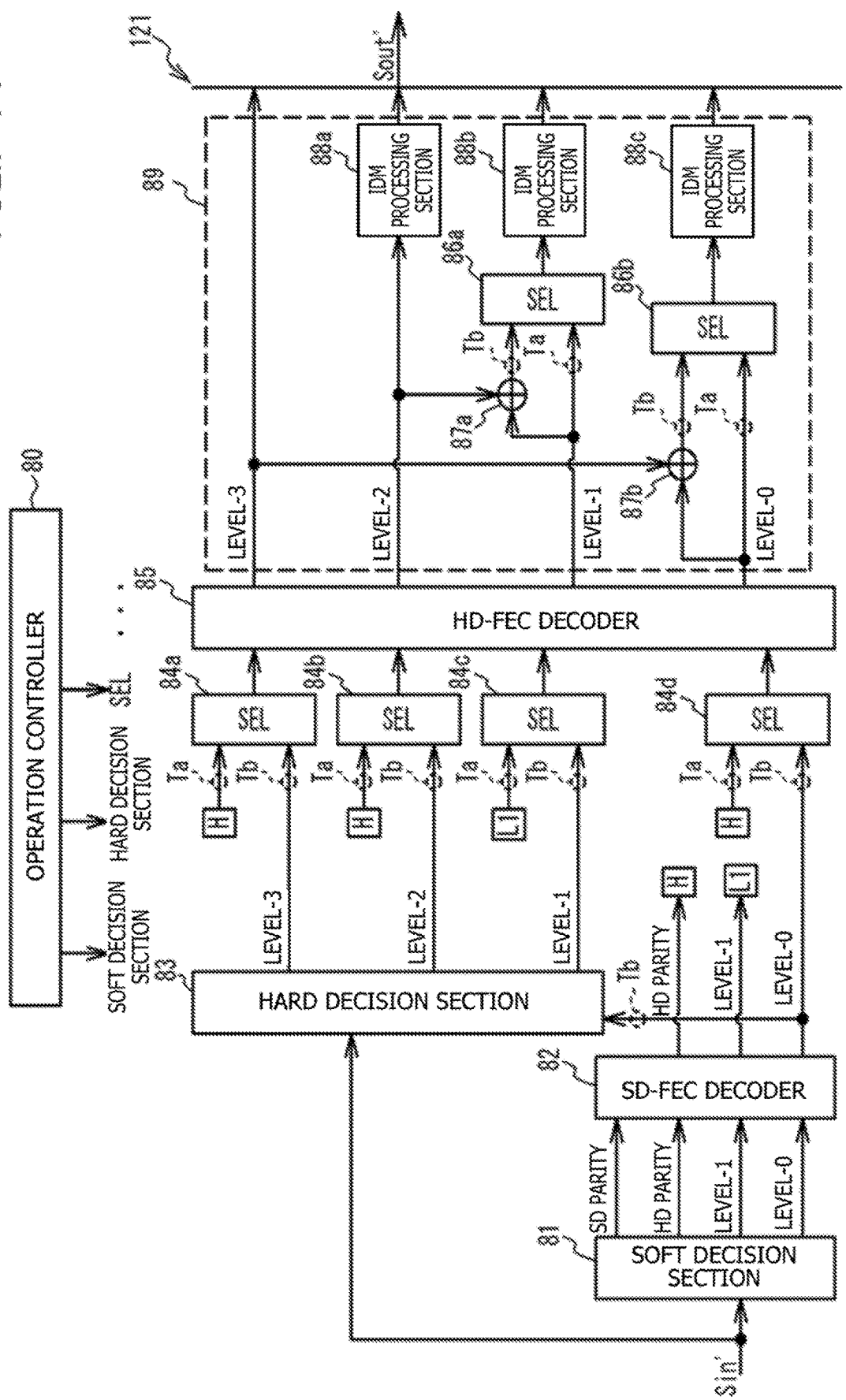
FIG. 41 is a configuration diagram illustrating a decoding circuit according to the tenth embodiment.

FIG. 41 is a configuration diagram illustrating the decoding circuit 121 according to the tenth embodiment. Configurations illustrated in FIG. 41 and common to those illustrated in FIGS. 23, 26, 29, 33, 35, and 38 are indicated by the same reference symbols as those illustrated in FIGS. 23, 26, 29, 33, 35, and 38 and will not be described. A decoding method according to the present embodiment is the decoding process to be executed by the decoding circuit 121 described below. Differences from the decoding circuit 121 according to the fourth embodiment are described below with reference to FIGS. 39 and 41.

The decoding circuit 121 includes an operation controller 80, a soft decision section 81, an SD-FEC decoder 82, a hard decision section 83, selectors 84a to 84d, an HD-FEC decoder 85, and a PS inverse converter 89. The PS inverse converter 89 includes selectors 86a and 86b, XOR operators 87a and 87b, and IDM processing sections 88a to 88c.

The SD-FEC decoder 82 is an example of the corrector. The SD-FEC decoder 82 corrects an error of the results of the decision by the soft decision section 81 based on the SD-FEC parity inserted in the bit strings of the levels 0, 2, and 3 in the time period Ta within the cycle T of the frame. The SD-FEC decoder 82 corrects the values of the bit strings of the level 0 in the time period Tb and corrects the values of the bit strings of the levels 0 to 3 in the time period Ta.

The selector 84d selects an output signal to be output to the HD-FEC decoder 85 from the HD-FEC parity and the data #0 within the bit string of the level 0. The selector 84c selects the HD-FEC parity in the time period Ta and selects the bit string of the level 0 in the time period Tb.

The HD-FEC decoder 85 decodes the data #0 to #3 of the bit strings of the levels 0 to 3 in the time period Tb and decodes the data #1 within the bit string of the level 1 in the time period Ta. The HD-FEC decoder 85 outputs the bit strings of the levels 0 to 3 to the PS inverse converter 89.

As described above, the selectors 84a to 84c select bit strings for which errors of the results of the soft decision have been corrected based on the SD-FEC parity in the time period Ta in accordance with notification by the operation controller 80. The selectors 84a to 84c select bit strings subjected to hard decision by the hard decision section 83 in the time period Tb in accordance with the notification by the operation controller 80. Therefore, effects that are the same as or similar to those described in the fourth embodiment are obtained.

As described above, in the fourth to tenth embodiments, each of the SD-FEC generators 75, 75a, and 75b generates the SD-FEC parity from the bit string of the level 0 in the time period Tb and inserts the SD-FEC parity in two or more bit strings including the bit string of the level 3 in the time period Ta in accordance with the switching by the operation controller 70. Therefore, it may be possible to reduce consumption power without a reduction in noise tolerance.

Next, the fourth to tenth embodiments are compared.

FIG. 42 is a diagram illustrating a data amount of an SD-FEC parity and an HD-FEC parity in each of bit strings according to a comparative example and the fourth to tenth embodiments. It is assumed that a total data amount of an SD-FEC parity and an HD-FEC parity within the frame in the time period Ta is N (bits).

In the comparative example, an SD-FEC parity and an HD-FEC parity that have a total data amount of N (bits) are inserted in the bit string of the level 3, and an SD-FEC parity with a data amount of 0 bits and an HD-FEC parity with a data amount of 0 bits are inserted in the other bit strings.

In the fourth embodiment, the SD-FEC parity and the HD-FEC parity are inserted in the bit strings of the levels 2 and 3 so that a data amount of N/2 (bits) of the SD-FEC parity and the HD-FEC parity is included in each of the bit strings of the levels 2 and 3, and an SD-FEC parity with a data amount of 0 bits and an HD-FEC parity with a data amount of 0 bits are inserted in the other bit strings. In the fifth embodiment, the SD-FEC parity and the HD-FEC parity are inserted in the bit strings of the levels 1 and 3 so that a data amount of N/2 (bits) of the SD-FEC parity and the HD-FEC parity is included in each of the bit strings of the levels 1 and 3, and an SD-FEC parity with a data amount of 0 bits and an HD-FEC parity with a data amount of 0 bits are inserted in the other bit strings.

In the sixth embodiment, the SD-FEC parity and the HD-FEC parity are inserted in the bit strings of the levels 1 to 3 so that a data amount of N/3 (bits) of the SD-FEC parity and the HD-FEC parity is included in each of the bit strings of the levels 1 to 3, and an SD-FEC parity with a data amount of 0 bits and an HD-FEC parity with a data amount of 0 bits are inserted in the other bit string. In the seventh embodiment, the SD-FEC parity and the HD-FEC parity are inserted in the bit strings of the levels 0 and 3 so that have a data amount of N/2 (bits) of the SD-FEC parity and the HD-FEC parity is included in each of the bit strings of the levels 0 and 3, and an SD-FEC parity with a data amount of 0 bits and an HD-FEC parity with a data amount of 0 bits are inserted in the other bit strings.

In the eighth embodiment, the SD-FEC parity and the HD-FEC parity are inserted in the bit strings of the levels 0, 1 and 3 so that a data amount of N/3 (bits) of the SD-FEC parity and the HD-FEC parity is included in each of the bit strings of the levels 0, 1 and 3, and an SD-FEC parity with a data amount of 0 bits and an HD-FEC parity with a data amount of 0 bits are inserted in the other bit string. In the ninth embodiment, the SD-FEC parity and the HD-FEC parity are inserted in the bit strings of the levels 0 to 3 so that have a data amount of N/4 (bits) of the SD-FEC parity and the HD-FEC parity is included in each of the bit strings of the levels 0 to 3.

In the tenth embodiment, the SD-FEC parity and the HD-FEC parity are inserted in the bit strings of the levels 0, 2 and 3 so that a data amount of N/3 (bits) of the SD-FEC parity and the HD-FEC parity is included in each of the bit strings of the levels 0, 2 and 3, and an SD-FEC parity with a data amount of 0 bits and an HD-FEC parity with a data amount of 0 bits are inserted in the other bit string.

Compare the comparative example with the fourth to tenth embodiments. In each of the fourth to tenth embodiments, since the SD-FEC parity and the HD-FEC parity are divided and inserted in two or more bit strings, the arithmetic region in the time period Ta is narrower than that in the comparative example, and consumption power may be reduced, compared to the comparative example. Especially, in the ninth embodiment, the SD-FEC parity and the HD-FEC parity are divided and inserted in all the bit strings, and the arithmetic region for the SD-FEC parity in the time period Ta is the narrowest and an effect of reducing consumption power is the highest.

As the amount of data subjected to the DM process in the frame is larger, an effect of the probabilistic shaping is larger. The noise tolerance in the fourth, fifth, and seventh embodiments in which the amount of the SD-FEC parity and the HD-FEC parity within the bit strings of the levels 0 to 2 that are to be subjected to the DM process is the smallest is obtained and higher than that in the other embodiments.

In each of the fifth and seventh embodiments, the SD-FEC parity and the HD-FEC parity are not inserted in the bit string of the level 2, and the data #1 and #2 subjected to the DM process is included in the bit string of the level 2. On the other hand, in the fourth embodiment, the SD-FEC parity and the HD-FEC parity are inserted in the bit string of the level 2. Therefore, in the fifth and seventh embodiments, the highest noise tolerance is obtained.

Each of the transponders 1a and 1b disclosed herein and the optical transmission system disclosed herein includes the encoding circuit 120 according to any of the first to tenth embodiments and the decoding circuit 121 according to any of the first to tenth embodiments. Therefore, effects that are the same as or similar to those described above are obtained. Each of the foregoing encoding circuits 120 and the foregoing decoding circuits 121 may be a circuit composed of hardware, such as a field-programmable gate array (FPGA) or an application-specified integrated circuit (ASIC), for example.

The foregoing embodiments are preferred embodiments of the invention. The embodiments, however, are not limited to this and may be variously changed and implemented without departing from the gist of the invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An encoding circuit comprising:
   an allocator configured to allocate, to a plurality of bit strings, symbols that are among a plurality of symbols within a constellation of multilevel modulation and correspond to values of the plurality of bit strings within a frame;
   a converter configured to convert values of each of bit strings among the plurality of bit strings excluding a first bit string so that, as a region within the constellation is closer to the center of the constellation, the number of symbols allocated in the region among the plurality of symbols is larger;
   a switch configured to switch, in a cycle of the frame, between a first time period in which a first error correction code to correct an error of the plurality of bit strings is inserted in the plurality of bit strings and a second time period in which the first error correction code is not inserted in the plurality of bit strings; and
   a first insertor configured to generate the first error correction code from a second bit string among the plurality of bit strings in the second time period and inserts the first error correction code in two or more bit strings including the first bit string in the first time period in accordance with the switching by the switch.

2. The encoding circuit according to claim 1, wherein the first insertor inserts the first error correction code in two or more bit strings that are among the plurality of bit strings excluding the second bit string in the first time period.

3. The encoding circuit according to claim 1, wherein the first insertor inserts the first error correction code in two or more bit strings that are among the plurality of bit strings excluding a third bit string of a higher level than a level of the second bit string in the first time period.

4. The encoding circuit according to claim 1, wherein the first insertor inserts the first error correction code in each of the plurality of bit strings in the first time period.

5. The encoding circuit according to any of claim 1, further comprising:
   a second insertor configured to generate, from each of the plurality of bit strings, a second error correction code to correct an error of the plurality of bit strings and inserts the second error correction code in two or more bit strings including the first bit string in the first time period in accordance with the switching by the switching section, wherein
   the first error correction code is used to correct an error of results of executing soft decision on the plurality of bit strings, and
   the second error correction code is used to correct an error of results of executing hard decision on the plurality of bit strings.

6. An encoding method comprising:
   allocating, to a plurality of bit strings, symbols that are among a plurality of symbols within a constellation of multilevel modulation and correspond to values of the plurality of bit strings within a frame;
   converting values of each of bit strings that are among the plurality of bit strings and exclude a first bit string so that, as a region within the constellation is closer to the center of the constellation, the number of symbols allocated in the region among the plurality of symbols is larger;
   switching, in a cycle of the frame, between a first time period in which a first error correction code to correct an error of the plurality of bit strings is inserted in the plurality of bit strings and a second time period in which the first error correction code is not inserted in the plurality of bit strings; and
   generating the first error correction code from a second bit string among the plurality of bit strings in the second time period and inserting the first error correction code in two or more bit strings including the first bit string in the first time period in accordance with the switching.

7. A transmitting device comprising:
   a circuit configured to:
   allocate, to a plurality of bit strings, symbols that are among a plurality of symbols within a constellation of multilevel modulation and correspond to values of the plurality of bit strings within a frame,
   convert values of each of bit strings that are among the plurality of bit strings excluding a first bit string so that, as a region within the constellation is closer to the center of the constellation, the number of symbols allocated in the region among the plurality of symbols is larger,
   switch, in a cycle of the frame, between a first time period in which a first error correction code to correct an error of the plurality of bit strings is inserted in the plurality of bit strings and a second time period in which the first error correction code is not inserted in the plurality of bit strings, and form a frame to be transmitted by generating the first error correction code from a second bit string among the plurality of bit strings in the second time period and inserting the first error correction code in two or more bit strings including the first bit string in the first time period in accordance with the switching; and a transmitter configured to transmit, to another device, the frame converted to an optical signal and to be transmitted.

8. The transmitting device according to claim 7 wherein, the circuit further configured to:

execute, based on one of a plurality of symbols, soft decision on each of values of a plurality of bit strings within a frame to which the one of the plurality of symbols within a constellation of the multilevel modulation is allocated, correct an error of results of the soft decision based on a first error correction code inserted in two or more bit strings that are among the plurality of bit strings and include a first bit string, execute, based on the one symbol, hard decision on values of each of bit strings that are among the plurality of bit strings and exclude a second bit string, inversely convert values of each of bit strings that exclude the first bit string and have been converted so that, as a region within the constellation is closer to the center of the constellation, the number of symbols allocated in the region among the plurality of symbols is larger, select a bit string to be input from a bit string that is among the plurality of bit strings and is not the second bit string and for which the error of the results of the soft decision has been corrected based on the first error correction code and a bit string that is among the plurality of bit strings and is not the second bit string and has been subjected to the hard decision by the second deciding section, and form the frame to be received by selecting the bit string for which the error of the results of the soft decision has been corrected based on the first error correction code in a first time period and selecting the bit string subjected to the hard decision in a second time period according to the first time period in which the first error correction code is inserted in two or more bit strings including the first bit string and the second time period in which the first error correction code is not inserted in the two or more bit strings including the first bit string in a cycle of the frame.

\* \* \* \* \*